United States Patent
Naito et al.

(10) Patent No.: US 9,503,045 B2
(45) Date of Patent: Nov. 22, 2016

(54) RESONATOR ELEMENT, RESONATOR, OSCILLATOR, ELECTRONIC APPARATUS, AND MOVING OBJECT

(71) Applicant: SEIKO EPSON CORPORATION, Tokyo (JP)

(72) Inventors: Matsutaro Naito, Minowa-machi (JP); Tsuyoshi Miyashita, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/991,602

(22) Filed: Jan. 8, 2016

(65) Prior Publication Data

US 2016/0211827 A1   Jul. 21, 2016

(30) Foreign Application Priority Data

Jan. 19, 2015   (JP) ................................. 2015-008176
Jan. 19, 2015   (JP) ................................. 2015-008177
Jan. 19, 2015   (JP) ................................. 2015-008178

(51) Int. Cl.
*H03B 5/30* (2006.01)
*H03H 9/17* (2006.01)
*H03B 5/32* (2006.01)
*H03H 9/24* (2006.01)
*H03H 9/02* (2006.01)

(52) U.S. Cl.
CPC .................. *H03H 9/17* (2013.01); *H03B 5/30* (2013.01); *H03B 5/32* (2013.01); *H03H 9/24* (2013.01); *H03H 2009/02496* (2013.01)

(58) Field of Classification Search
CPC ............ H03B 5/30; H03H 9/17; H03H 9/24; H03H 2009/02496; H01P 7/088

USPC ............ 331/158, 154, 116 R; 310/365, 320; 333/219

See application file for complete search history.

(56) References Cited

U.S. PATENT DOCUMENTS

| | | | |
|---|---|---|---|
| 4,870,313 | A | 9/1989 | Hirama et al. |
| 6,191,524 | B1 | 2/2001 | Sasaki et al. |
| 6,388,363 | B1 | 5/2002 | Kotani et al. |
| 2005/0258146 | A1 | 11/2005 | Umetsu |
| 2006/0255696 | A1 | 11/2006 | Sato |
| 2009/0167117 | A1 | 7/2009 | Yasuike |
| 2012/0126668 | A1 | 5/2012 | Ii et al. |

(Continued)

FOREIGN PATENT DOCUMENTS

| | | |
|---|---|---|
| JP | S58-47316 A | 3/1983 |
| JP | S61-236208 A | 10/1986 |

(Continued)

*Primary Examiner* — Arnold Kinkead
(74) *Attorney, Agent, or Firm* — Oliff PLC

(57) ABSTRACT

A resonator element includes a thick section, a middle section and a thin section, in which at least the thick section performs thickness shear vibration, in which a first step difference is provided at a boundary between the thick section and the middle section, and a second step difference is provided at a boundary between the middle section and the thin section, on one side of a direction of the thickness shear vibration, in which a first antinode of flexural vibration is located between the first step difference and the second step difference, and in which, a distance between the first antinode and the first step difference is indicated by d1, a distance between the first antinode and the second step difference is indicated by d2, and a wavelength of the flexural vibration is indicated by $\lambda$, a relationship of $0 \leq d1 \leq \lambda/8$ and $0 \leq d2 \leq \lambda/8$ is satisfied.

24 Claims, 55 Drawing Sheets

(56) References Cited

U.S. PATENT DOCUMENTS

| | | |
|---|---|---|
| 2013/0106249 A1 | 5/2013 | Ariji et al. |
| 2014/0175944 A1* | 6/2014 | Koyama ............... H03H 9/177 310/320 |

FOREIGN PATENT DOCUMENTS

| | | |
|---|---|---|
| JP | 02-057009 A | 2/1990 |
| JP | 03-218111 A | 9/1991 |
| JP | 05-090879 A | 4/1993 |
| JP | H06-031224 U | 4/1994 |
| JP | H06-52230 U | 7/1994 |
| JP | H06-204783 A | 7/1994 |
| JP | H06-252690 A | 9/1994 |
| JP | H07-212179 A | 8/1995 |
| JP | H07-336184 A | 12/1995 |
| JP | H08-056134 | 2/1996 |
| JP | H11-355094 A | 12/1999 |
| JP | 2001-077647 A | 3/2001 |
| JP | 2001-144577 A | 5/2001 |
| JP | 2001-230655 A | 8/2001 |
| JP | 2005-094542 A | 4/2005 |
| JP | 2006-014270 A | 1/2006 |
| JP | 2006-340023 A | 12/2006 |
| JP | 2007-053820 A | 3/2007 |
| JP | EP 1780890 A2 * | 5/2007 ............... H03H 3/04 |
| JP | 2008-236439 A | 10/2008 |
| JP | 2008-263387 A | 10/2008 |
| JP | 2009-130543 A | 6/2009 |
| JP | 2009-164824 A | 7/2009 |
| JP | 2010-062723 A | 3/2010 |
| JP | 2010-109527 A | 5/2010 |
| JP | 2012-114495 A | 6/2012 |
| JP | 2012-114496 A | 6/2012 |
| JP | 2012-135043 A | 7/2012 |
| JP | 2013-098813 A | 5/2013 |

* cited by examiner

RESONATOR ELEMENT, RESONATOR, OSCILLATOR, ELECTRONIC APPARATUS, AND MOVING OBJECT

BACKGROUND

1. Technical Field

The present invention relates to a resonator element, a resonator, an oscillator, an electronic apparatus, and a moving object.

2. Related Art

An AT cut resonator element has thickness shear vibration as a vibration mode of main vibration for excitation, and is suitable for miniaturization and achievement of high frequency. In addition, the AT cut resonator element shows a third-order curve which is superior in frequency-temperature characteristics, and is thus used for various applications such as piezoelectric oscillators and electronic apparatuses.

JP-A-58-047316 discloses a so-called "mesa type" AT cut resonator element in which a convex surface is provided at a center. Such a mesa type AT cut resonator element is advantageous in that energy confinement efficiency is high. JP-UM-A-6-052230 discloses a mesa type AT cut quartz crystal resonator in which a boundary portion between a convex portion at a center and a thin portion therearound is a tilt surface or a curved surface. This configuration has an advantage in that sub-vibration can be minimized by reducing a crystal impedance (CI) value. However, in the AT cut resonator elements disclosed in JP-A-58-047316 and JP-UM-A-6-052230, there is a case where spurious caused by flexural vibration which is an unwanted vibration mode may not be sufficiently reduced.

SUMMARY

An advantage of some aspects of the invention is to provide a resonator element, a resonator, an oscillator, an electronic apparatus, and a moving object, capable of reducing spurious caused by flexural vibration which is an unwanted vibration mode.

The invention can be implemented as the following forms or application examples.

Application Example 1

A resonator element according to this application example includes a thick section; a middle section that is located adjacent to the thick section and is thinner than the thick section; and a thin section that is located around the thick section and the middle section, and is thinner than the middle section, in which at least the thick section performs thickness shear vibration, in which a first step difference is provided at a boundary between the thick section and the middle section, and a second step difference is provided at a boundary between the middle section and the thin section, on one side of a direction of the thickness shear vibration, in which a first antinode of flexural vibration is located between the first step difference and the second step difference, and in which, when, in the direction of the thickness shear vibration, a distance between the first antinode and the first step difference is indicated by d1, a distance between the first antinode and the second step difference is indicated by d2, and a wavelength of the flexural vibration is indicated by $\lambda$, a relationship of $0 \le d1 \le \lambda/8$ and $0 \le d2 \le \lambda/8$ is satisfied.

With this configuration, it is possible to provide a resonator element which can reduce spurious caused by flexural vibration which is an unwanted vibration mode.

Application Example 2

A resonator element according to this application example includes a thick section; a middle section that is located adjacent to the thick section and is thinner than the thick section; and a thin section that is located around the thick section and the middle section, and is thinner than the middle section, in which at least the thick section performs thickness shear vibration, in which a first step difference is provided at a boundary between the thick section and the middle section, and a second step difference is provided at a boundary between the middle section and the thin section, on one side of a direction of the thickness shear vibration, in which a first antinode and a second antinode, adjacent to each other, of flexural vibration are located between the first step difference and the second step difference, and in which, when, in the direction of the thickness shear vibration, a distance between the first antinode and the first step difference is indicated by d1, a distance between the second antinode and the second step difference is indicated by d2, and a wavelength of the flexural vibration is indicated by $\lambda$, a relationship of $0 < d1 \le \lambda/8$ and $0 < d2 \le \lambda/8$ is satisfied.

With this configuration, it is possible to provide a resonator element which can reduce spurious caused by flexural vibration which is an unwanted vibration mode.

Application Example 3

A resonator element according to this application example includes a thick section; a middle section that is located adjacent to the thick section and is thinner than the thick section; and a thin section that is located around the thick section and the middle section, and is thinner than the middle section, in which at least the thick section performs thickness shear vibration, in which a first step difference is provided at a boundary between the thick section and the middle section, and a second step difference is provided at a boundary between the middle section and the thin section, on one side of a direction of the thickness shear vibration, in which both of the first step difference and the second step difference are located between a first antinode and a second antinode, adjacent to each other, of flexural vibration, and in which, when, in the direction of the thickness shear vibration, a distance between the first antinode and the first step difference is indicated by d1, a distance between the second antinode and the second step difference is indicated by d2, and a wavelength of the flexural vibration is indicated by $\lambda$, a relationship of $0 \le d1 \le \lambda/8$ and $0 \le d2 \le \lambda/8$ is satisfied.

With this configuration, it is possible to reduce spurious caused by flexural vibration which is an unwanted vibration mode.

Application Example 4

It is preferable that the resonator element according to the application example further includes a vibration portion; a peripheral portion that is thinner than the vibration portion and surrounds the vibration portion; and an excitation electrode that is located on a central side of the vibration portion in the direction of the thickness shear vibration, in which the thick section is a region in which the vibration portion overlaps the excitation electrode in a plan view, the middle section is the vibration portion adjacent to the thick section, the thin section is the peripheral portion, and, when a length of the vibration portion in the direction of the thickness shear vibration is indicated by Mx, a relationship of $Mx/2=(n/2+1/4)\lambda+d1+d2$ (where n is an integer) is satisfied.

With this configuration, it is possible to provide a resonator element which can more effectively reduce spurious caused by flexural vibration which is an unwanted vibration mode.

Application Example 5

In the resonator element according to the application example, it is preferable that, when a length of the excitation electrode in the direction of the thickness shear vibration is indicated by Ex, a relationship of $(Mx-Ex)/2=d1+d2$ is satisfied.

With this configuration, it is possible to provide a resonator element which can more effectively reduce spurious caused by flexural vibration which is an unwanted vibration mode.

Application Example 6

It is preferable that the resonator element according to the application example further includes a vibration portion; a peripheral portion that is thinner than the vibration portion and surrounds the vibration portion; and an excitation electrode that is located on a central side of the vibration portion in the direction of the thickness shear vibration, in which the thick section is a region in which the vibration portion overlaps the excitation electrode in a plan view, the middle section is the vibration portion adjacent to the thick section, the thin section is the peripheral portion, and, when a length of the vibration portion in the direction of the thickness shear vibration is indicated by Mx, a relationship of $Mx/2=(n/2+1/4)\lambda-d1-d2$ (where n is an integer) is satisfied.

With this configuration, it is possible to provide a resonator element which can more effectively reduce spurious caused by flexural vibration which is an unwanted vibration mode.

Application Example 7

In the resonator element according to the application example, it is preferable that, when a length of the excitation electrode in the direction of the thickness shear vibration is indicated by Ex, a relationship of $(Mx-Ex)/2=\lambda/2-d1-d2$ is satisfied.

With this configuration, it is possible to provide a resonator element which can more effectively reduce spurious caused by flexural vibration which is an unwanted vibration mode.

Application Example 8

It is preferable that the resonator element according to the application example further includes a vibration portion; a peripheral portion that is thinner than the vibration portion and surrounds the vibration portion; and an excitation electrode that is located on a central side of the vibration portion in the direction of the thickness shear vibration, in which the thick section is a region in which the vibration portion overlaps the excitation electrode in a plan view, the middle section is the vibration portion surrounding the thick section, the thin section is the peripheral portion, and, when a length of the vibration portion in the direction of the thickness shear vibration is indicated by Mx, a relationship of $Mx/2=(n/2+1/4)\lambda+d1+d2$ (where n is an integer) is satisfied.

With this configuration, it is possible to provide a resonator element which can more effectively reduce spurious caused by flexural vibration which is an unwanted vibration mode.

Application Example 9

In the resonator element according to the application example, it is preferable that, when a length of the excitation electrode in the direction of the thickness shear vibration is indicated by Ex, a relationship of $(Mx-Ex)/2=\lambda/2+d1+d2$ is satisfied.

With this configuration, it is possible to provide a resonator element which can more effectively reduce spurious caused by flexural vibration which is an unwanted vibration mode.

Application Example 10

It is preferable that the resonator element according to the application example further includes a vibration portion; a peripheral portion that is thinner than the vibration portion and surrounds the vibration portion; and an excitation electrode that overlaps the vibration portion and the peripheral portion in a plan view in the direction of the thickness shear vibration, in which the thick section is a region in which the vibration portion overlaps the excitation electrode in a plan view, the middle section is a region in which the peripheral portion overlaps the excitation electrode in a plan view, the thin section is the peripheral portion surrounding the excitation electrode in a plan view, and, when a length of the vibration portion in the direction of the thickness shear vibration is indicated by Mx, a relationship of $Mx/2=(n/2+1/4)\lambda+d1+d2$ (where n is an integer) is satisfied.

With this configuration, it is possible to provide a resonator element which can more effectively reduce spurious caused by flexural vibration which is an unwanted vibration mode.

Application Example 11

In the resonator element according to the application example, it is preferable that, when a length of the excitation electrode in the direction of the thickness shear vibration is indicated by Ex, a relationship of $(Ex-Mx)/2=d1+d2$ is satisfied.

With this configuration, it is possible to provide a resonator element which can more effectively reduce spurious caused by flexural vibration which is an unwanted vibration mode.

Application Example 12

It is preferable that the resonator element according to the application example further includes a vibration portion; a peripheral portion that is thinner than the vibration portion and surrounds the vibration portion; and an excitation electrode that overlaps the vibration portion and the peripheral portion in a plan view in the direction of the thickness shear vibration, in which the thick section is a region in which the vibration portion overlaps the excitation electrode in a plan view, the middle section is a region in which the peripheral portion overlaps the excitation electrode in a plan view, the thin section is the peripheral portion surrounding the excitation electrode in a plan view, and, when a length of the vibration portion in the direction of the thickness shear vibration is indicated by Mx, a relationship of $Mx/2=(n/2+1/4)\lambda-d1-d2$ (where n is an integer) is satisfied.

With this configuration, it is possible to provide a resonator element which can more effectively reduce spurious caused by flexural vibration which is an unwanted vibration mode.

Application Example 13

In the resonator element according to the application example, it is preferable that, when a length of the excitation electrode in the direction of the thickness shear vibration is indicated by Ex, a relationship of $(Ex-Mx)/2=\lambda/2-d1-d2$ is satisfied.

With this configuration, it is possible to provide a resonator element which can more effectively reduce spurious caused by flexural vibration which is an unwanted vibration mode.

Application Example 14

It is preferable that the resonator element according to the application example further includes a vibration portion; a peripheral portion that is thinner than the vibration portion and surrounds the vibration portion; and an excitation electrode that overlaps the vibration portion and the peripheral portion in a plan view in the direction of the thickness shear vibration, in which the thick section is a region in which the vibration portion overlaps the excitation electrode in a plan view, the middle section is a region in which the peripheral portion overlaps the excitation electrode in a plan view, the thin section is the peripheral portion surrounding the excitation electrode in a plan view, and, when a length of the vibration portion in the direction of the thickness shear vibration is indicated by Mx, a relationship of $Mx/2=(n/2+1/4)\lambda+d1+d2$ (where n is an integer) is satisfied.

With this configuration, it is possible to provide a resonator element which can more effectively reduce spurious caused by flexural vibration which is an unwanted vibration mode.

Application Example 15

In the resonator element according to the application example, it is preferable that when a length of the excitation electrode in the direction of the thickness shear vibration is indicated by Ex, a relationship of $(Ex-Mx)/2=\lambda/2+d1+d2$ is satisfied.

With this configuration, it is possible to provide a resonator element which can more effectively reduce spurious caused by flexural vibration which is an unwanted vibration mode.

Application Example 16

In the resonator element according to the application example, it is preferable that the vibration portion includes a first region; and a second region that is thinner than the first region, and is located between the first region and the peripheral portion in at least the direction of the thickness shear vibration in a plan view.

With this configuration, it is possible to provide a resonator element which can more effectively reduce spurious caused by flexural vibration which is an unwanted vibration mode.

Application Example 17

A resonator according to this application example includes the resonator element according to the application example; and a package in which the resonator element is accommodated.

With this configuration, it is possible to provide a resonator with high reliability.

Application Example 18

An oscillator according to this application example includes the resonator element according to the application example; and a circuit.

With this configuration, it is possible to provide an oscillator with high reliability.

Application Example 19

An electronic apparatus according to this application example includes the resonator element according to the application example.

With this configuration, it is possible to provide an electronic apparatus with high reliability.

Application Example 20

A moving object according to this application example includes the resonator element according to the application example.

With this configuration, it is possible to provide a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator element, a resonator, an oscillator, an electronic apparatus, and a moving object according to embodiments of the invention will be described in detail with reference to the drawings.

1. Resonator Element

First, a resonator element according to preferred embodiments of the invention will be described.

First Embodiment

Figure 1A:
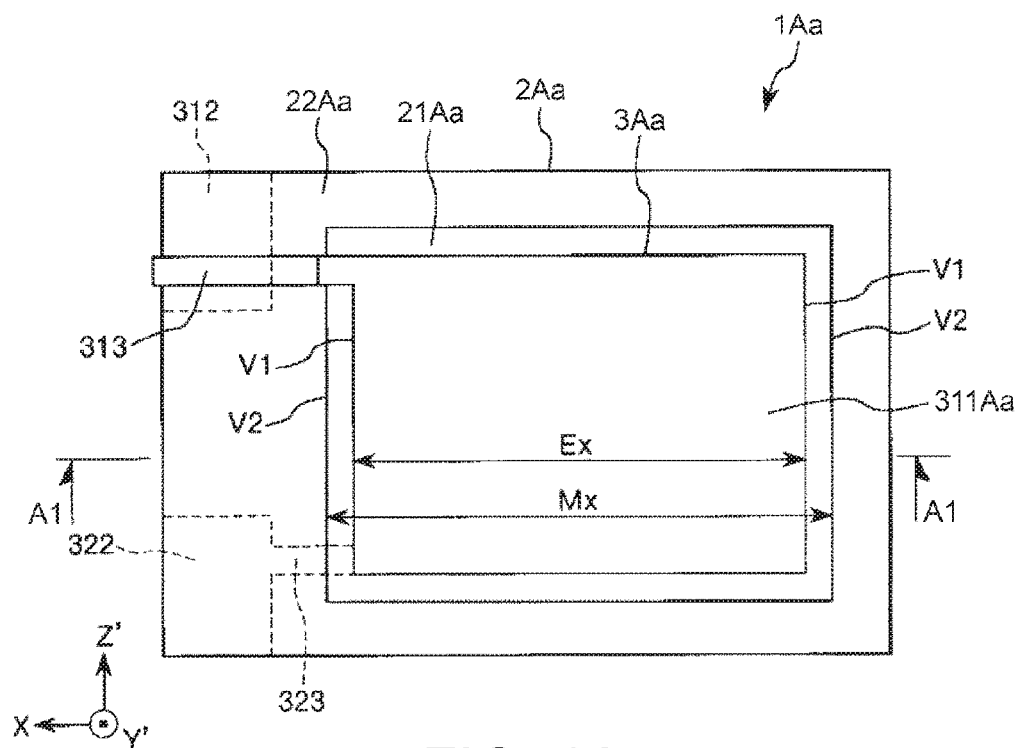
FIG. 1A is a top view of a resonator element according to a first embodiment of the invention.
Figure 1B:
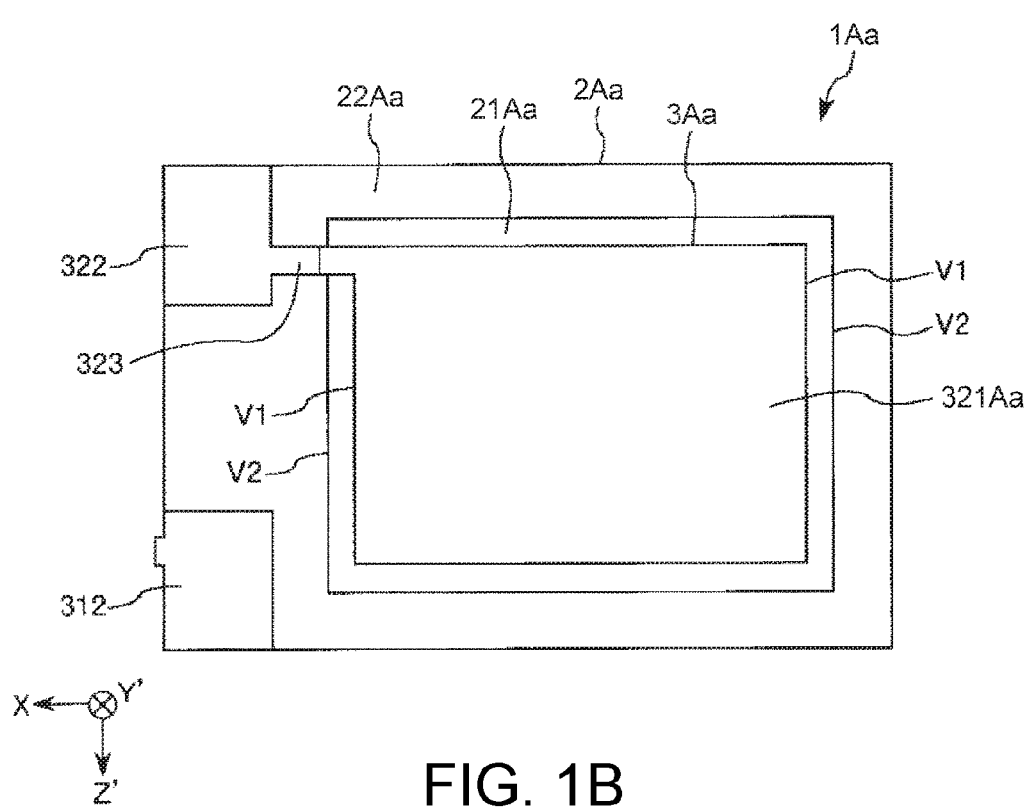
FIG. 1B is a bottom view of the resonator element according to the first embodiment of the invention.
Figure 2:
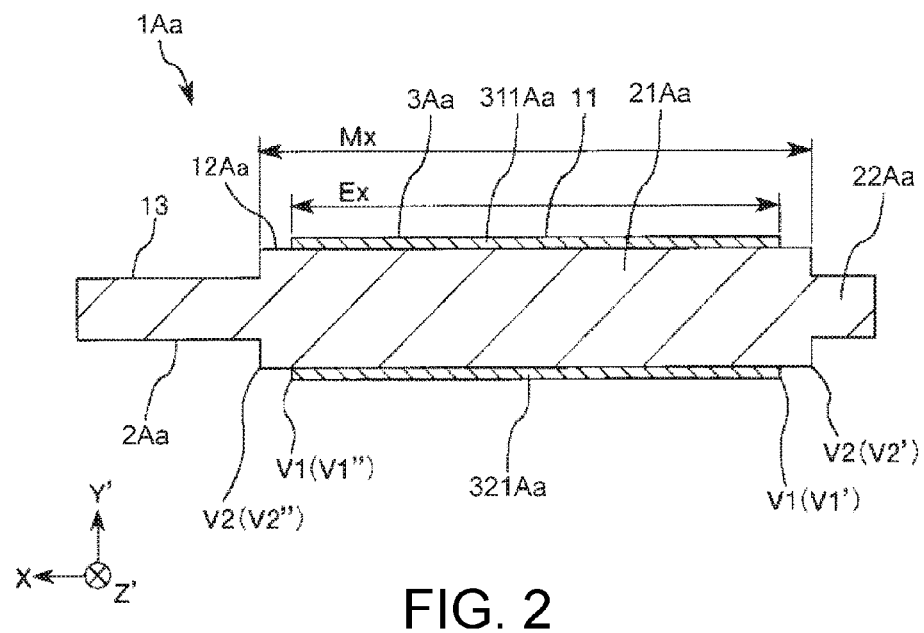
FIG. 2 is a sectional view taken along the line A1-A1 in FIG. 1A.
Figure 3:
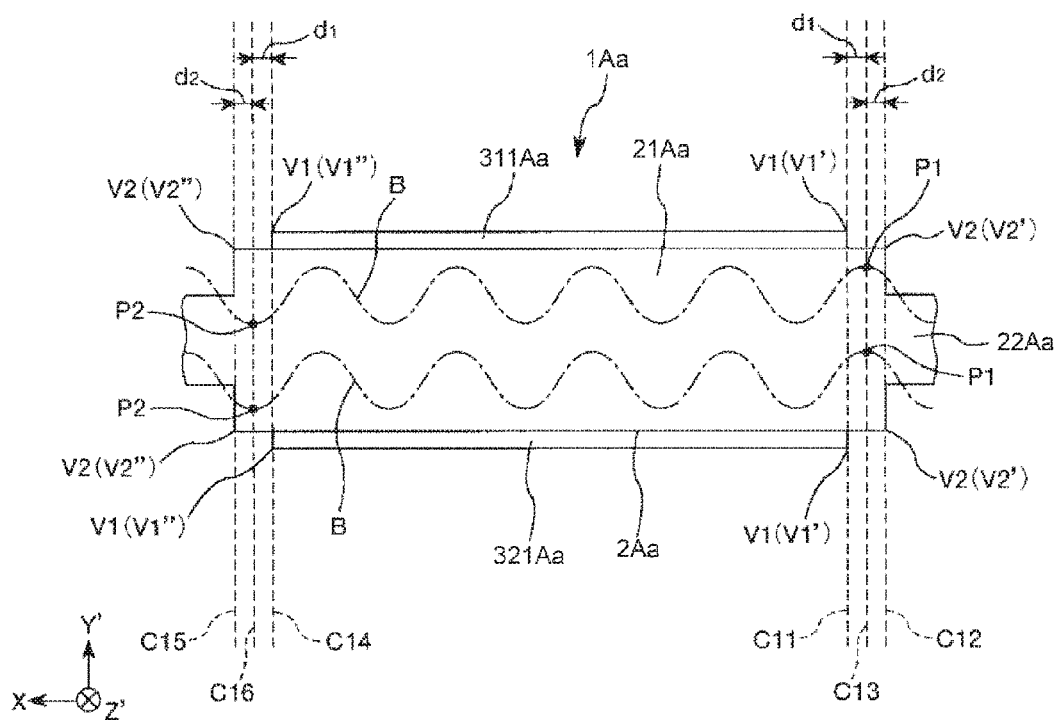
FIG. 3 is a diagram illustrating a positional relationship between a step difference and a waveform of flexural vibration.
Figure 4:
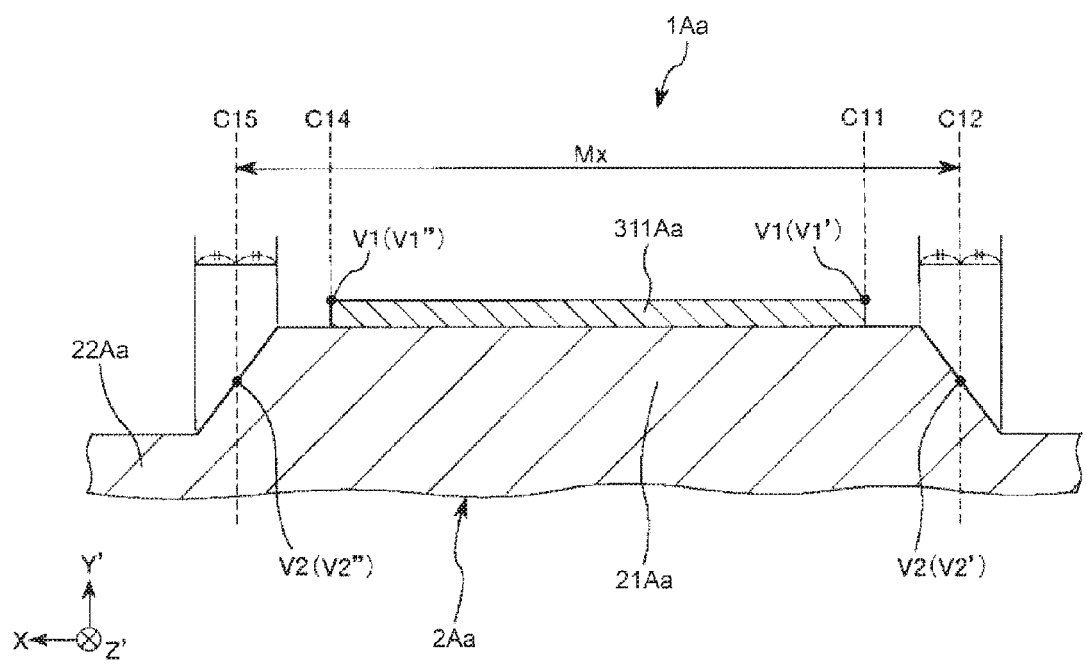
FIG. 4 is a sectional view illustrating a quartz crystal substrate which is formed through wet etching.

FIG. 1A is a top view of a resonator element according to a first embodiment of the invention, and FIG. 1B is a bottom view of the resonator element. FIG. 2 is a sectional view taken along the line A1-A1 in FIG. 1A. FIG. 3 is a diagram illustrating a positional relationship between a step difference and a waveform of flexural vibration. FIG. 4 is a sectional view illustrating a quartz crystal substrate which is formed through wet etching.

As illustrated in FIGS. 1A, 1B and 2, a resonator element 1Aa includes a quartz crystal substrate (piezoelectric substrate) 2Aa, and an electrode 3Aa formed on the quartz crystal substrate 2Aa.

Quartz Crystal Substrate

The quartz crystal substrate is a plate-shaped quartz crystal substrate. Here, quartz crystal which is a material of the quartz crystal substrate belongs to a trigonal system, and thus has crystal axes X, Y and Z which are perpendicular to each other. The X axis, the Y axis, and the Z axis are respectively called an electrical axis, a mechanical axis, and an optical axis.

The quartz crystal substrate 2Aa of the present embodiment is formed of a "rotated Y-cut quartz crystal substrate" which is taken along a plane obtained by rotating the XZ plane by a predetermined angle θ with respect to the X axis. For example, a substrate taken along a plane obtained by rotating the XZ plane by the angle θ of about 35° 15' is called an "AT cut quartz crystal substrate". The resonator element 1Aa having good temperature characteristics is obtained by using such a quartz crystal substrate. However, the quartz crystal substrate 2Aa is not limited to an AT cut quartz crystal substrate, and may employ, for example, a BT cut quartz crystal substrate as long as the substrate can excite thickness shear vibration.

Hereinafter, a Y axis and a Z axis rotated with respect to the X axis by the angle θ are set to a Y' axis and a Z' axis. In other words, the quartz crystal substrate has a thickness in the Y' axis direction and has an area in the XZ' plane direction.

The quartz crystal substrate 2Aa of the present embodiment has a rectangular shape which has a long side in the X axis direction and a short side in the Z' axis direction in a plan view. However, a shape of the quartz crystal substrate in a plan view is not limited thereto, and may be, for example, a square shape in which lengths in the X axis direction and the Z' axis direction are substantially the same as each other, and may be a rectangular shape which has a short side in the X axis direction and a long side in the Z' axis direction.

As illustrated in FIGS. 1A, 1B and 2, the quartz crystal substrate 2Aa includes a vibration portion 21Aa which performs thickness shear vibration, and a thin portion 22Aa which is located around the vibration portion 21Aa so as to be integrally formed with the vibration portion 21Aa and is thinner than the vibration portion 21Aa. The vibration portion 21Aa protrudes toward both of +Y' axis side and −Y' axis side of the thin portion 22Aa. However, the vibration portion 21Aa may protrude toward at least one of +Y' axis side and −Y' axis side.

The thin portion 22Aa is a peripheral portion which is thinner than the vibration portion 21Aa and surrounds the vibration portion 21Aa, and is also a peripheral portion surrounding excitation electrodes 311Aa and 321Aa which will be described later in a plan view.

The quartz crystal substrate 2Aa may have undergone, for example, bevel machining for grinding the periphery of the quartz crystal substrate 2Aa, or convex machining for forming an upper surface and a lower surface as convex surfaces. The four corners of the vibration portion 21Aa may be rounded.

The electrode 3Aa includes a pair of excitation electrodes 311Aa and 321Aa, a pair of pad electrodes 312 and 322, and a pair of extraction electrodes 313 and 323. The excitation electrode 311Aa is disposed on a front surface of the vibration portion 21Aa, and the excitation electrode 321Aa is disposed on a rear surface of the vibration portion 21Aa so as to oppose the excitation electrode 311Aa. A length Ex (a length L1 of a thick section) of the excitation electrodes 311Aa and 321Aa in the X axis direction is smaller than a length Mx (a length L2 of a middle section) of the vibration portion 21Aa in the X axis direction, that is, a relationship of Ex<Mx is satisfied. The excitation electrodes 311Aa and 321Aa are disposed at the center so as not to overlap both ends of the vibration portion 21Aa in the X axis direction.

The pad electrodes 312 and 322 are arranged in the Z' axis direction on a lower surface of the thin portion 22Aa located at ends of the quartz crystal substrate 2Aa on the +X axis side. The extraction electrode 313 is disposed so as to connect the excitation electrode 311Aa and the pad electrode 312 to each other, and the extraction electrode 323 is disposed so as to connect the excitation electrode 321Aa and the pad electrode 322 to each other.

A configuration of the electrodes is not particularly limited, but the electrodes may be formed of metal coating films in which a metal such as gold (Au) or aluminum (Al) or an alloy having Au or Al as a main component is laminated on a base layer such as chromium (Cr) or nickel (Ni).

The above description relates to the configuration of the resonator element 1Aa. In the resonator element 1Aa, a portion of the vibration portion 21Aa where the excitation electrodes 311Aa and 321Aa are provided, that is, a region in which the vibration portion 21Aa overlaps the excitation electrodes 311Aa and 321Aa forms a thick section 11 which is thickest; the vibration portion 21Aa located around the thick section 11 forms a middle section 12Aa which is thinner than the thick section 11; and the thin portion 22Aa located at a peripheral portion surrounding the vibration portion 21Aa forms a thin section 13 which is thinner than the middle section 12Aa.

For this reason, in the resonator element 1Aa, a step difference (first step difference) V1 is formed at a boundary between the vibration portion 21Aa and the excitation electrodes 311Aa and 321Aa, and a step difference (second step difference) V2 is formed at a boundary between the vibration portion 21Aa and the thin portion 22Aa, in the X axis direction. Hereinafter, the step difference V1 located on the −X axis side is referred to as a step difference V1', and the step difference V1 located on the +X axis side is referred to as a step difference V1". Similarly, the step difference V2 located on the −X axis side is referred to as a step difference V2', and the step difference V2 located on the +X axis side is referred to as a step difference V2".

As illustrated in FIG. 3, the antinode (maximum amplitude position) of flexural vibration which is spurious (unwanted vibration) occurring in the quartz crystal substrate 2Aa is located between the step difference V1' and the step difference V2', and, similarly, the antinode of flexural vibration is also located between the step difference V1" and the step difference V2".

Specifically, a virtual straight line C13 which is parallel to the Y' axis through a peak (maximum amplitude point) P1 of an expected waveform B of the flexural vibration is located between a virtual straight line C11 which is parallel to the Y' axis through the step difference V1' and a virtual straight line C12 which is parallel to the Y' axis through the step difference V2'. Similarly, a virtual straight line C16 which is parallel to the Y' axis through a peak P2 of the waveform B of the flexural vibration is located between a virtual straight line C14 which is parallel to the Y' axis through the step difference V1" and a virtual straight line C15 which is parallel to the Y' axis through the step difference V2". As a result, the resonator element 1Aa can effectively confine a flexural vibration component between the step differences. For this reason, it is possible to minimize the flexural vibration component and thus to reduce spurious (unwanted vibration). Consequently, in the resonator element 1Aa, a CI value is reduced, and thus vibration characteristics can be improved.

Particularly, in the resonator element 1Aa of the present embodiment, the antinode (first antinode) of the flexural vibration is located on the virtual straight line C13 which passes through the center between the step difference V1' and the step difference V2', and, similarly, the antinode of the flexural vibration is located on the virtual straight line C16 which passes through the center between the step difference V1" and the step difference V2". In other words, when a clearance between the virtual straight line C11 and the virtual straight line C13 is set to a distance d1 as a first distance, and a clearance between the virtual straight line C12 and the virtual straight line C13 is set to a distance d2 as a second distance, a relationship of (Mx−Ex)/2=d1+d2 is satisfied, and a relationship of d1=d2 is also satisfied. This is also the same for relationships between the virtual straight lines C14, C15 and C16. Consequently, it is possible to more effectively reduce the spurious.

When a wavelength of the flexural vibration is indicated by $\lambda$, it is preferable that a relationship of $0 \leq d1 \leq \lambda/8$ and $0 \leq d2 \leq \lambda/8$ is satisfied, and a relationship of $Mx/2=(n/2+1/4)\lambda+d1+d2$ (where n is an integer) is also satisfied. Consequently, the flexural vibration component can be more effectively minimized, and thus the spurious can be more effectively reduced. The wavelength $\lambda$ of the flexural vibration can be obtained according to an equation such as $\lambda/2=(1.332/f)-0.0024$ by using a resonance frequency f of the resonator element 1Aa.

The above description relates to the first embodiment. For example, in a case where the quartz crystal substrate 2Aa is formed by patterning a quartz crystal substrate through wet etching, as illustrated in FIG. 4, a crystal surface of the quartz crystal substrate 2Aa appears, and thus a sidewall of the vibration portion 21Aa is a tilt surface. The step difference V2 (V2' and V2") in this case is a portion located at the center between a boundary of a main surface and a tilt surface of the vibration portion 21Aa and a boundary of the tilt surface and a main surface of the thin portion 22Aa. The length Mx of the vibration portion 21Aa in the X axis direction is a clearance between the step differences V2' and V2". Specifically, the clearance is a distance between the virtual straight line C12 and the virtual straight line C15 which respectively pass through the step differences V2 (V2' and V2").

Second Embodiment

Next, a description will be made of a resonator element according to a second embodiment of the invention.

Figure 5A:
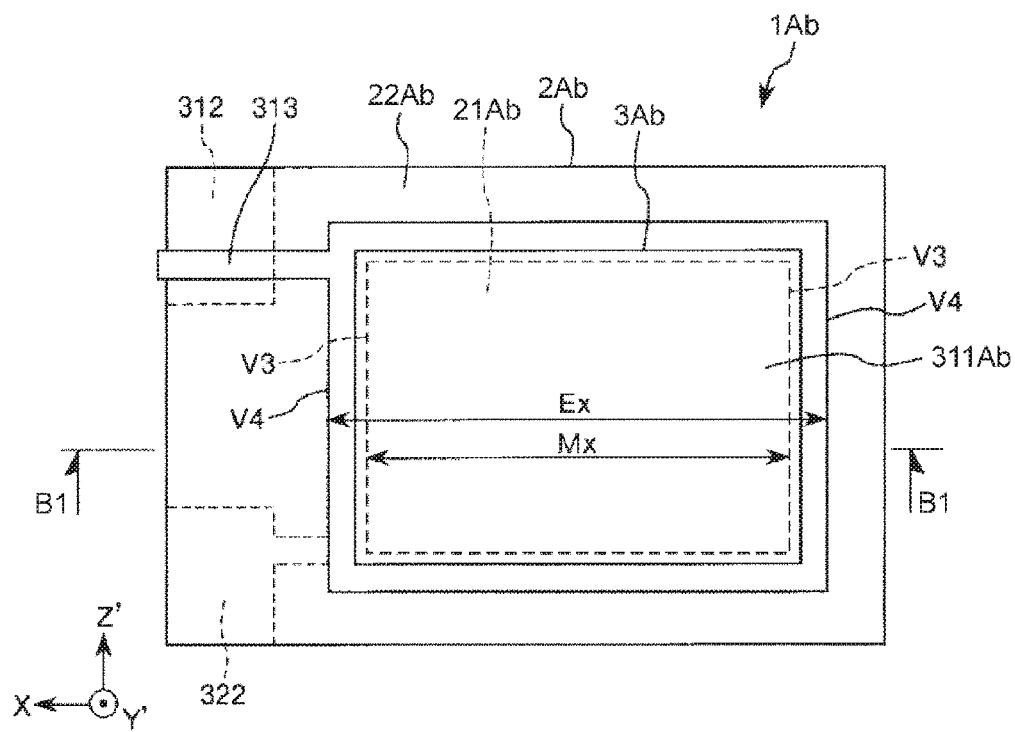
FIG. 5A is a top view of a resonator element according to a second embodiment of the invention.
Figure 5B:
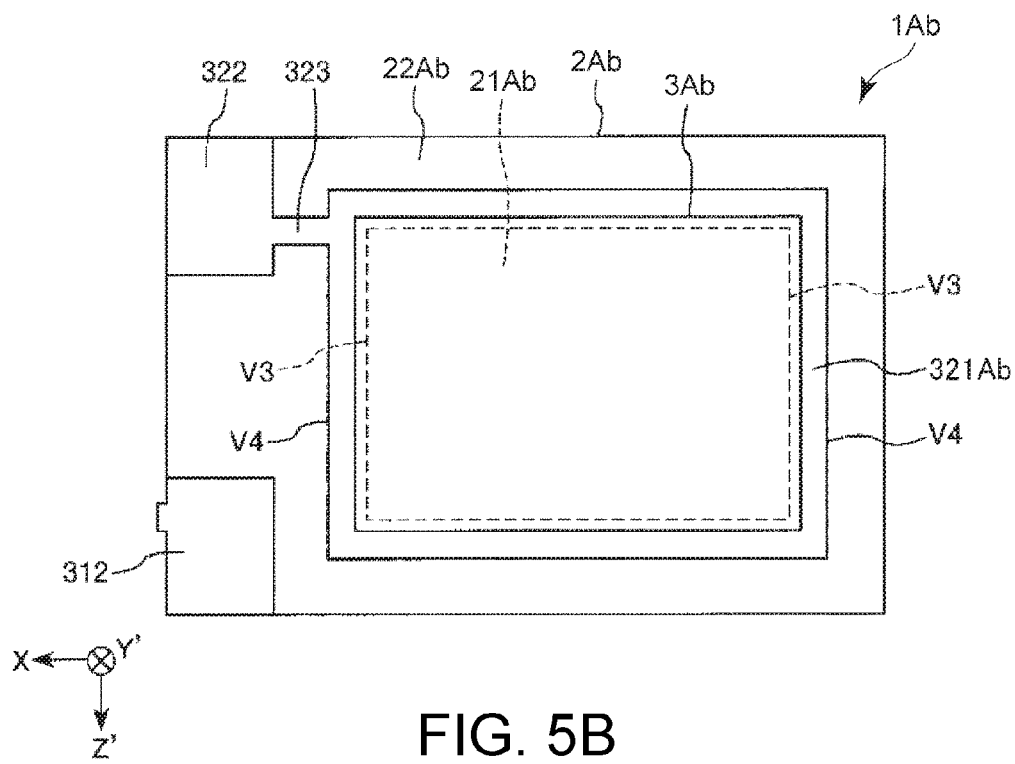
FIG. 5B is a bottom view of the resonator element according to the second embodiment of the invention.
Figure 6:
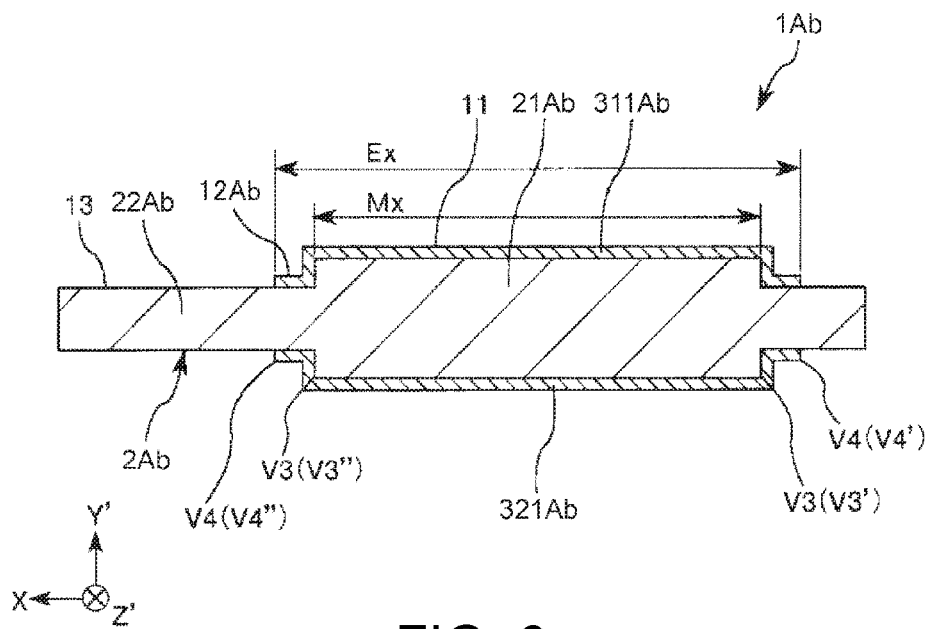
FIG. 6 is a sectional view taken along the line B1-B1 in FIG. 5A.
Figure 7:
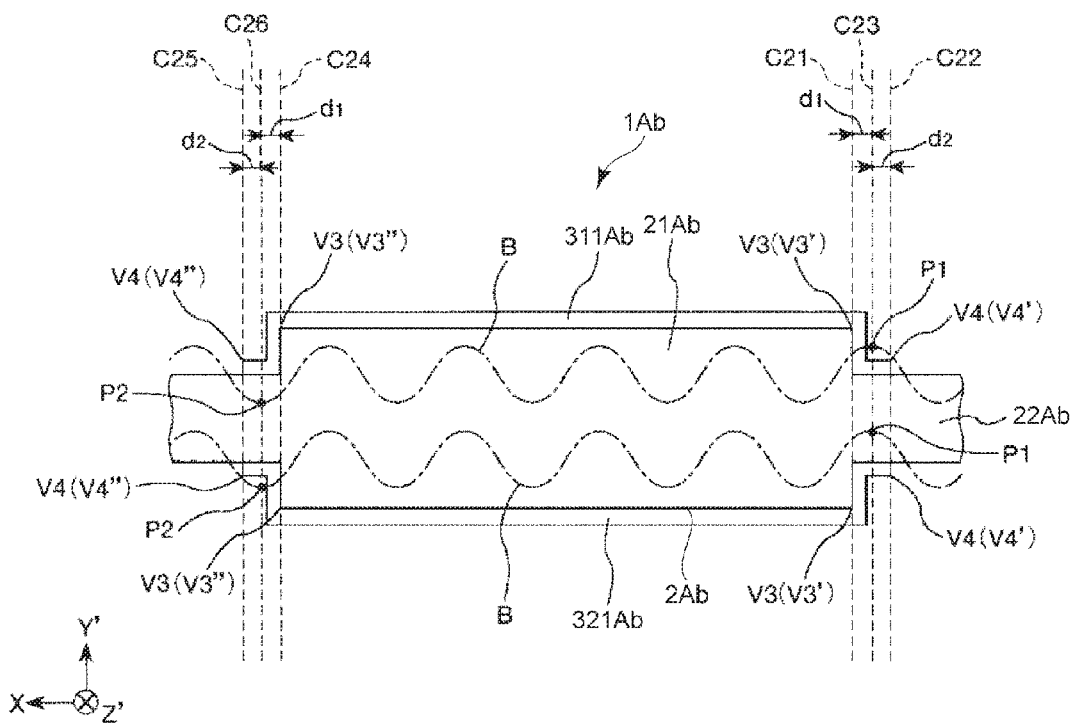
FIG. 7 is a diagram illustrating a positional relationship between a step difference and a waveform of flexural vibration.
Figure 8:
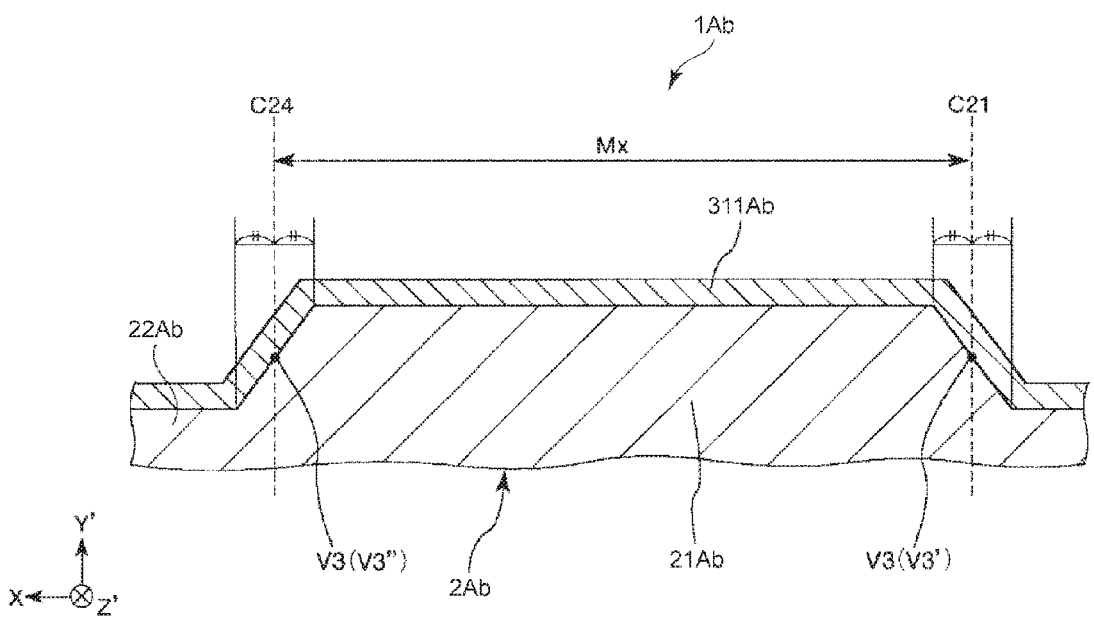
FIG. 8 is a sectional view illustrating a quartz crystal substrate which is formed through wet etching.

FIG. 5A is a top view of a resonator element according to the second embodiment of the invention, and FIG. 5B is a bottom view of the resonator element. FIG. 6 is a sectional view taken along the line B1-B1 in FIG. 5A. FIG. 7 is a diagram illustrating a positional relationship between a step difference and a waveform of flexural vibration. FIG. 8 is a sectional view illustrating a quartz crystal substrate which is formed through wet etching.

Hereinafter, a description will be made of the resonator element of the second embodiment focusing on a difference from the first embodiment, and a description of the same content will be omitted.

The resonator element according to the second embodiment of the invention is the same as in the first embodiment except for a difference in arrangement of excitation electrodes. The same constituent elements as in the above-described embodiment are given the same reference numerals.

As illustrated in FIGS. 5A, 5B and 6, in a resonator element 1Ab of the present embodiment, a length Ex (a length L2 of a middle section) of excitation electrodes 311Ab and 321Ab in the X axis direction is larger than a length Mx (a length L1 of a thick section) of the vibration portion 21Ab in the X axis direction, that is, a relationship of Ex>Mx is satisfied. Both ends of the excitation electrodes 311Ab and 321Ab in the X axis direction are disposed so as to protrude from a vibration portion 21Ab and to overlap a thin portion 22Ab which is a peripheral portion surrounding the vibration portion 21Ab.

In the resonator element 1Ab, the vibration portion 21Ab forms a thick section 11 which is thickest; a portion of the thin portion 22Ab on which the excitation electrodes 311Ab and 321Ab are disposed forms a middle section 12Ab which is thinner than the thick section 11; and the thin portion 22Ab located around the middle section 12Ab forms a thin section 13 which is thinner than the middle section 12Ab. In other words, the thick section 11 is a region in which the vibration portion 21Ab overlaps the excitation electrodes 311Ab and 321Ab in a plan view; the middle section 12Ab is a region in which the peripheral portion overlaps the excitation electrodes in a plan view; and the thin section 13 is a peripheral portion surrounding the excitation electrodes 311Ab and 321Ab in a plan view.

For this reason, a step difference (first step difference) V3 is formed at a boundary between the vibration portion 21Ab and the thin portion 22Ab, and a step difference (second step difference) V4 is formed at a boundary between the excitation electrodes 311Ab and 321Ab and the thin portion 22Ab, in the X axis direction. Hereinafter, the step difference V3 located on the −X axis side is referred to as a step difference V3', and the step difference V3 located on the +X axis side is referred to as a step difference V3". Similarly, the step difference V4 located on the −X axis side is referred to as a step difference V4', and the step difference V4 located on the +X axis side is referred to as a step difference V4".

As illustrated in FIG. 7, the antinode of flexural vibration which is spurious (unwanted vibration) occurring in the quartz crystal substrate 2Ab is located between the step differences V3' and V4', and, similarly, the antinode of flexural vibration is also located between the step difference V3" and the step difference V4". Specifically, a virtual straight line C23 which is parallel to the Y' axis through a peak P1 of an expected waveform B of the flexural vibration is located between a virtual straight line C21 which is parallel to the Y' axis through the step difference V3' and a virtual straight line C22 which is parallel to the Y' axis through the step difference V4'. Similarly, a virtual straight line C26 which is parallel to the Y' axis through a peak P2 of the waveform B of the flexural vibration is located between a virtual straight line C24 which is parallel to the Y' axis through the step difference V3" and a virtual straight line C25 which is parallel to the Y' axis through the step difference V4". As a result, the resonator element 1Ab can minimize the flexural vibration component and can thus reduce the spurious. Consequently, in the resonator element 1Ab, a CI value is reduced, and thus vibration characteristics can be improved.

Particularly, in the present embodiment, the antinode (first antinode) of the flexural vibration is located on the virtual straight line C23 which passes through the center between the step differences V3' and V4', and, similarly, the antinode of the flexural vibration is located on the virtual straight line C26 which passes through the center between the step differences V3" and V4". In other words, when a clearance between the virtual straight line C21 and the virtual straight line C23 is set to a distance d1 as a first distance, and a clearance between the virtual straight line C22 and the virtual straight line C23 is set to a distance d2 as a second distance, a relationship of (Ex−Mx)/2=d1+d2 is satisfied, and a relationship of d1=d2 is also satisfied. This is also the same for relationships between the virtual straight lines C24, C25 and C26. Consequently, it is possible to more effectively reduce the spurious.

When a wavelength of the flexural vibration is indicated by $\lambda$, it is preferable that a relationship of $0 \leq d1 \leq \lambda/8$ and $0 \leq d2 \leq \lambda/8$ is satisfied, and a relationship of $Mx/2=(n/2+1/4)\lambda+d1+d2$ (where n is an integer) is also satisfied. Consequently, the flexural vibration component can be more effectively minimized, and thus the spurious can be more effectively reduced.

The above description relates to the second embodiment. For example, in a case where the quartz crystal substrate 2Ab is formed by patterning a quartz crystal substrate through wet etching, as illustrated in FIG. 8, a crystal surface of the quartz crystal substrate 2Ab appears, and thus a sidewall of the vibration portion 21Ab is a tilt surface. The step difference V3 (V3' and V3") in this case is a portion located at the center between a boundary of a main surface and a tilt surface of the vibration portion 21Ab and a boundary of the tilt surface and a main surface of the thin portion 22Ab. The length Mx of the vibration portion 21Ab in the X axis direction is a clearance between the step differences V3' and V3" (the virtual straight line C21 and the virtual straight line C24).

The second embodiment can also exhibit the same effects as the above-described embodiment.

In the present embodiment, the excitation electrodes 311Ab and 321Ab are also disposed so as to exceed the vibration portion 21Ab in the Z' axis direction, but may be disposed so as not to exceed the vibration portion 21Ab in the Z' axis direction.

Third Embodiment

Next, a description will be made of a resonator element according to a third embodiment of the invention.

Figure 9A:
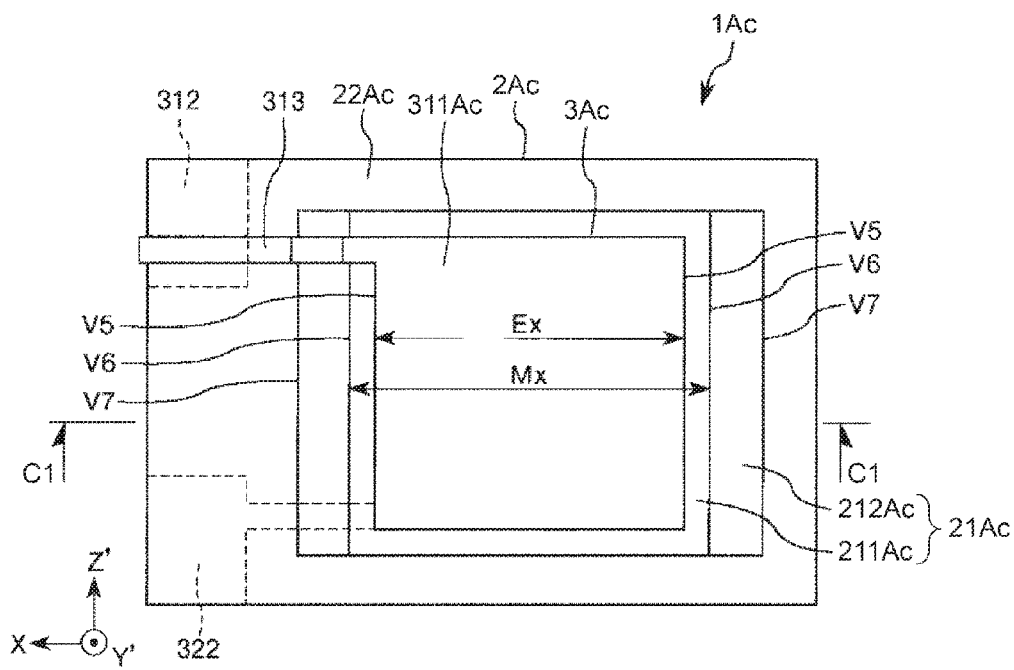
FIG. 9A is a top view of a resonator element according to a third embodiment of the invention.
Figure 9B:
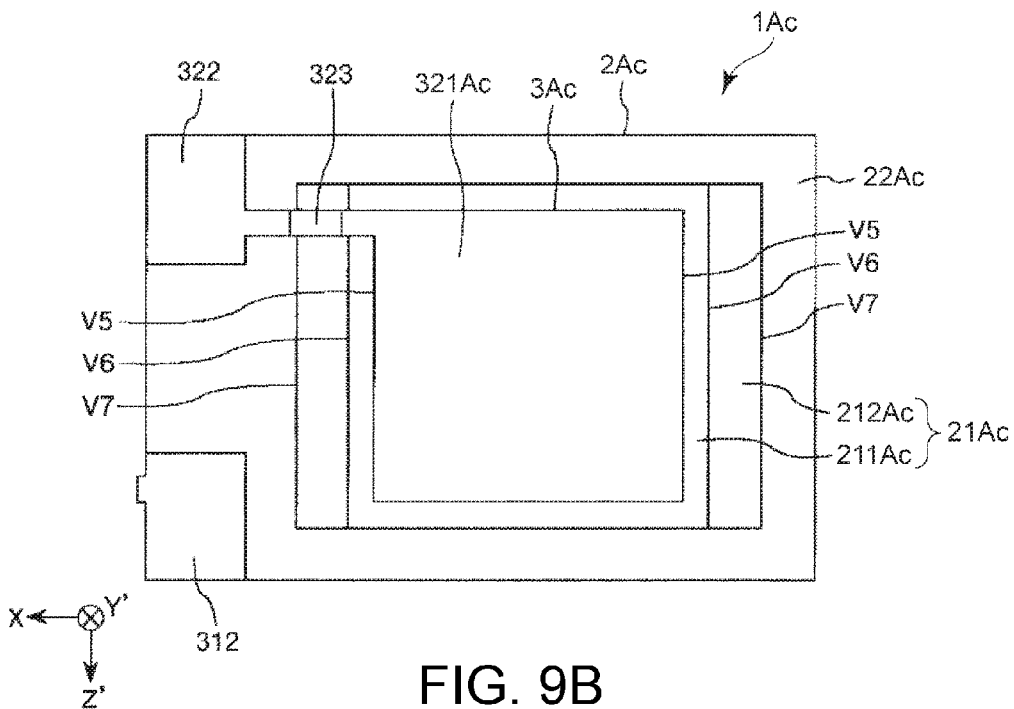
FIG. 9B is a bottom view of the resonator element according to the third embodiment of the invention.
Figure 10:
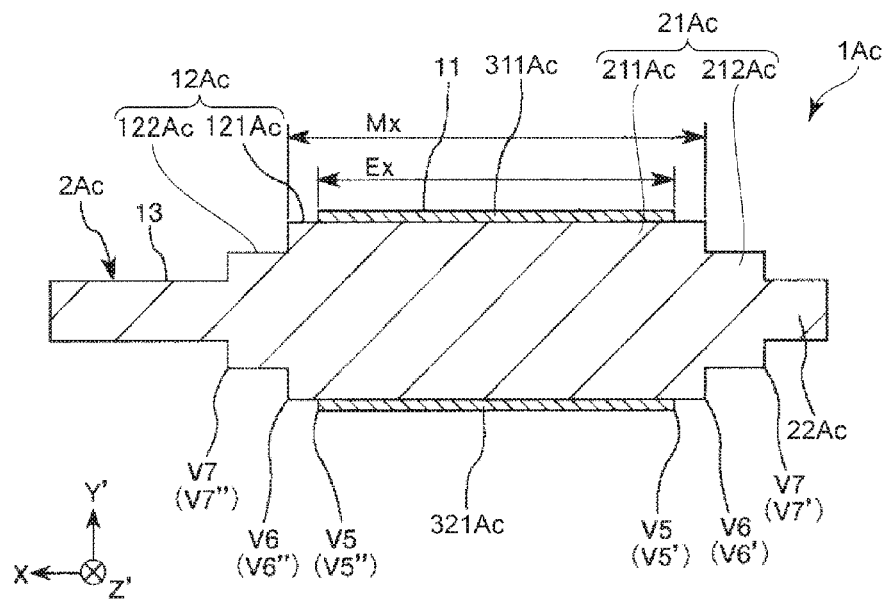
FIG. 10 is a sectional view taken along the line C1-C1 in FIG. 9A.
Figure 11:
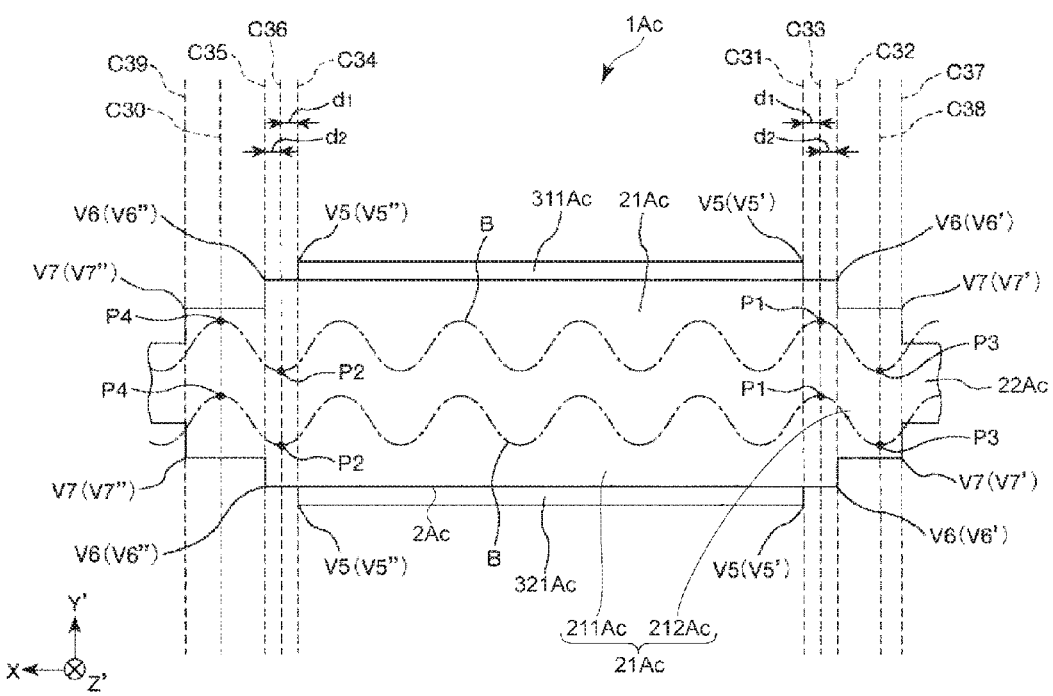
FIG. 11 is a diagram illustrating a positional relationship between a step difference and a waveform of flexural vibration.
Figure 12:
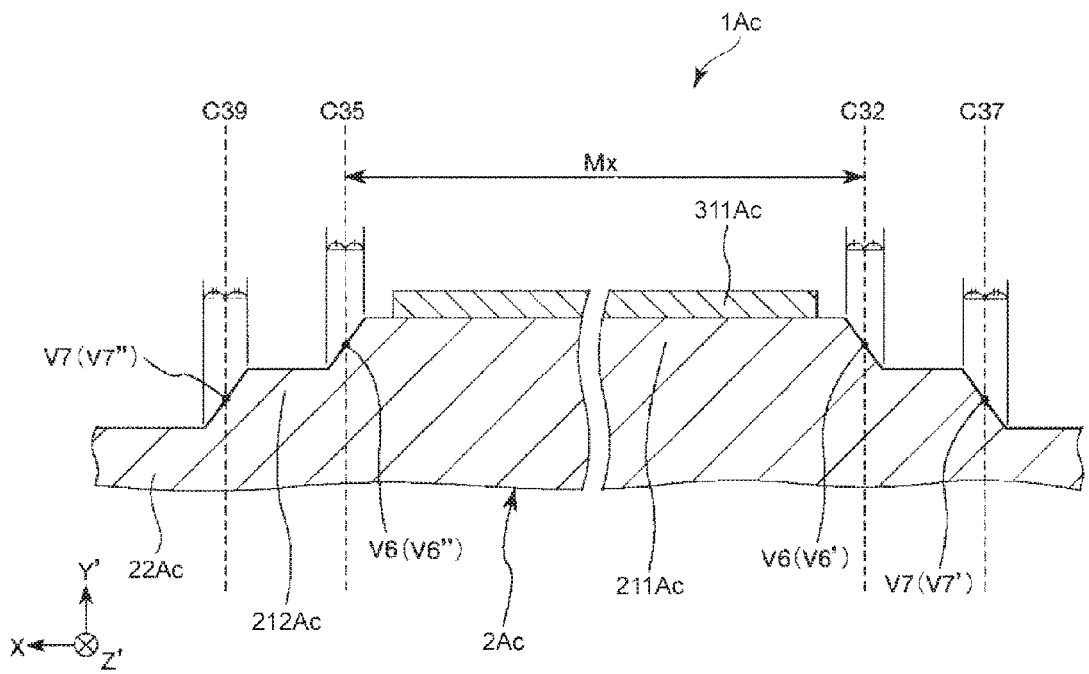
FIG. 12 is a sectional view illustrating a quartz crystal substrate which is formed through wet etching.

FIG. 9A is a top view of a resonator element according to the third embodiment of the invention, and FIG. 9B is a bottom view of the resonator element. FIG. 10 is a sectional view taken along the line C1-C1 in FIG. 9A. FIG. 11 is a diagram illustrating a positional relationship between a step difference and a waveform of flexural vibration. FIG. 12 is a sectional view illustrating a quartz crystal substrate which is formed through wet etching.

Hereinafter, a description will be made of the resonator element of the third embodiment focusing on a difference from the above-described embodiments, and a description of the same content will be omitted.

The resonator element according to the third embodiment of the invention is the same as in the first embodiment except that a vibration portion is formed in two stages (a so-called "multistage mesa type"). The same constituent elements as in the above-described embodiments are given the same reference numerals.

As illustrated in FIGS. 9A, 9B and 10, a vibration portion 21Ac of a resonator element 1Ac of the present embodiment includes a first region 211Ac which is located at the center and is thick, and a second region 212Ac which is located around the first region 211Ac (both sides in the X axis direction) and is thinner than the first region 211Ac. As mentioned above, the vibration portion 21Ac is formed in multiple stages, and thus it is possible to efficiently confine energy with the vibration portion 21Ac. For this reason, it is possible to exhibit better vibration characteristics.

An excitation electrode 311Ac is disposed on a front surface of the first region 211Ac, and an excitation electrode 321Ac is disposed on a rear surface of the first region 211Ac so as to oppose the excitation electrode 311Ac. A length Ex (a length L1 of a thick section) of the excitation electrodes 311Ac and 321Ac in the X axis direction is smaller than a length Mx (a length L2 of a middle section) of the first region 211Ac in the X axis direction, that is, a relationship of Ex<Mx is satisfied. The excitation electrodes 311Ac and 321Ac are disposed at the center so as not to overlap both ends of the first region 211Ac in the X axis direction.

In the resonator element 1Ac, a portion of the first region 211Ac where the excitation electrodes 311Ac and 321Ac are disposed forms a thick section 11 which is thickest; the first region 211Ac therearound forms a first middle section 121Ac which is thinner than the thick section 11; the second region 212Ac forms a second middle section 122Ac which is thinner than the first middle section 121Ac; and a thin portion 22Ac forms a thin section 13 which is thinner than the second middle section 122Ac.

For this reason, in the X axis direction, a step difference (first step difference) V5 is formed at a boundary between the excitation electrodes 311Ac and 321Ac and the first region 211Ac; a step difference (second step difference) V6 is formed at a boundary between the first region 211Ac and the second region 212Ac; and a step difference (third step difference) V7 is formed at a boundary between the second region 212Ac and the thin portion 22Ac. Hereinafter, the step difference V5 located on the −X axis side is referred to as a step difference V5', and the step difference V5 located on the +X axis side is referred to as a step difference V5". Similarly, the step difference V6 located on the −X axis side is referred to as a step difference V6', and the step difference V6 located on the +X axis side is referred to as a step difference V6", and the step difference V7 located on the −X axis side is referred to as a step difference V7', and the step difference V7 located on the +X axis side is referred to as a step difference V7".

As illustrated in FIG. 11, the antinode of flexural vibration which is spurious occurring in the quartz crystal substrate 2Ac is located between the step differences V5' and V6', and, similarly, the antinode of flexural vibration is also located between the step difference V5" and the step difference V6". Specifically, a virtual straight line C33 which is parallel to the Y' axis through a peak P1 of an expected waveform B of the flexural vibration is located between a virtual straight line C31 which is parallel to the Y' axis through the step difference V5' and a virtual straight line C32 which is parallel to the Y' axis through the step difference V6'. Similarly, a virtual straight line C36 which is parallel to the Y' axis through a peak P2 of the waveform B of the flexural vibration is located between a virtual straight line C34 which is parallel to the Y' axis through the step difference V5" and a virtual straight line C35 which is parallel to the Y' axis through the step difference V6". As a result, the resonator element 1Ac can minimize the flexural vibration component and can thus reduce the spurious. Consequently, in the resonator element 1Ac, a CI value is reduced, and thus vibration characteristics can be improved.

Particularly, in the present embodiment, the antinode (first antinode) of the flexural vibration is located at the center between the step differences V5' and V6', and, similarly, the antinode of the flexural vibration is located at the center between the step differences V5" and V6". In other words, when a clearance between the virtual straight line C31 and the virtual straight line C33 is set to a distance d1, and a clearance between the virtual straight line C32 and the virtual straight line C33 is set to a distance d2, a relationship of (Mx−Ex)/2=d1+d2 is satisfied, and a relationship of d1=d2 is also satisfied. This is also the same for relationships between the virtual straight lines C34, C35 and C36. Consequently, it is possible to more effectively reduce the spurious.

When a wavelength of the flexural vibration is indicated by λ, it is preferable that a relationship of 0≤d1≤λ/8 and 0≤d2≤λ/8 is satisfied, and a relationship of Mx/2=(n/2+1/4)λ+d1+d2 (where n is an integer) is also satisfied. Consequently, the flexural vibration component can be even more effectively minimized, and thus the spurious can be even more effectively reduced.

In the resonator element 1Ac of the present embodiment, the antinode (first antinode) of the flexural vibration is located between the step differences V6' and V7', and, similarly, the antinode (second antinode) of the flexural vibration is located between the step differences V6" and V7". Specifically, a virtual straight line C38 which is parallel to the Y' axis through a peak P3 of the waveform B of the flexural vibration is located between a virtual straight lines C37 and C32 which are parallel to the Y' axis through the step difference V7'. Similarly, a virtual straight line C30 which is parallel to the Y' axis through a peak P4 of the waveform B of the flexural vibration is located between a virtual straight lines C39 and C35 which are parallel to the Y' axis through the step difference V7".

As a result, the resonator element 1Ac can more effectively minimize a flexural vibration component and can thus more effectively reduce the spurious due to a synergistic effect with the above-described effects.

The above description relates to the third embodiment. For example, in a case where the quartz crystal substrate 2Ac is formed by patterning a quartz crystal substrate through wet etching, as illustrated in FIG. 12, a crystal surface of the quartz crystal substrate 2Ac appears, and thus a sidewall of each of the first region 211Ac and the second region 212Ac is a tilt surface. The step difference V6 (V6' and V6") in this case is a portion located at the center between a boundary of a main surface and a tilt surface of the first region 211Ac and a boundary of the tilt surface and a main surface of the second region 212Ac. The step difference V7 (V7' and V7") is a portion located at the center between a boundary of the main surface and the tilt surface of the second region 212Ac and a boundary of the tilt surface and a main surface of the thin portion 22Ac. In this case, the length Mx of the first region 211Ac in the X axis direction is a clearance between the step differences V6' and V6". Specifically, the clearance is a distance between the virtual straight lines C32 and C35 which respectively pass through the step differences V6 (V6' and V6").

The third embodiment can also exhibit the same effects as the above-described embodiments.

Fourth Embodiment

Next, a description will be made of a resonator element according to a fourth embodiment of the invention.

Figure 13A:
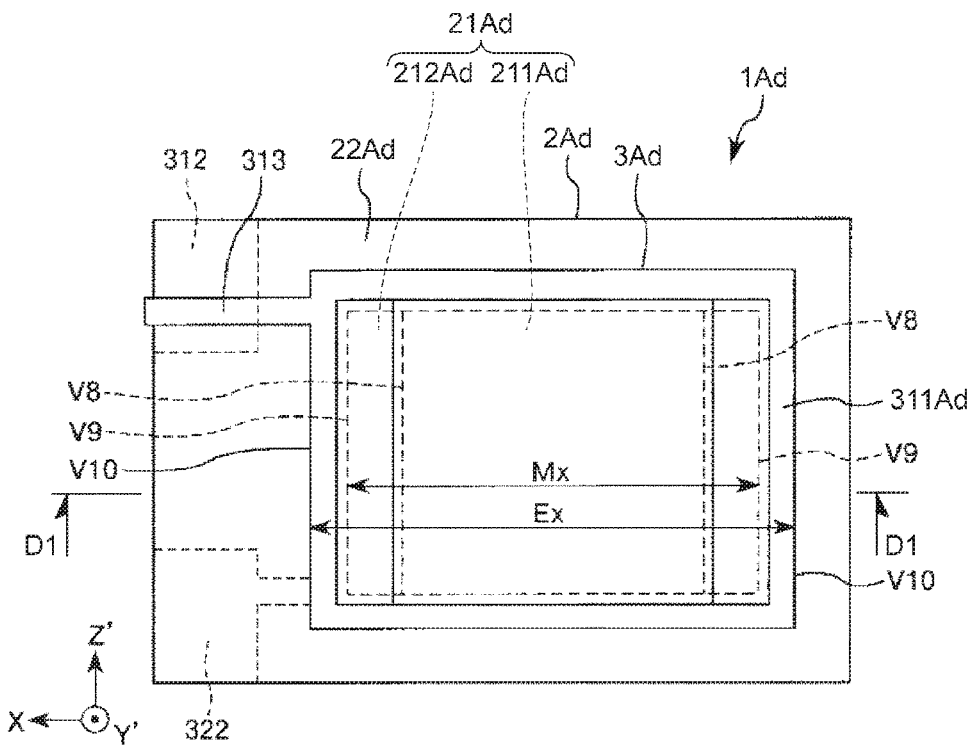
FIG. 13A is a top view of a resonator element according to a fourth embodiment of the invention.
Figure 13B:
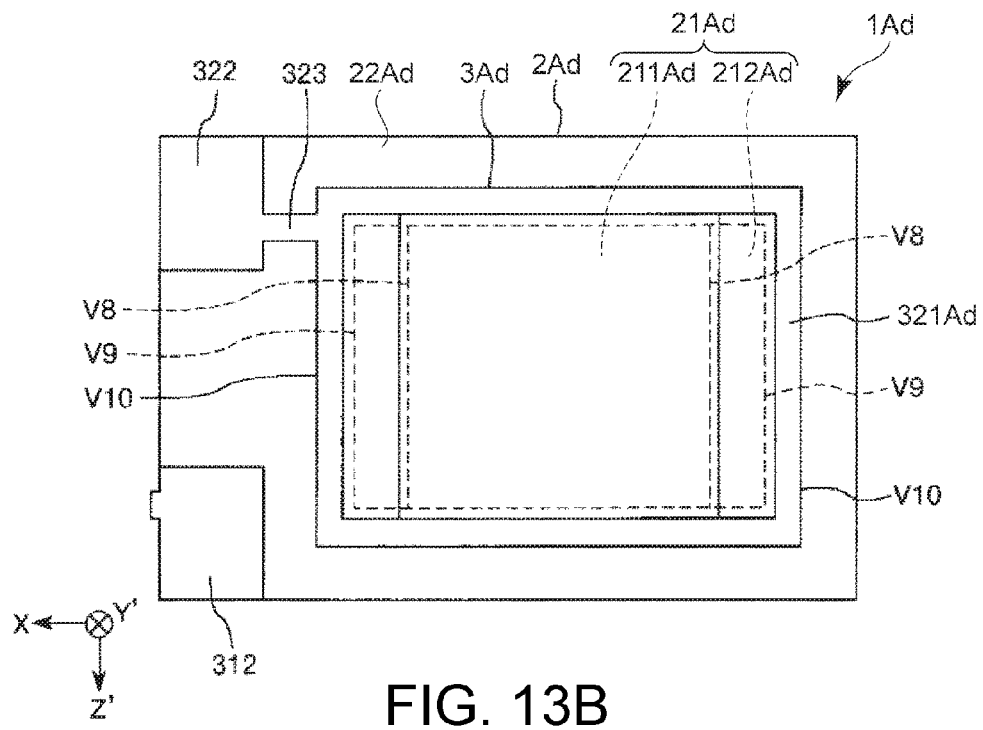
FIG. 13B is a bottom view of the resonator element according to the fourth embodiment of the invention.
Figure 14:
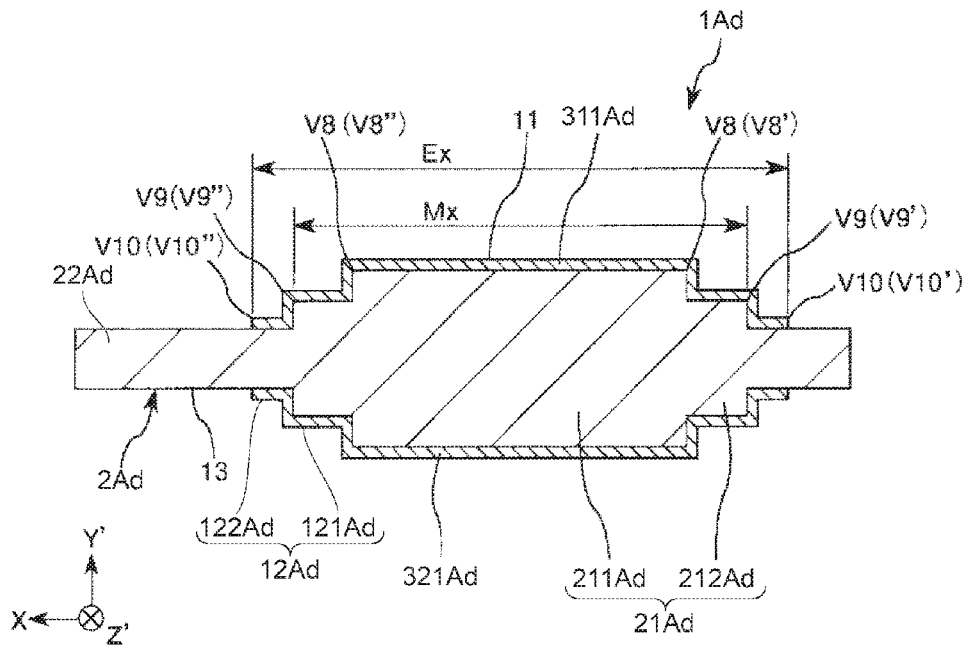
FIG. 14 is a sectional view taken along the line D1-D1 in FIG. 13A.
Figure 15:
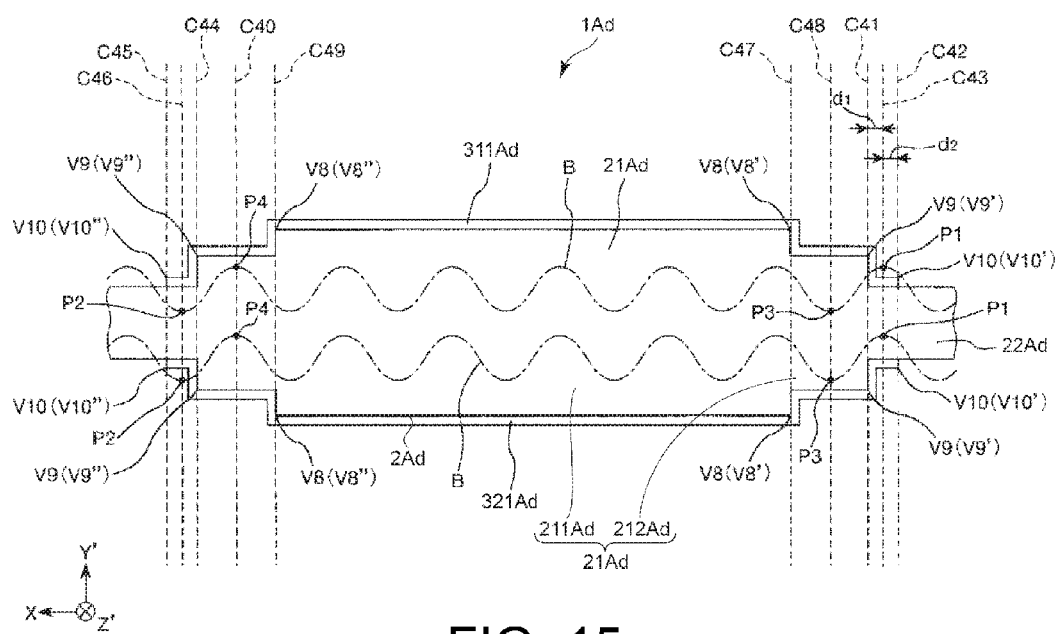
FIG. 15 is a diagram illustrating a positional relationship between a step difference and a waveform of flexural vibration.
Figure 16:
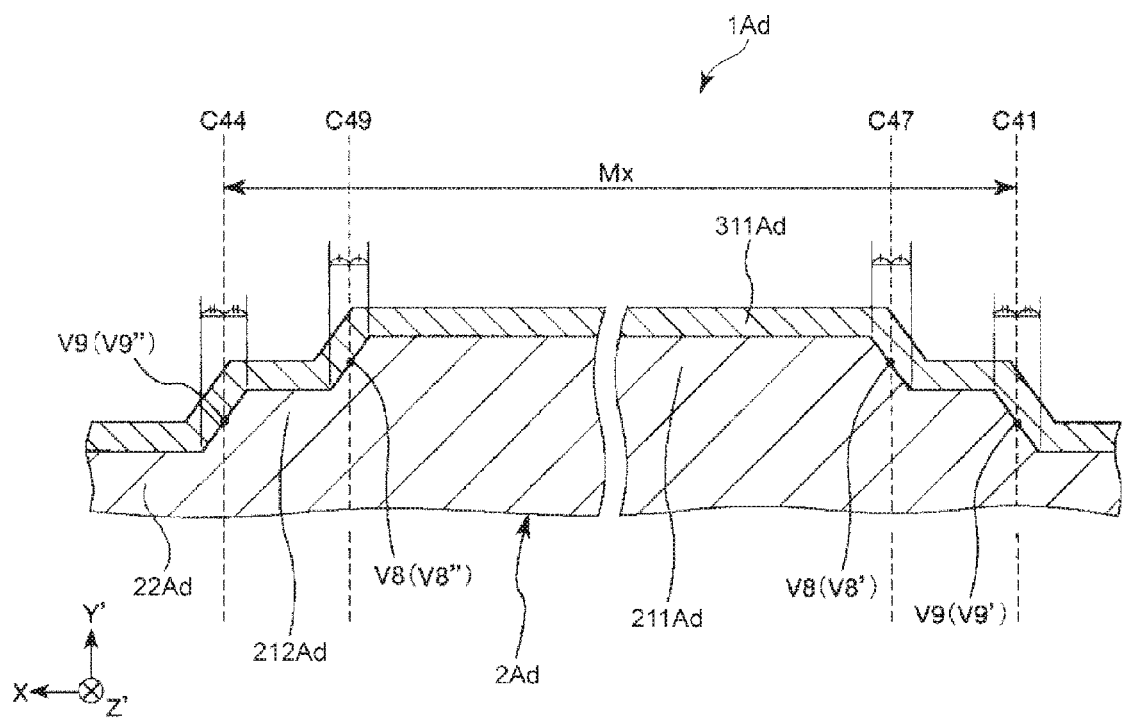
FIG. 16 is a sectional view illustrating a quartz crystal substrate which is formed through wet etching.

FIG. 13A is a top view of a resonator element according to the fourth embodiment of the invention, and FIG. 13B is a bottom view of the resonator element. FIG. 14 is a sectional view taken along the line D1-D1 in FIG. 13A. FIG. 15 is a diagram illustrating a positional relationship between a step difference and a waveform of flexural vibration. FIG. 16 is a sectional view illustrating a quartz crystal substrate which is formed through wet etching.

Hereinafter, a description will be made of the resonator element of the fourth embodiment focusing on a difference from the above-described embodiments, and a description of the same content will be omitted.

The resonator element according to the fourth embodiment of the invention is the same as in the second embodiment except that a vibration portion is formed in two stages (a so-called "multistage mesa type"). The same constituent elements as in the above-described embodiments are given the same reference numerals.

As illustrated in FIGS. 13A, 13B and 14, a vibration portion 21Ad of a resonator element 1Ad of the present embodiment includes a first region 211Ad which is located at the center and is thick, and a second region 212Ad which is located around the first region 211Ad and is thinner than the first region 211Ad.

A length Ex (a length L2 of a middle section) of excitation electrodes 311Ad and 321Ad in the X axis direction is larger than a length Mx (a length L1 of a thick section) of a vibration portion 21Ad in the X axis direction, that is, a relationship of Ex>Mx is satisfied, and both ends of the excitation electrodes 311Ad and 321Ad in the X axis direction are disposed so as to protrude from the vibration portion 21Ad on a thin portion 22Ad.

In the resonator element 1Ad, the first region 211Ad forms a thick section 11 which is thickest; the second region 212Ad forms a first middle section 121Ad which is thinner than the thick section 11; a portion of the thin portion 22Ad where the excitation electrodes 311Ad and 321Ad are disposed forms a second middle section 122Ad which is thinner than the first middle section 121Ad; and the thin portion 22Ad located therearound forms a thin section 13 which is thinner than the second middle section 122Ad.

For this reason, in the X axis direction, a step difference (first step difference) V8 is formed at a boundary between the first region 211Ad and the second region 212Ad; a step difference (second step difference) V9 is formed at a boundary between the second region 212Ad and the thin portion 22Ad; and a step difference (third step difference) V10 is formed at a boundary between the excitation electrodes 311Ad and 321Ad and the thin portion 22Ad. Hereinafter, the step difference V8 located on the −X axis side is referred to as a step difference V8', and the step difference V8 located on the +X axis side is referred to as a step difference V8". Similarly, the step difference V9 located on the −X axis side is referred to as a step difference V9', and the step difference V9 located on the +X axis side is referred to as a step difference V9", and the step difference V10 located on the −X axis side is referred to as a step difference V10', and the step difference V10 located on the +X axis side is referred to as a step difference V10".

As illustrated in FIG. 15, the antinode (first antinode) of flexural vibration which is spurious occurring in the quartz crystal substrate 2Ad is located between the step differences V9' and V10', and, similarly, the antinode of flexural vibration is also located between the step difference V9" and the step difference V10".

Specifically, a virtual straight line C43 which is parallel to the Y' axis through a peak P1 of an expected waveform B of the flexural vibration is located between a virtual straight line C41 which is parallel to the Y' axis through the step difference V9' and a virtual straight line C42 which is parallel to the Y' axis through the step difference V10'. Similarly, a virtual straight line C46 which is parallel to the Y' axis through a peak P2 of the waveform B of the flexural vibration is located between a virtual straight line C44 which is parallel to the Y' axis through the step difference V9" and a virtual straight line C45 which is parallel to the Y' axis through the step difference V10". As a result, the resonator element 1Ad can minimize the flexural vibration component and can thus reduce the spurious. Consequently, in the resonator element 1Ad, a CI value is reduced, and thus vibration characteristics can be improved.

Particularly, in the present embodiment, the antinode of the flexural vibration is located at the center between the step differences V9' and V10', and, similarly, the antinode of the flexural vibration is located at the center between the step differences V9" and V10". In other words, when a clearance between the virtual straight line C41 and the virtual straight line C43 is set to a distance d1, and a clearance between the virtual straight line C42 and the virtual straight line C43 is set to a distance d2, a relationship of (Ex−Mx)/2=d1+d2 is satisfied, and a relationship of d1=d2 is also satisfied. This is also the same for relationships between the virtual straight lines C44, C45 and C46. Consequently, it is possible to more effectively reduce the spurious.

When a wavelength of the flexural vibration is indicated by λ, it is preferable that a relationship of 0≤d1≤λ/8 and 0≤d2≤λ/8 is satisfied, and a relationship of Mx/2=(n/2+1/4)λ+d1+d2 (where n is an integer) is also satisfied. Consequently, the flexural vibration component can be even more effectively minimized, and thus the spurious can be even more effectively reduced.

In the resonator element 1Ad of the present embodiment, the antinode of the flexural vibration is also located between the step differences V8' and V9', and, similarly, the antinode of the flexural vibration is located between the step differences V8" and V9". Specifically, a virtual straight line C48 which is parallel to the Y' axis through a peak P3 of the waveform B of the flexural vibration is located between a virtual straight lines C47 and C42 which are parallel to the Y' axis through the step difference V8'. Similarly, a virtual straight line C40 which is parallel to the Y' axis through a peak P4 of the waveform B of the flexural vibration is located between a virtual straight lines C49 and C45 which are parallel to the Y' axis through the step difference V8". As a result, the resonator element 1Ad can more effectively minimize a flexural vibration component and can thus more effectively reduce the spurious due to a synergistic effect with the above-described effects.

The above description relates to the fourth embodiment. For example, in a case where the quartz crystal substrate 2Ad is formed by patterning a quartz crystal substrate through wet etching, as illustrated in FIG. 16, a crystal surface of the quartz crystal substrate 2Ad appears, and thus a sidewall of each of the first region 211Ad and the second region 212Ad is a tilt surface. The step difference V8 (V8' and V8") in this case is a portion located at the center between a boundary of a main surface and a tilt surface of the first region 211Ad and a boundary of the tilt surface and a main surface of the second region 212Ad. The step difference V9 (V9' and V9") is a portion located at the center between a boundary of the main surface and the tilt surface of the second region 212Ad and a boundary of the tilt surface and a main surface of the thin portion 22Ad. In addition, the length Mx of the vibration portion 21Ad in the X axis direction is a clearance between the step differences V9' and V9". Specifically, the clearance is a distance between the virtual straight lines C41 and C44 which respectively pass through the step differences V9 (V9' and V9").

The fourth embodiment can also exhibit the same effects as the above-described embodiments.

Fifth Embodiment

Next, a description will be made of a resonator element according to a fifth embodiment of the invention.

Figure 17A:
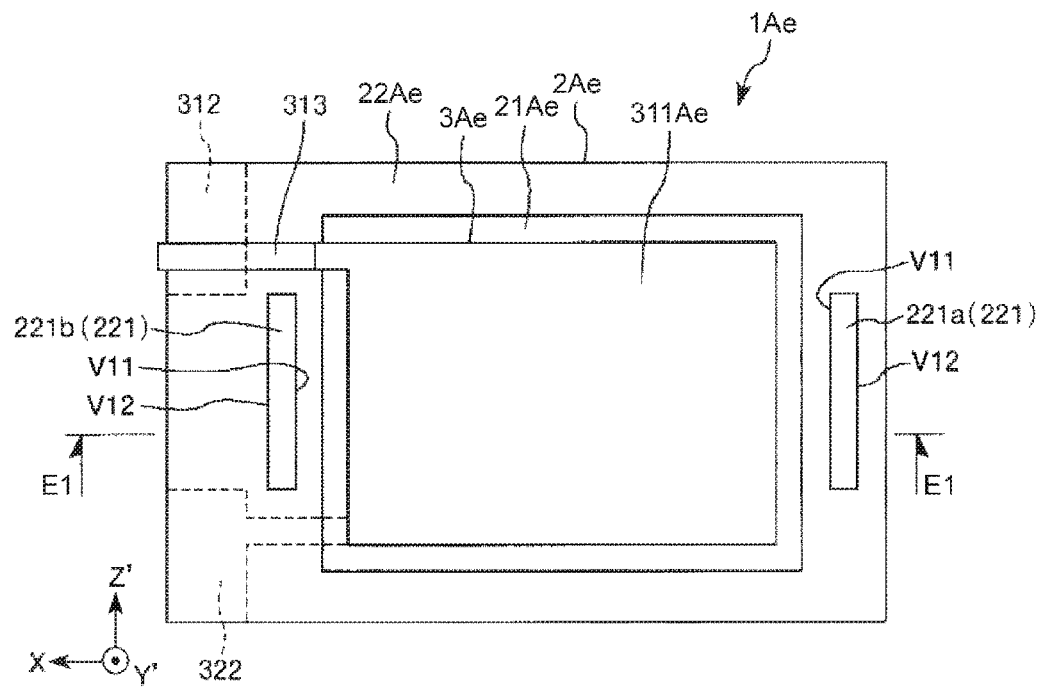
FIG. 17A is a top view of a resonator element according to a fifth embodiment of the invention.
Figure 17B:
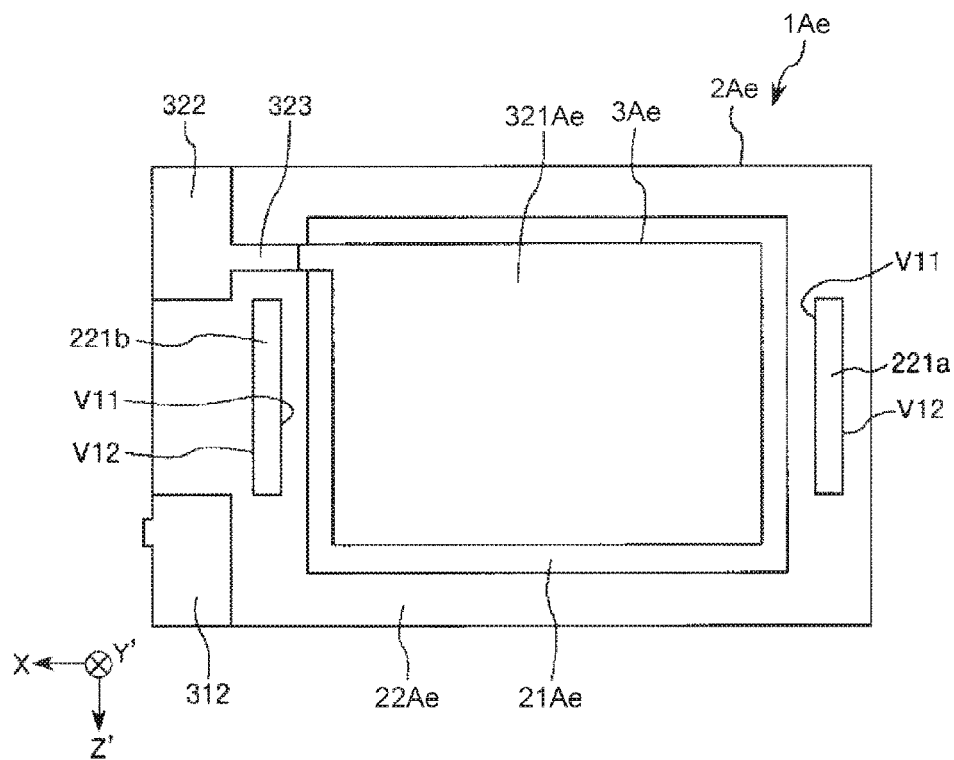
FIG. 17B is a bottom view of the resonator element according to the fifth embodiment of the invention.
Figure 18:
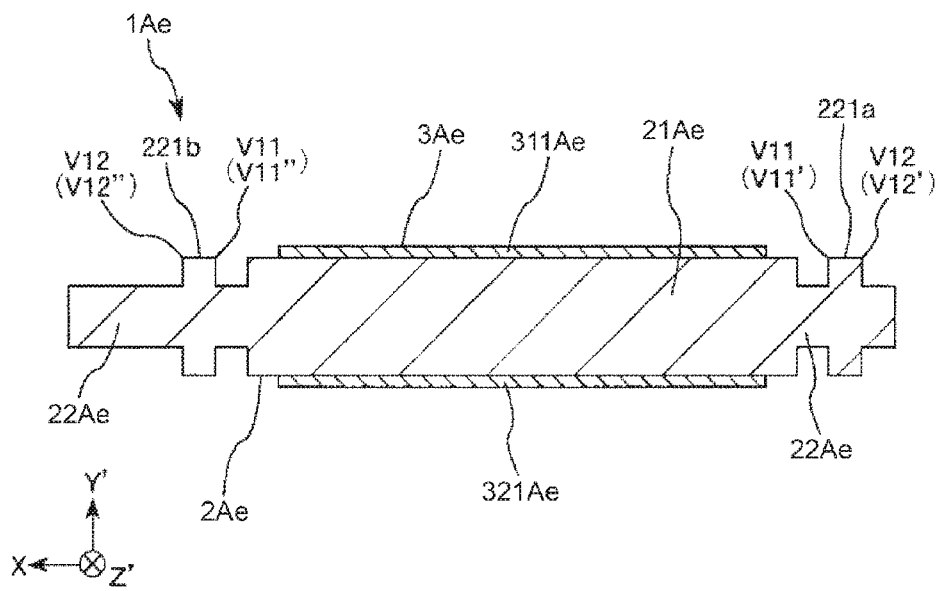
FIG. 18 is a sectional view taken along the line E1-E1 in FIG. 17A.
Figure 19:
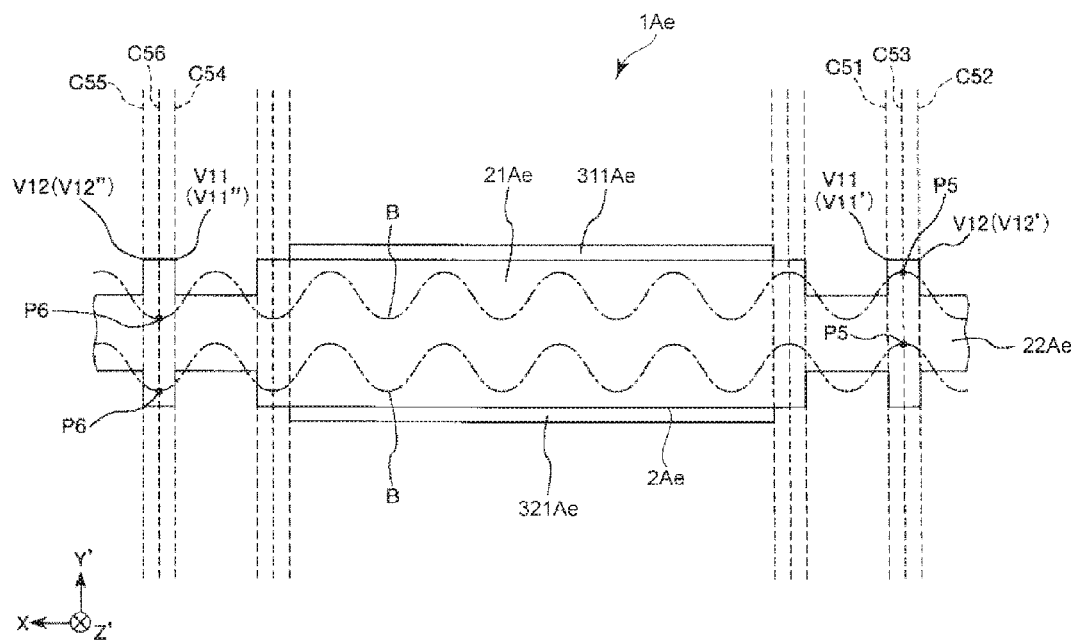
FIG. 19 is a diagram illustrating a positional relationship between a step difference and a waveform of flexural vibration.

FIG. 17A is a top view of a resonator element according to the fifth embodiment of the invention, and FIG. 17B is a bottom view of the resonator element. FIG. 18 is a sectional view taken along the line E1-E1 in FIG. 17A. FIG. 19 is a diagram illustrating a positional relationship between a step difference and a waveform of flexural vibration.

Hereinafter, a description will be made of the resonator element of the fifth embodiment focusing on a difference from the above-described embodiments, and a description of the same content will be omitted.

The resonator element according to the fifth embodiment of the invention is the same as in the first embodiment except that a protrusion is disposed at a thin portion. The same constituent elements as in the above-described embodiments are given the same reference numerals.

As illustrated in FIGS. 17A, 17B and 18, a protrusion 221 is provided at a thin portion 22Ae of a resonator element 1Ae of the present embodiment. The protrusion 221 includes, in a plan view, a first protrusion 221a which is separated from a vibration portion 21Ae toward the −X axis side and extends in the Z' axis direction (a direction along an outer edge intersecting the vibration direction (X axis direction) of the thickness shear vibration of the vibration portion 21Ae), and a second protrusion 221b which is separated from the vibration portion 21Ae toward the +X axis side and extends in the Z' axis direction. In the present embodiment, the first protrusion 221a and the second protrusion 221b (the first and second protrusions 221a and 221b) are integrally formed with the thin portion 22Ae, but the first and second protrusions 221a and 221b may be disposed, for example, by depositing a separate material such as SiO$_2$ on a surface of the thin portion 22Ae. The first and second protrusions 221a and 221b may be integrally formed, for example, by a frame-shaped portion which is disposed so as to surround the periphery of the vibration portion 21Ae.

In the resonator element 1Ae, step differences V11 and V12 are formed at boundaries between the protrusion 221 and the thin portion 22Ae in the X axis direction. Hereinafter, the step difference V11 located on the +X axis side of the first protrusion 221a is referred to as a step difference V11', and the step difference V11 located on the −X axis side of the second protrusion 221b is referred to as a step difference V11". Similarly, the step difference V12 located on the −X axis side of the first protrusion 221a is referred to as a step difference V12', and the step difference V12 located on the +X axis side of the second protrusion 221b is referred to as a step difference V12".

As illustrated in FIG. 19, the antinode of flexural vibration which is spurious occurring in the quartz crystal substrate 2Ae is located between the step differences V11' and V12', and, similarly, the antinode of flexural vibration is also located between the step difference V11" and the step difference V12". Specifically, a virtual straight line C53 which is parallel to the Y' axis through a peak P5 of an expected waveform B of the flexural vibration is located between a virtual straight line C51 which is parallel to the Y' axis through the step difference V11' and a virtual straight line C52 which is parallel to the Y' axis through the step difference V12'. Similarly, a virtual straight line C56 which is parallel to the Y' axis through a peak P6 of the waveform B of the flexural vibration is located between a virtual straight line C54 which is parallel to the Y' axis through the step difference V11" and a virtual straight line C55 which is parallel to the Y' axis through the step difference V12". As a result, the resonator element 1Ae can more effectively minimize the flexural vibration component and can thus more effectively reduce the spurious.

The fifth embodiment can also exhibit the same effects as the above-described embodiments.

Sixth Embodiment

Next, a description will be made of a resonator element according to a sixth embodiment of the invention.

Figure 20A:
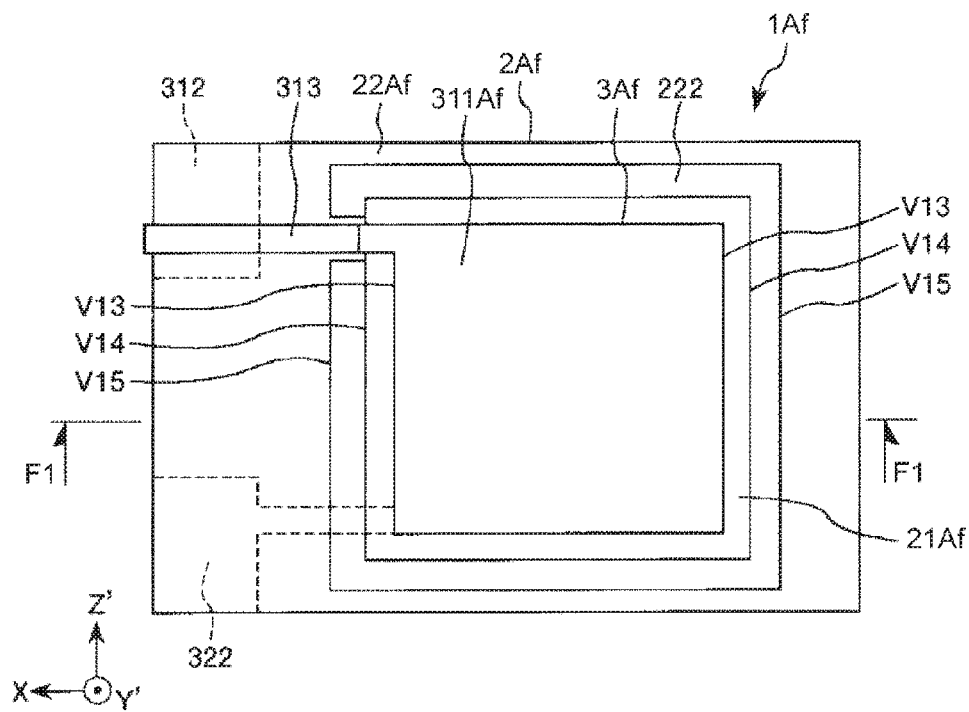
FIG. 20A is a top view of a resonator element according to a sixth embodiment of the invention.
Figure 20B:
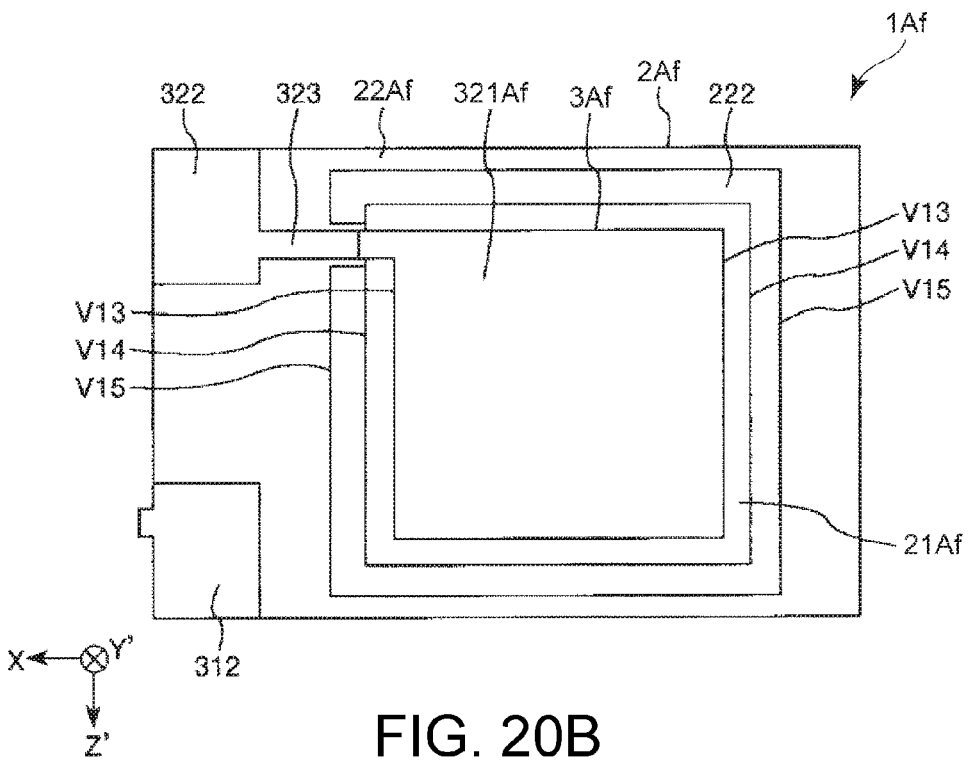
FIG. 20B is a bottom view of the resonator element according to the sixth embodiment of the invention.
Figure 21:
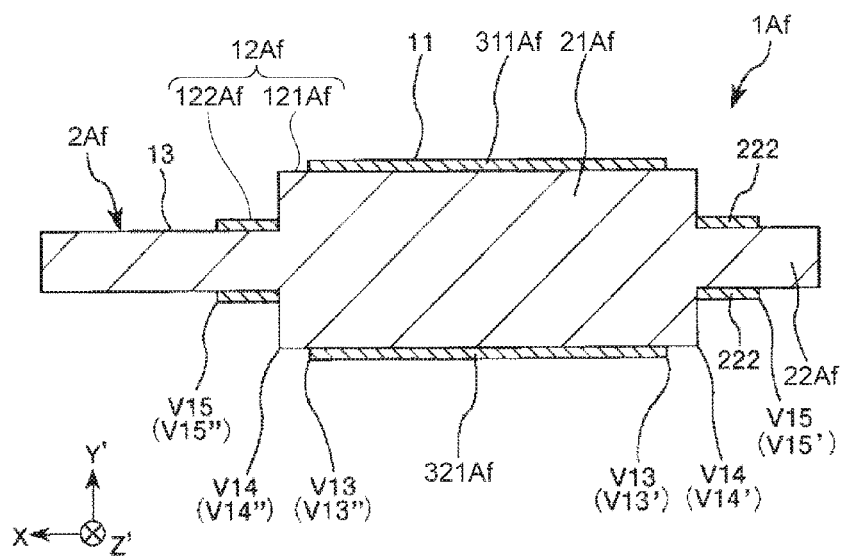
FIG. 21 is a sectional view taken along the line F1-F1 in FIG. 20A.
Figure 22:
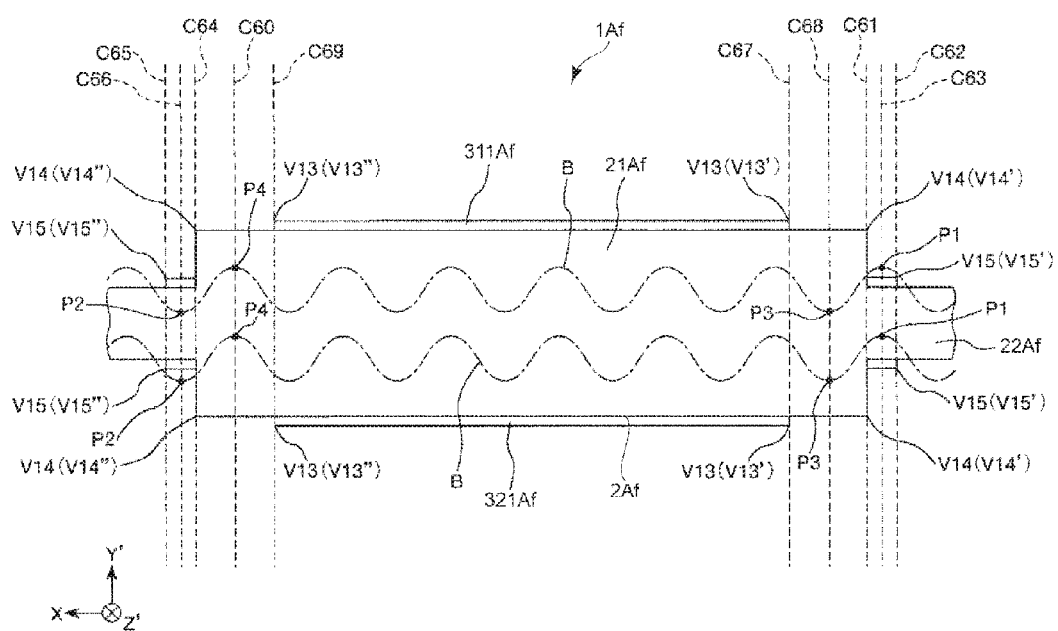
FIG. 22 is a diagram illustrating a positional relationship between a step difference and a waveform of flexural vibration.

FIG. 20A is a top view of a resonator element according to the sixth embodiment of the invention, and FIG. 20B is a bottom view of the resonator element according to the sixth embodiment of the invention. FIG. 21 is a sectional view taken along the line F1-F1 in FIG. 20A. FIG. 22 is a diagram illustrating a positional relationship between a step difference and a waveform of flexural vibration.

Hereinafter, a description will be made of the resonator element of the sixth embodiment focusing on a difference from the above-described embodiments, and a description of the same content will be omitted.

The resonator element according to the sixth embodiment of the invention is the same as in the first embodiment except that a protrusion is disposed at a thin portion. The same constituent elements as in the above-described embodiments are given the same reference numerals.

As illustrated in FIGS. 20A, 20B and 21, a protrusion 222 is provided at a thin portion 22Af of a resonator element 1Af of the present embodiment. The protrusion 222 has a frame shape which is in contact with an outer circumference of a vibration portion 21Af and surrounds the vibration portion 21Af in a plan view. However, the protrusion 222 is not formed at portions which overlap the extraction electrodes 313 and 323. The protrusion 222 is made of for example, the same material as that of an electrode 3Af and is thus formed along with the electrode 3Af. However, a material forming the protrusion 222 is not limited thereto, and, for example, SiO$_2$ may be used.

In the resonator element 1Af, a portion of the vibration portion 21Af where excitation electrodes 311Af and 321Af are disposed forms a thick section 11 which is thickest; the vibration portion 21Af therearound forms a first middle section 121Af which is thinner than the thick section 11; a portion of a thin portion 22Af where the protrusion 222 is disposed forms a second middle section 122Af which is thinner than the first middle section 121Af; and the thin portion 22Af forms a thin section 13 which is thinner than the second middle section 122Af.

For this reason, in the X axis direction, a step difference (first step difference) V13 is formed at a boundary between the excitation electrodes 311Af and 321Af and the vibration portion 21Af; a step difference (second step difference) V14 is formed at a boundary between the vibration portion 21Af and the protrusion 222; and a step difference (third step difference) V15 is formed at a boundary between the protrusion 222 and the thin portion 22Af.

Hereinafter, the step difference V13 located on the −X axis side is referred to as a step difference V13', and the step difference V13 located on the +X axis side is referred to as a step difference V13". Similarly, the step difference V14 located on the −X axis side is referred to as a step difference V14', and the step difference V14 located on the +X axis side is referred to as a step difference V14", and the step difference V15 located on the −X axis side is referred to as a step difference V15', and the step difference V15 located on the +X axis side is referred to as a step difference V15".

As illustrated in FIG. 22, the antinode of flexural vibration which is spurious occurring in the quartz crystal substrate 2Af is located between the step differences V14' and V15', and, similarly, the antinode of flexural vibration is also located between the step difference V14" and the step difference V15". Specifically, a virtual straight line C63 which is parallel to the Y' axis through a peak P1 of an expected waveform B of the flexural vibration is located between a virtual straight line C61 which is parallel to the Y' axis through the step difference V14' and a virtual straight line C62 which is parallel to the Y' axis through the step difference V15'. Similarly, a virtual straight line C66 which is parallel to the Y' axis through a peak P2 of the waveform B of the flexural vibration is located between a virtual straight line C64 which is parallel to the Y' axis through the step difference V14" and a virtual straight line C65 which is parallel to the Y' axis through the step difference V15". As a result, the resonator element 1Af can minimize the flexural vibration component and can thus reduce the spurious. Consequently, in the resonator element 1Af, a CI value is reduced, and thus vibration characteristics can be improved.

In the resonator element 1Af of the present embodiment, the antinode of the flexural vibration is located between the step differences V13' and V14', and, similarly, the antinode of the flexural vibration is located between the step differences V13" and V14". Specifically, a virtual straight line C68 which is parallel to the Y' axis through a peak P3 of the waveform B of the flexural vibration is located between a virtual straight lines C67 and C61 which are parallel to the Y' axis through the step difference V13'. Similarly, a virtual straight line C60 which is parallel to the Y' axis through a peak P4 of the waveform B of the flexural vibration is located between a virtual straight lines C69 and C64 which are parallel to the Y' axis through the step difference V13". As a result, the resonator element 1Af can more effectively minimize a flexural vibration component and can thus more effectively reduce the spurious due to a synergistic effect with the above-described effects.

The sixth embodiment can also exhibit the same effects as the above-described embodiments.

Seventh Embodiment

Figure 23A:
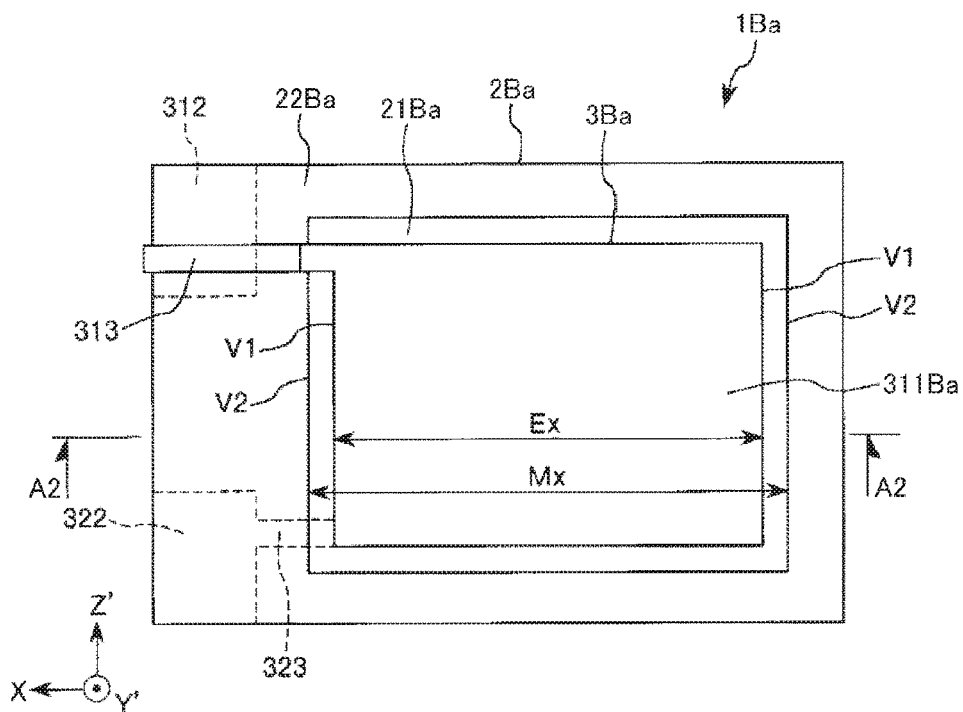
FIG. 23A is a top view of a resonator element according to a seventh embodiment of the invention.
Figure 23B:
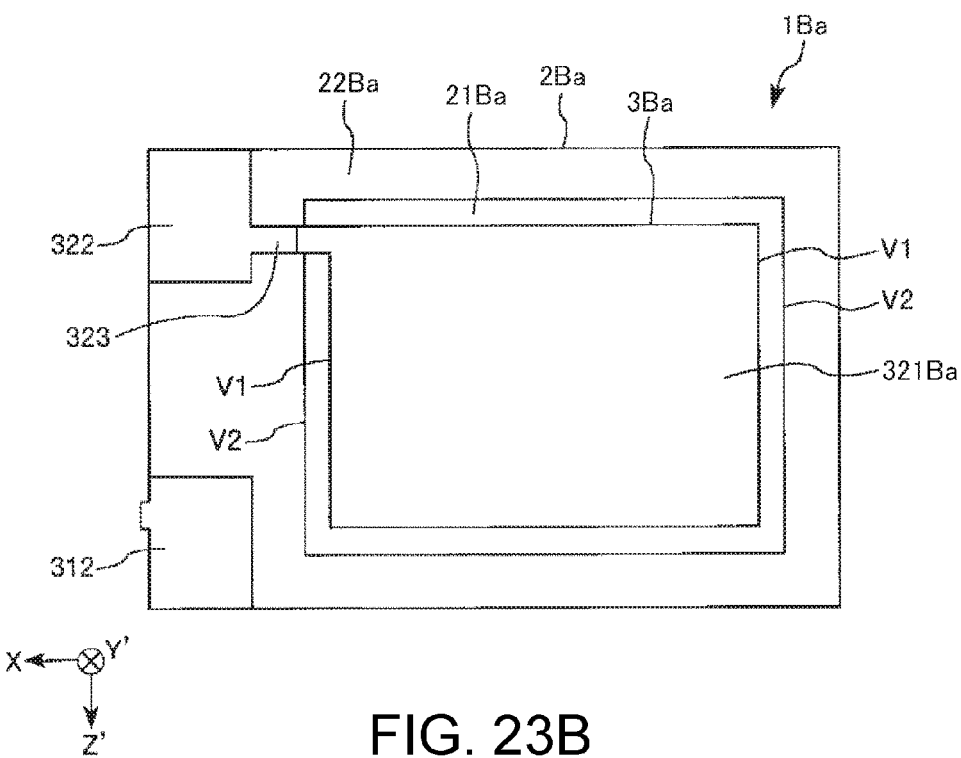
FIG. 23B is a bottom view of the resonator element according to the seventh embodiment of the invention.
Figure 24:
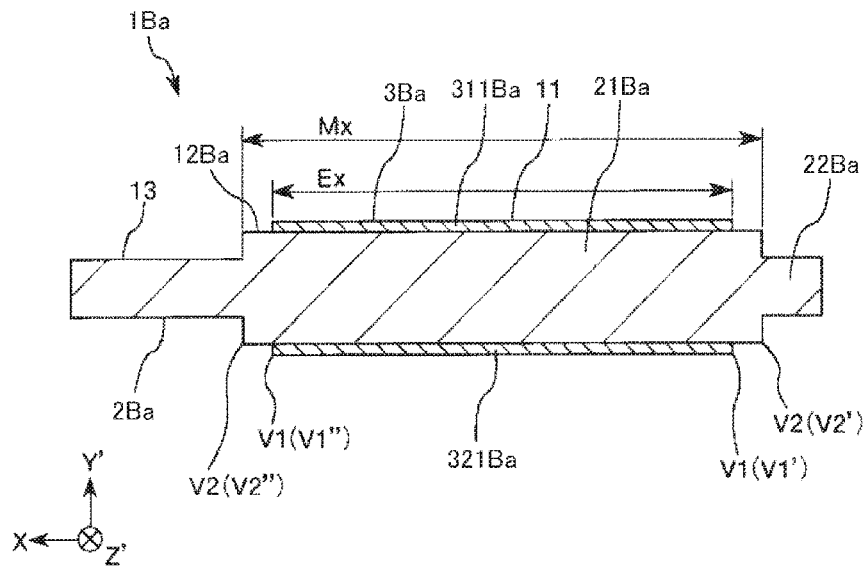
FIG. 24 is a sectional view taken along the line A2-A2 in FIG. 23A.
Figure 25:
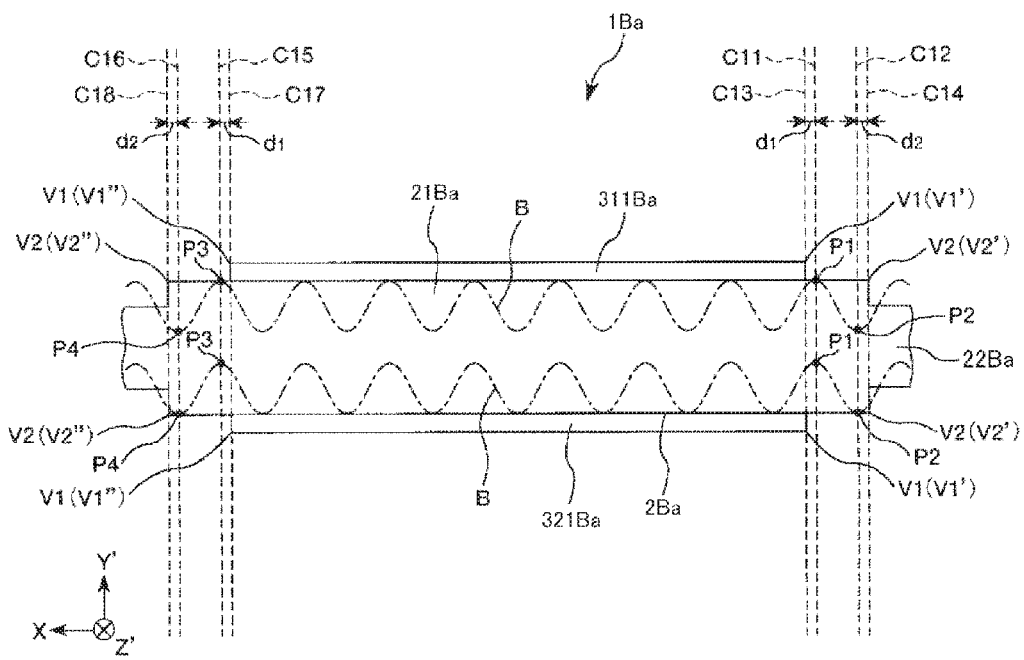
FIG. 25 is a diagram illustrating a positional relationship between a step difference and a waveform of flexural vibration.
Figure 26:
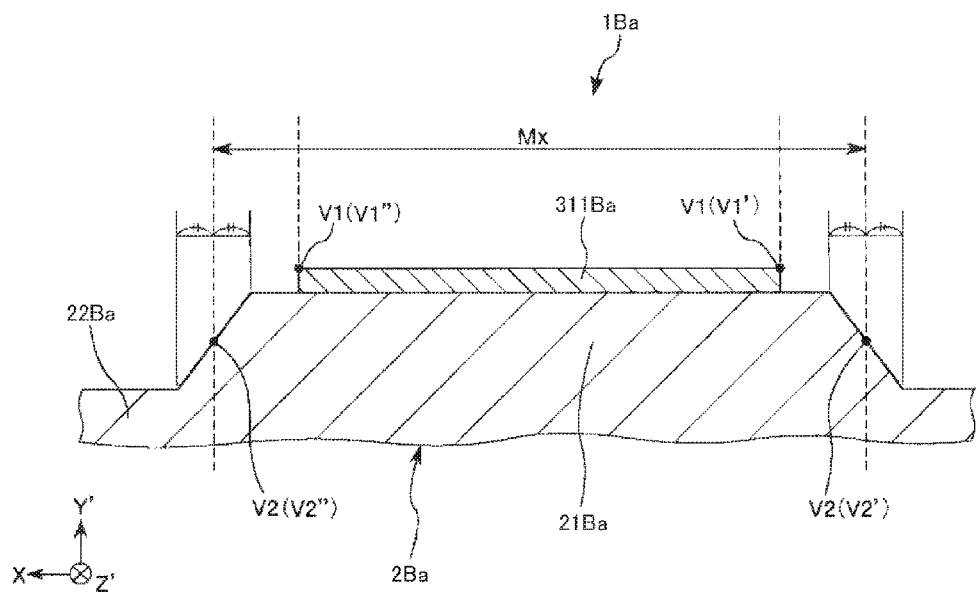
FIG. 26 is a sectional view illustrating a quartz crystal substrate which is formed through wet etching.

FIG. 23A is a top view of a resonator element according to a seventh embodiment of the invention, and FIG. 23B is a bottom view of the resonator element. FIG. 24 is a sectional view taken along the line A2-A2 in FIG. 23A. FIG. 25 is a diagram illustrating a positional relationship between a step difference and a waveform of flexural vibration. FIG. 26 is a sectional view illustrating a quartz crystal substrate which is formed through wet etching.

As illustrated in FIGS. 23A, 23B and 24, a resonator element 1Ba includes a quartz crystal substrate (piezoelectric substrate) 2Ba, and an electrode 3Ba formed on the quartz crystal substrate 2Ba.

Quartz Crystal Substrate

The quartz crystal substrate is the same as the quartz crystal substrate described in the first embodiment, and description thereof will be omitted.

As illustrated in FIGS. 23A, 23B and 24, the quartz crystal substrate 2Ba includes a vibration portion 21Ba which performs thickness shear vibration, and a thin portion 22Ba which is located around the vibration portion 21Ba so as to be integrally formed with the vibration portion 21Ba and is thinner than the vibration portion 21Ba. The vibration portion 21Ba protrudes toward both of +Y' axis side and −Y' axis side of the thin portion 22Ba. However, the vibration portion 21Ba may protrude toward at least one of +Y' axis side and −Y' axis side.

The quartz crystal substrate 2Ba may have undergone, for example, bevel machining for grinding the periphery of the quartz crystal substrate 2Ba, or convex machining for forming an upper surface and a lower surface as convex surfaces. The four corners of the vibration portion 21Ba may be rounded.

The electrode 3Ba includes a pair of excitation electrodes 311Ba and 321Ba, a pair of pad electrodes 312 and 322, and a pair of extraction electrodes 313 and 323. The excitation electrode 311Ba is disposed on a front surface of the vibration portion 21Ba, and the excitation electrode 321Ba is disposed on a rear surface of the vibration portion 21Ba so as to oppose the excitation electrode 311Ba. A length Ex (a length L1 of a thick section) of the excitation electrodes 311Ba and 321Ba in the X axis direction is smaller than a length Mx (a length L2 of a middle section) of the vibration portion 21Ba in the X axis direction, that is, a relationship of Ex<Mx is satisfied. The excitation electrodes 311Ba and 321Ba are disposed at the center so as not to overlap both ends of the vibration portion 21Ba in the X axis direction.

The pad electrodes 312 and 322 are arranged in the Z' axis direction on a lower surface of the thin portion 22Ba located at ends of the quartz crystal substrate 2Ba on the +X axis side. The extraction electrode 313 is disposed so as to connect the excitation electrode 311Ba and the pad electrode 312 to each other, and the extraction electrode 323 is disposed so as to connect the excitation electrode 321Ba and the pad electrode 322 to each other.

A configuration of the electrodes is the same as in the first embodiment, and thus description thereof will be omitted.

The above description relates to the configuration of the resonator element 1Ba. In the resonator element 1Ba, as illustrated in FIG. 24, a portion of the vibration portion 21Ba where the excitation electrodes 311Ba and 321Ba are provided forms a thick section 11 which is thickest; the vibration portion 21Ba located therearound forms a middle section 12Ba which is thinner than the thick section 11; and the thin portion 22Ba located to surround the vibration portion 21Ba forms a thin section 13 which is thinner than the middle section 12Ba. For this reason, in the resonator element 1Ba, a step difference (first step difference) V1 is formed at a boundary between the vibration portion 21Ba and the excitation electrodes 311Ba and 321Ba, and a step difference (second step difference) V2 is formed at a boundary between the vibration portion 21Ba and the thin portion 22Ba, in the X axis direction. Hereinafter, the step difference V1 located on the −X axis side is referred to as a step difference V1', and the step difference V1 located on the +X axis side is referred to as a step difference V1". Similarly, the step difference V2 located on the −X axis side is referred to as a step difference V2', and the step difference V2 located on the +X axis side is referred to as a step difference V2".

As illustrated in FIG. 25, two adjacent antinodes (maximum amplitude positions) of flexural vibration which is spurious (unwanted vibration) occurring in the quartz crystal substrate 2Ba are located between the step difference V1' and the step difference V2', and, similarly, two adjacent antinodes of flexural vibration are also located between the step difference V1" and the step difference V2". Specifically, when a virtual straight line which is parallel to the Y' axis through a peak (maximum amplitude point) P1 of an expected waveform B of the flexural vibration is indicated by C11; a virtual straight line which is parallel to the Y' axis through a peak P2 which is adjacent to the peak P1 of the waveform B on the −X axis side is indicated by C12; a virtual straight line which is parallel to the Y' axis through the step difference V1' is indicated by C13; and a virtual straight line which is parallel to the Y' axis through the step difference V2' is indicated by C14, the virtual straight lines C11 and C12 are located between the virtual straight lines C13 and C14. Similarly, when a virtual straight line which is parallel to the Y' axis through a peak P3 of the waveform B is indicated by C15; a virtual straight line which is parallel to the Y' axis through a peak P4 which is adjacent to the peak P3 of the waveform B on the +X axis side is indicated by C16; a virtual straight line which is parallel to the Y' axis through the step difference V1" is indicated by C17; and a virtual straight line which is parallel to the Y' axis through the step difference V2" is indicated by C18, the virtual straight lines C15 and C16 are located between the virtual straight lines C17 and C18.

In other words, when a wavelength of the flexural vibration is indicated by λ, a clearance between the virtual straight line C11 and the virtual straight line C13 (a clearance between the virtual straight line C15 and the virtual straight line C17) is set to a distance d1, and a clearance between the virtual straight line C12 and the virtual straight line C14 (a clearance between the virtual straight line C16 and the virtual straight line C18) is set to a distance d2, a relationship of $(Mx-Ex)/2=\lambda/2-d1-d2$ is satisfied. As a result, the spurious can be effectively confined between the step differences V1' and V2' (V1" and V2"). For this reason, the spurious can be reduced, and thus a CI value of the resonator element 1Ba is reduced and vibration characteristics are improved.

Particularly, in the present embodiment, the virtual straight lines C11 and C12 are located in a symmetrical manner between the virtual straight lines C13 and C14, and the virtual straight lines C15 and C16 are located in a symmetrical manner between the virtual straight lines C17 and C18. In other words, a relationship of d1=d2 is satisfied. Consequently, it is possible to more effectively confine the spurious and thus to reduce the spurious. In addition, it is preferable that d1 and d2 satisfy a relationship of $0<d1 \leq \lambda/8$ and $0<d2 \leq \lambda/8$, and also satisfy a relationship of $Mx/2=(n/2+1/4)\lambda-d1-d2$ (where n is an integer). Consequently, the spurious can be more effectively reduced. The wavelength λ, of the flexural vibration can be obtained according to an equation such as $\lambda/2=(1.332/f)-0.0024$ by using a resonance frequency f of the resonator element 1Ba.

The above description relates to the seventh embodiment. For example, in a case where the quartz crystal substrate 2Ba is formed by patterning a quartz crystal substrate through wet etching, as illustrated in FIG. 26, a crystal surface of the quartz crystal substrate 2Ba appears, and thus a sidewall of the vibration portion 21Ba is a tilt surface. The step difference V2 (V2' and V2") in this case is a portion located at the center between a boundary of a main surface and a tilt surface of the vibration portion 21Ba and a boundary of the tilt surface and a main surface of the thin portion 22Ba. The length Mx of the vibration portion 21Ba in the X axis direction is a clearance between the step differences V2' and V2".

Eighth Embodiment

Next, a description will be made of a resonator element according to an eighth embodiment of the invention.

Figure 27A:
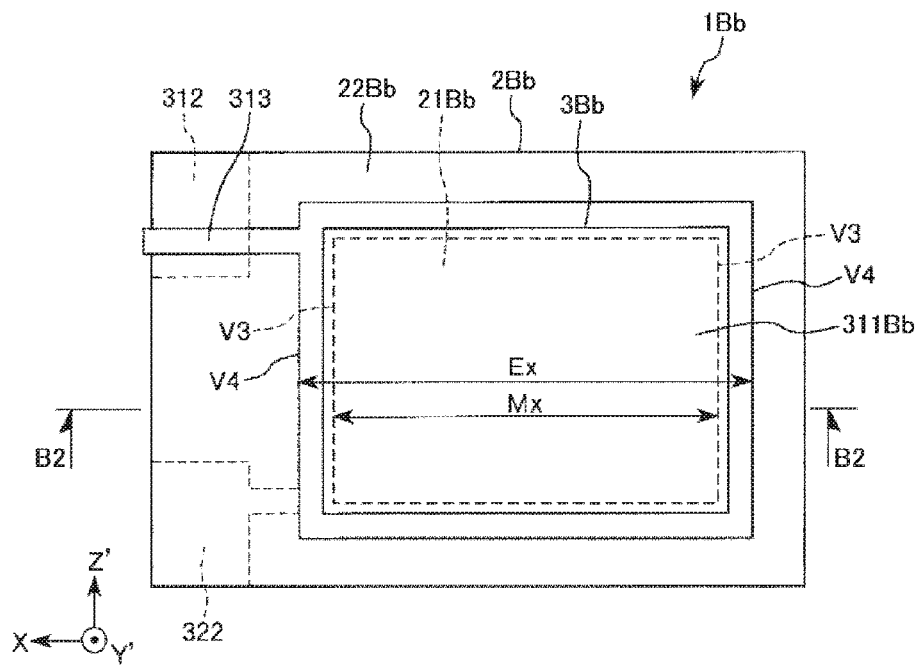
FIG. 27A is a top view of a resonator element according to an eighth embodiment of the invention.
Figure 27B:
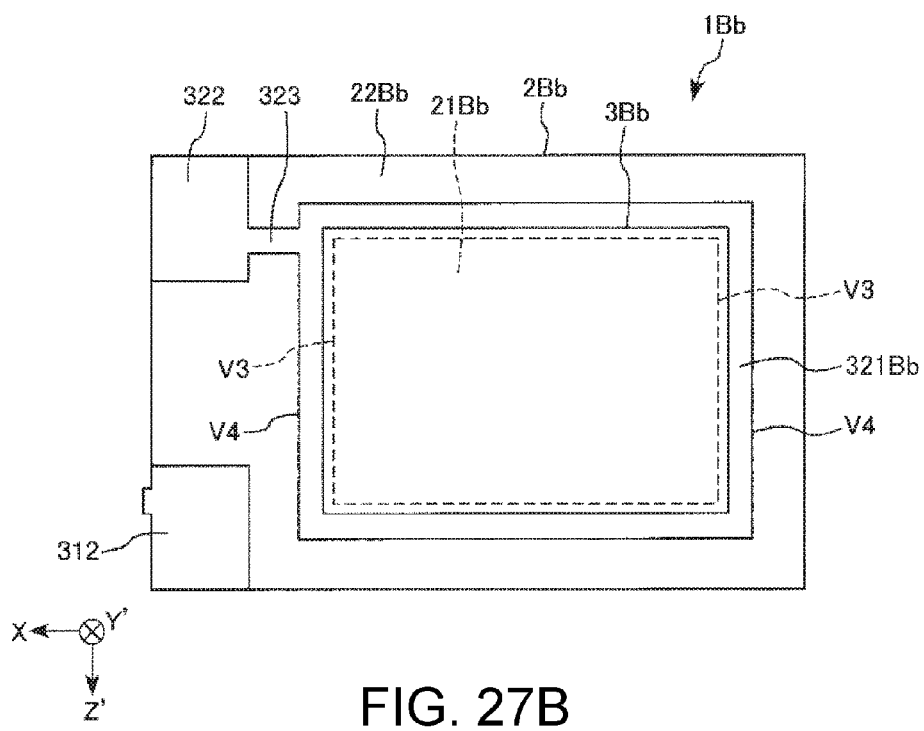
FIG. 27B is a bottom view of the resonator element according to the eighth embodiment of the invention.
Figure 28:
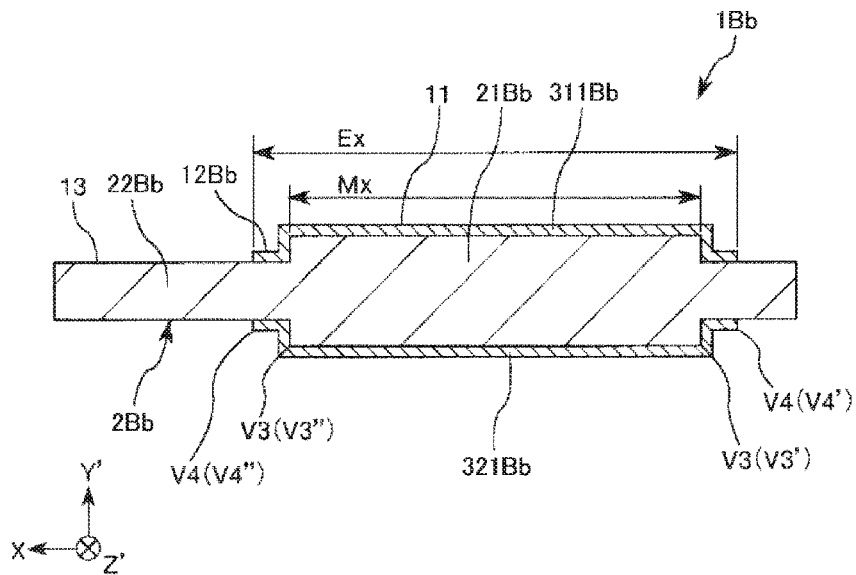
FIG. 28 is a sectional view taken along the line B2-B2 in FIG. 27A.
Figure 29:
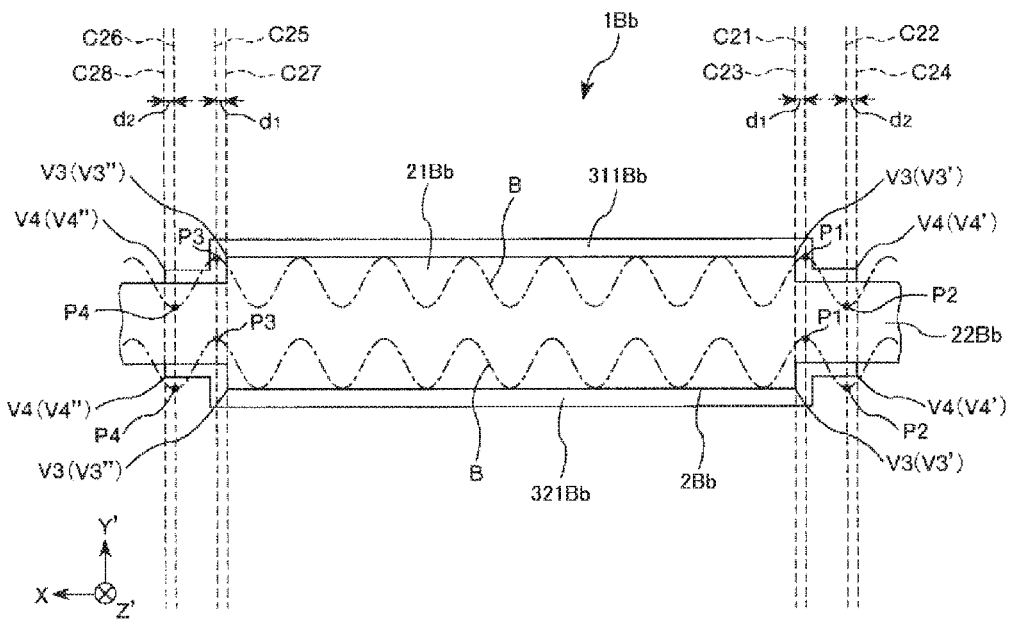
FIG. 29 is a diagram illustrating a positional relationship between a step difference and a waveform of flexural vibration.
Figure 30:
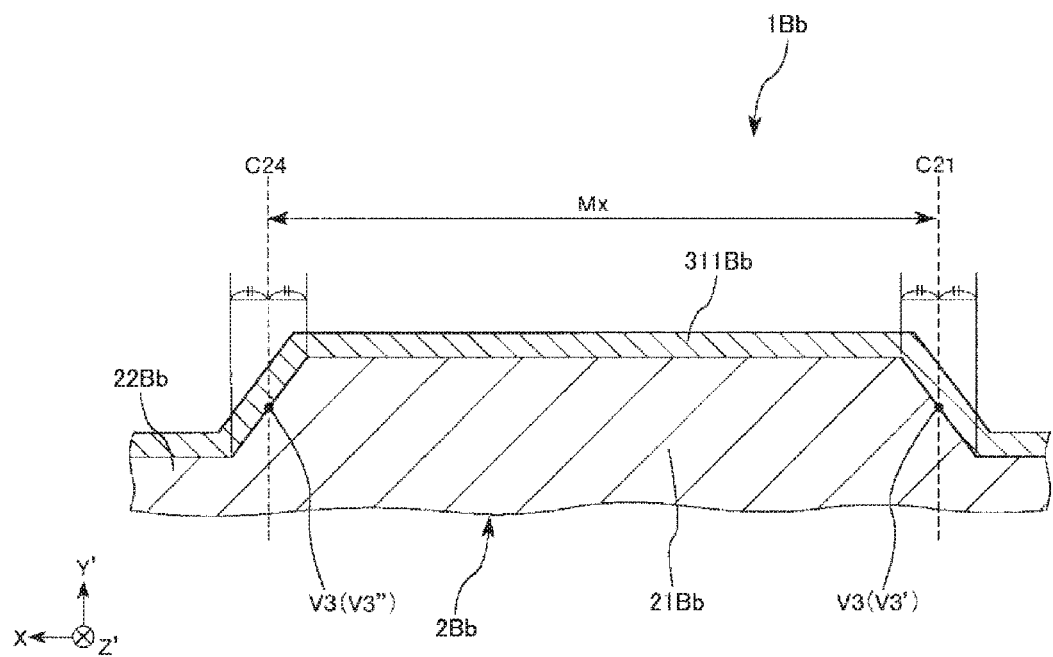
FIG. 30 is a sectional view illustrating a quartz crystal substrate which is formed through wet etching.

FIG. 27A is a top view of a resonator element according to the eighth embodiment of the invention, and FIG. 27B is a bottom view of the resonator element. FIG. 28 is a sectional view taken along the line B2-B2 in FIG. 27A. FIG. 29 is a diagram illustrating a positional relationship between a step difference and a waveform of flexural vibration. FIG. 30 is a sectional view illustrating a quartz crystal substrate which is formed through wet etching.

Hereinafter, a description will be made of the resonator element of the eighth embodiment focusing on a difference from the seventh embodiment, and a description of the same content will be omitted.

The resonator element according to the eighth embodiment of the invention is the same as in the seventh embodiment except for a difference in arrangement of electrodes. The same constituent elements as in the above-described embodiment are given the same reference numerals.

As illustrated in FIGS. 27A, 27B and 28, in a resonator element 1Bb of the present embodiment, a length Ex (a length L2 of a middle section) of excitation electrodes 311Bb and 321Bb in the X axis direction is larger than a length Mx (a length L1 of a thick section) of the vibration portion 21Bb in the X axis direction, that is, a relationship of Ex>Mx is satisfied. Both ends of the excitation electrodes 311Bb and 321Bb in the X axis direction are disposed so as to protrude from a vibration portion 21Bb and to overlap a thin portion 22Bb which is a peripheral portion surrounding the vibration portion 21Bb.

In the resonator element 1Bb, the vibration portion 21Bb forms a thick section 11 which is thickest; a portion of the thin portion 22Bb on which the excitation electrodes 311Bb and 321Bb are disposed forms a middle section 12Bb which is thinner than the thick section 11; and the thin portion 22Bb located therearound forms a thin section 13 which is thinner than the middle section 12Bb.

For this reason, a step difference (first step difference) V3 is formed at a boundary between the vibration portion 21Bb and the thin portion 22Bb, and a step difference (second step difference) V4 is formed at a boundary between the excitation electrodes 311Bb and 321Bb and the thin portion 22Bb, in the X axis direction. Hereinafter, the step difference V3 located on the −X axis side is referred to as a step difference V3', and the step difference V3 located on the +X axis side is referred to as a step difference V3". Similarly, the step difference V4 located on the −X axis side is referred to as a step difference V4', and the step difference V4 located on the +X axis side is referred to as a step difference V4".

As illustrated in FIG. 29, two adjacent antinodes of flexural vibration which is spurious occurring in the quartz crystal substrate 2Bb are located between the step difference V3' and the step difference V4', and, similarly, two adjacent antinodes of flexural vibration are also located between the step difference V3" and the step difference V4". Specifically, when a virtual straight line which is parallel to the Y' axis through a peak P1 of an expected waveform B of the flexural vibration is indicated by C21; a virtual straight line which is parallel to the Y' axis through a peak P2 which is adjacent to the peak P1 of the waveform B on the −X axis side is indicated by C22; a virtual straight line which is parallel to the Y' axis through the step difference V3' is indicated by C23; and a virtual straight line which is parallel to the Y' axis through the step difference V4' is indicated by C24, the virtual straight lines C21 and C22 are located between the virtual straight lines C23 and C24. Similarly, when a virtual straight line which is parallel to the Y' axis through a peak P3 of the waveform B is indicated by C25; a virtual straight line which is parallel to the Y' axis through a peak P4 which is adjacent to the peak P3 of the waveform B on the +X axis side is indicated by C26; a virtual straight line which is parallel to the Y' axis through the step difference V3" is indicated by C27; and a virtual straight line which is parallel to the Y' axis through the step difference V4" is indicated by C28, the virtual straight lines C25 and C26 are located between the virtual straight lines C27 and C28.

In other words, when a wavelength of the flexural vibration is indicated by $\lambda$, a clearance between the virtual straight line C21 and the virtual straight line C23 (a clearance between the virtual straight line C25 and the virtual straight line C27) is set to a distance d1, and a clearance between the virtual straight line C22 and the virtual straight line C24 (a clearance between the virtual straight line C26 and the virtual straight line C28) is set to a distance d2, a relationship of $(Ex-Mx)/2=\lambda/2-d1-d2$ is satisfied. As a result, the unwanted vibration can be effectively confined between the step differences V3 and V4. For this reason, the spurious can be reduced, and thus a CI value of the resonator element 1Bb is reduced and vibration characteristics are improved.

Particularly, in the present embodiment, the virtual straight lines C21 and C22 are located in a symmetrical manner between the virtual straight lines C23 and C24, and the virtual straight lines C25 and C26 are located in a symmetrical manner between the virtual straight lines C27 and C28. In other words, a relationship of d1=d2 is satisfied. Consequently, it is possible to more effectively reduce the spurious. In addition, it is preferable that d1 and d2 satisfy a relationship of $0<d1\leq\lambda/8$ and $0<d2\leq\lambda/8$, and also satisfy a relationship of $Mx/2=(n/2+1/4)\lambda-d1-d2$ (where n is an integer). Consequently, the spurious can be even more effectively reduced.

The above description relates to the eighth embodiment. For example, in a case where the quartz crystal substrate 2Bb is formed by patterning a quartz crystal substrate through wet etching, as illustrated in FIG. 30, a crystal surface of the quartz crystal substrate 2Bb appears, and thus a sidewall of the vibration portion 21Bb is a tilt surface. The step difference V3 (V3' and V3") in this case is a portion located at the center between a boundary of a main surface and a tilt surface of the vibration portion 21Bb and a boundary of the tilt surface and a main surface of the thin portion 22Bb. The length Mx of the vibration portion 21Bb in the X axis direction is a clearance between the step differences V3' and V3" (the virtual straight line C21 and the virtual straight line C24).

The eighth embodiment can also exhibit the same effects as the above-described embodiment.

In the present embodiment, the excitation electrodes 311Bb and 321Bb are also disposed so as to exceed the vibration portion 21Bb in the Z' axis direction, but may be disposed so as not to exceed the vibration portion 21Bb in the Z' axis direction.

Ninth Embodiment

Next, a description will be made of a resonator element according to a ninth embodiment of the invention.

Figure 31A:
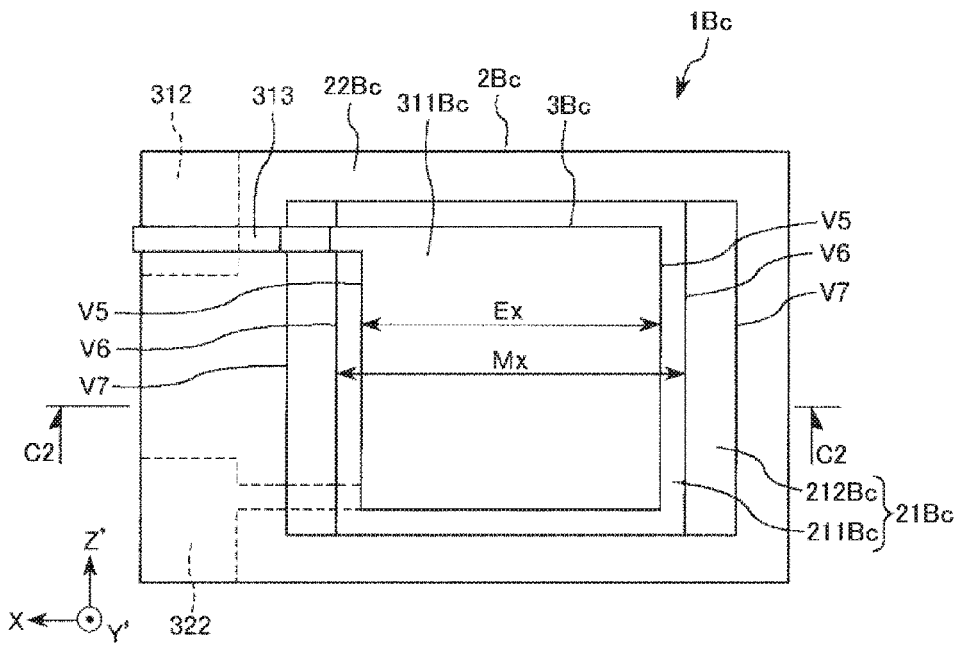
FIG. 31A is a top view of a resonator element according to a ninth embodiment of the invention.
Figure 31B:
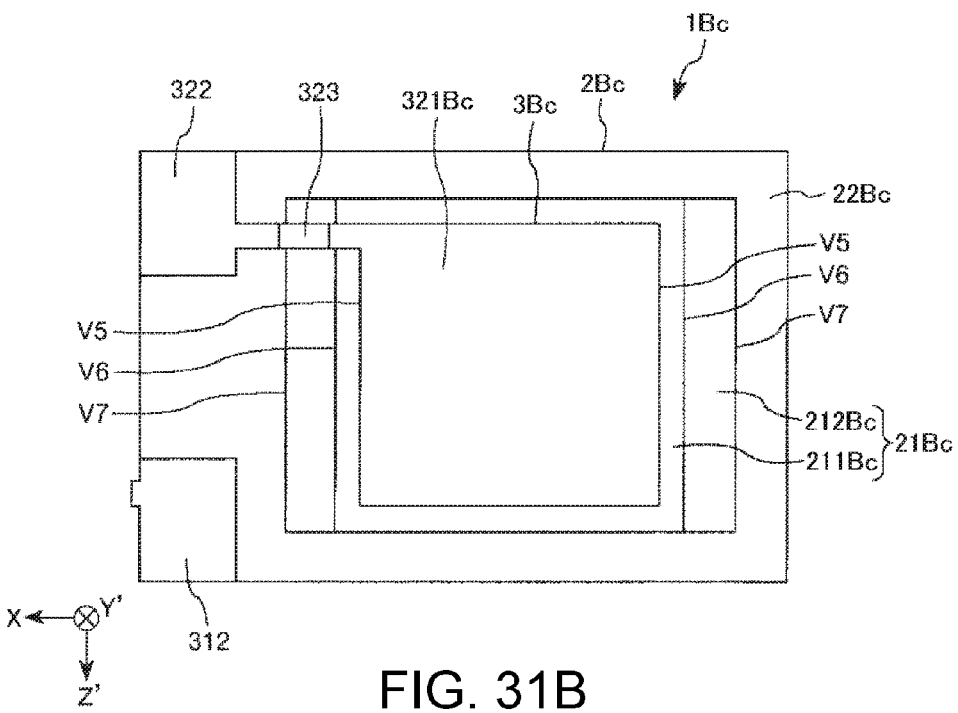
FIG. 31B is a bottom view of the resonator element according to the ninth embodiment of the invention.
Figure 32:
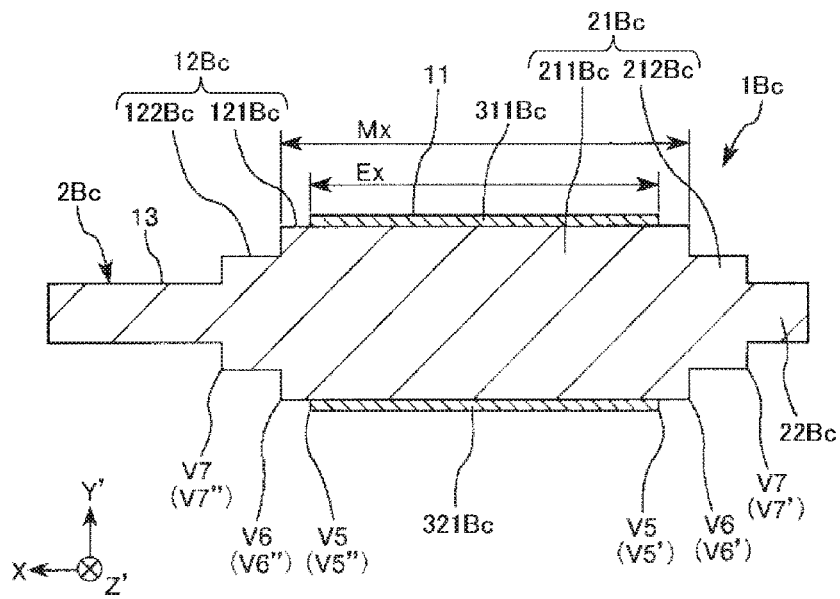
FIG. 32 is a sectional view taken along the line C2-C2 in FIG. 31A.
Figure 33:
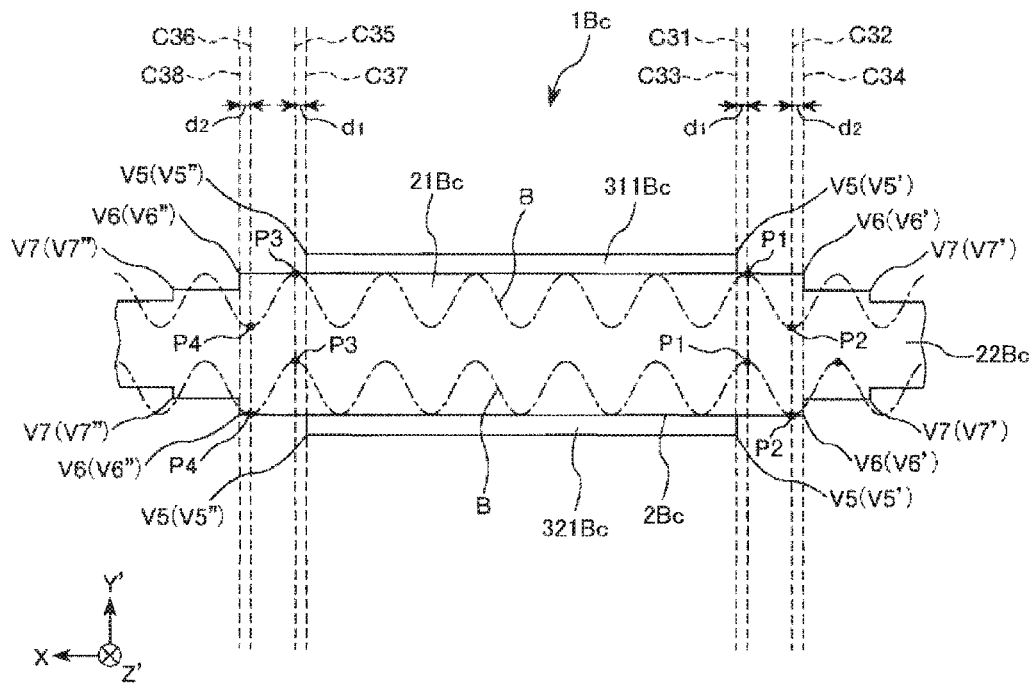
FIG. 33 is a diagram illustrating a positional relationship between a step difference and a waveform of flexural vibration.
Figure 34:
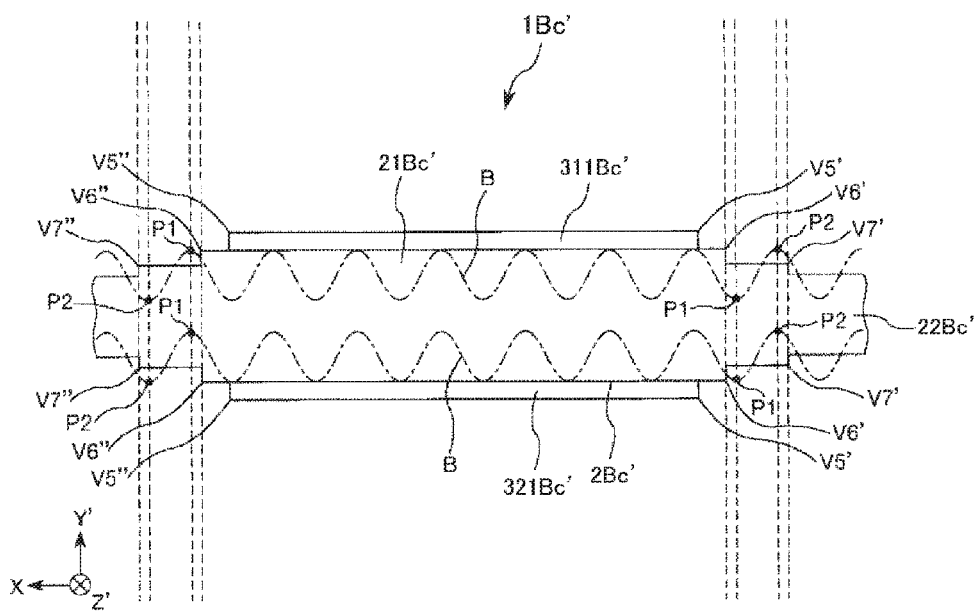
FIG. 34 is a diagram illustrating a positional relationship between a step difference and a waveform of flexural vibration.
Figure 35:
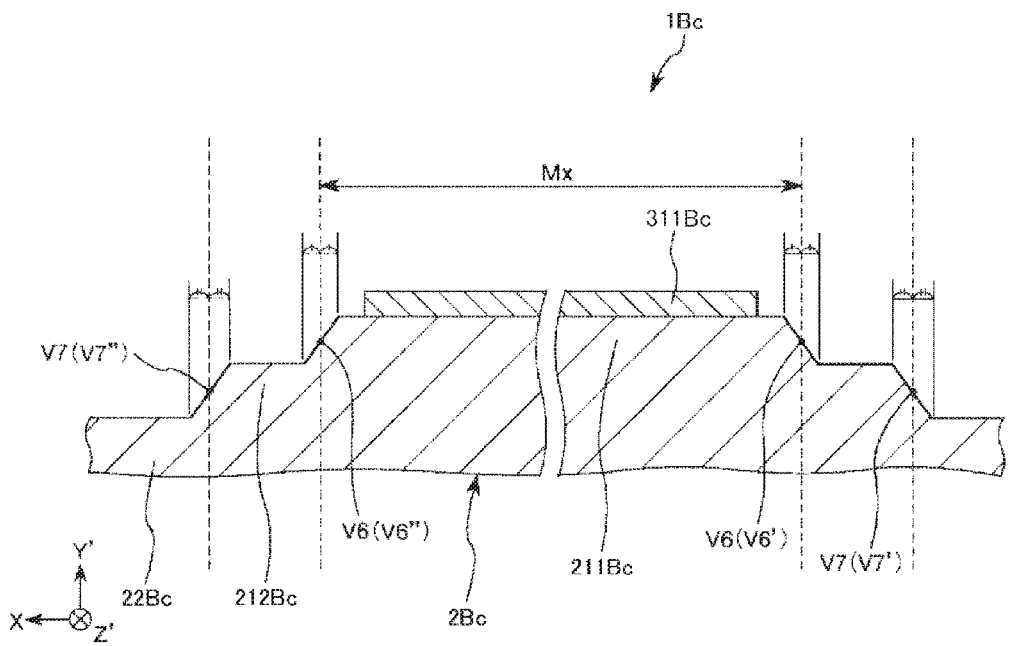
FIG. 35 is a sectional view illustrating a quartz crystal substrate which is formed through wet etching.

FIG. 31A is a top view of a resonator element according to the ninth embodiment of the invention, and FIG. 31B is a bottom view of the resonator element. FIG. 32 is a sectional view taken along the line C2-C2 in FIG. 31A. FIGS. 33 and 34 are diagrams illustrating a positional relationship between a step difference and a waveform of flexural vibration. FIG. 35 is a sectional view illustrating a quartz crystal substrate which is formed through wet etching.

Hereinafter, a description will be made of the resonator element of the ninth embodiment focusing on a difference from the above-described embodiments, and a description of the same content will be omitted.

The resonator element according to the ninth embodiment of the invention is the same as in the seventh embodiment except that a vibration portion is formed in two stages (a so-called "multistage mesa type"). The same constituent elements as in the above-described embodiments are given the same reference numerals.

As illustrated in FIGS. 31A, 31B and 32, a vibration portion 21Bc of a resonator element 1Bc of the present embodiment includes a first region 211Bc which is located at the center and is thick, and a second region 212Bc which is located around the first region 211Bc (both sides in the X axis direction) and is thinner than the first region 211Bc. As mentioned above, the vibration portion 21Bc is formed in multiple stages, and thus it is possible to efficiently confine energy with the vibration portion 21Bc. For this reason, it is possible to exhibit better vibration characteristics.

An excitation electrode 311Bc is disposed on a front surface of the first region 211Bc, and an excitation electrode 321Bc is disposed on a rear surface of the first region 211Bc so as to oppose the excitation electrode 311Bc. A length Ex (a length L1 of a thick section) of the excitation electrodes 311Bc and 321Bc in the X axis direction is smaller than a length Mx (a length L2 of a middle section) of the first region 211Bc in the X axis direction, that is, a relationship of Ex<Mx is satisfied. The excitation electrodes 311Bc and 321Bc are disposed at the center so as not to overlap both ends of the first region 211Bc in the X axis direction.

In the resonator element 1Bc, a portion of the first region 211Bc where the excitation electrodes 311Bc and 321Bc are disposed forms a thick section 11 which is thickest; the first region 211Bc therearound forms a first middle section 121Bc which is thinner than the thick section 11; the second region 212Bc forms a second middle section 122Bc which is thinner than the first middle section 121Bc; and a thin portion 22Bc forms a thin section 13 which is thinner than the second middle section 122Bc. For this reason, in the X axis direction, a step difference (first step difference) V5 is formed at a boundary between the excitation electrodes 311Bc and 321Bc and the first region 211Bc; a step difference (second step difference) V6 is formed at a boundary between the first region 211Bc and the second region 212Bc; and a step difference (third step difference) V7 is formed at a boundary between the second region 212Bc and the thin portion 22Bc.

Hereinafter, the step difference V5 located on the −X axis side is referred to as a step difference V5', and the step difference V5 located on the +X axis side is referred to as a step difference V5". Similarly, the step difference V6 located on the −X axis side is referred to as a step difference V6', and the step difference V6 located on the +X axis side is referred to as a step difference V6", and the step difference V7 located on the −X axis side is referred to as a step difference V7', and the step difference V7 located on the +X axis side is referred to as a step difference V7".

As illustrated in FIG. 33, two adjacent antinodes of flexural vibration which is spurious occurring in the quartz crystal substrate 2Bc are located between the step difference V5' and the step difference V6', and, similarly, two adjacent antinodes of flexural vibration are also located between the step difference V5" and the step difference V6". Specifically, when a virtual straight line which is parallel to the Y' axis through a peak P1 of an expected waveform B of the flexural vibration is indicated by C31; a virtual straight line which is parallel to the Y' axis through a peak P2 which is adjacent to the peak P1 of the waveform B on the −X axis side is indicated by C32; a virtual straight line which is parallel to the Y' axis through the step difference V5' is indicated by C33; and a virtual straight line which is parallel to the Y' axis through the step difference V6' is indicated by C34, the virtual straight lines C31 and C32 are located between the virtual straight lines C33 and C34. Similarly, when a virtual straight line which is parallel to the Y' axis through a peak P3 of the waveform B is indicated by C35; a virtual straight line which is parallel to the Y' axis through a peak P4 which is adjacent to the peak P3 of the waveform B on the +X axis side is indicated by C36; a virtual straight line which is parallel to the Y' axis through the step difference V5" is indicated by C37; and a virtual straight line which is parallel to the Y' axis through the step difference V6" is indicated by C38, the virtual straight lines C35 and C36 are located between the virtual straight lines C37 and C38.

In other words, when a wavelength of the flexural vibration is indicated by λ, a clearance between the virtual straight line C31 and the virtual straight line C33 (a clearance between the virtual straight line C35 and the virtual straight line C37) is set to a distance d1, and a clearance between the virtual straight line C32 and the virtual straight line C34 (a clearance between the virtual straight line C36 and the virtual straight line C38) is set to a distance d2, a relationship of (Mx−Ex)/2=λ/2−d1−d2 is satisfied. As a result, the spurious can be effectively confined between the step differences V5 and V6. For this reason, the spurious can be reduced, and thus a CI value of the resonator element 1Bc is reduced and vibration characteristics are improved.

Particularly, in the present embodiment, the virtual straight lines C31 and C32 are located in a symmetrical manner between the virtual straight lines C33 and C34, and the virtual straight lines C35 and C36 are located in a symmetrical manner between the virtual straight lines C37 and C38. In other words, a relationship of d1=d2 is satisfied. Consequently, it is possible to more effectively reduce the spurious. In addition, it is preferable that d1 and d2 satisfy a relationship of 0<d1≤λ/8 and 0<d2≤λ/8, and also satisfy a relationship of Mx/2=(n/2+1/4)λ−d1−d2 (where n is an integer). Consequently, it is possible to even more effectively reduce the spurious.

As a modification example of the present embodiment, as in a resonator element 1Bc' illustrated in FIG. 34, two adjacent antinodes of flexural vibration which is spurious occurring in the quartz crystal substrate 2Bc' may be located between the step differences V6' and V7', and, similarly, two adjacent antinodes of flexural vibration may also be located between the step differences V6" and V7". In other words, if two antinodes are located between the step differences V5 and V6, or two antinodes are located between the step differences V6 and V7, it is possible to effectively reduce the spurious as described above.

The above description relates to the ninth embodiment. For example, in a case where the quartz crystal substrate 2Bc is formed by patterning a quartz crystal substrate through wet etching, as illustrated in FIG. 35, a crystal surface of the quartz crystal substrate 2Bc appears, and thus a sidewall of each of the first region 211Bc and the second region 212Bc is a tilt surface. The step difference V6 (V6' and V6") in this case is a portion located at the center between a boundary of a main surface and a tilt surface of the first region 211Bc and a boundary of the tilt surface and a main surface of the second region 212Bc. The step difference V7 (V7' and V7") is a portion located at the center between a boundary of the main surface and the tilt surface of the second region 212Bc and a boundary of the tilt surface and a main surface of the thin portion 22Bc. In this case, the length Mx of the first region 211Bc in the X axis direction is a clearance between the step differences V6' and V6".

The ninth embodiment can also exhibit the same effects as the above-described embodiments.

Tenth Embodiment

Next, a description will be made of a resonator element according to a tenth embodiment of the invention.

Figure 36A:
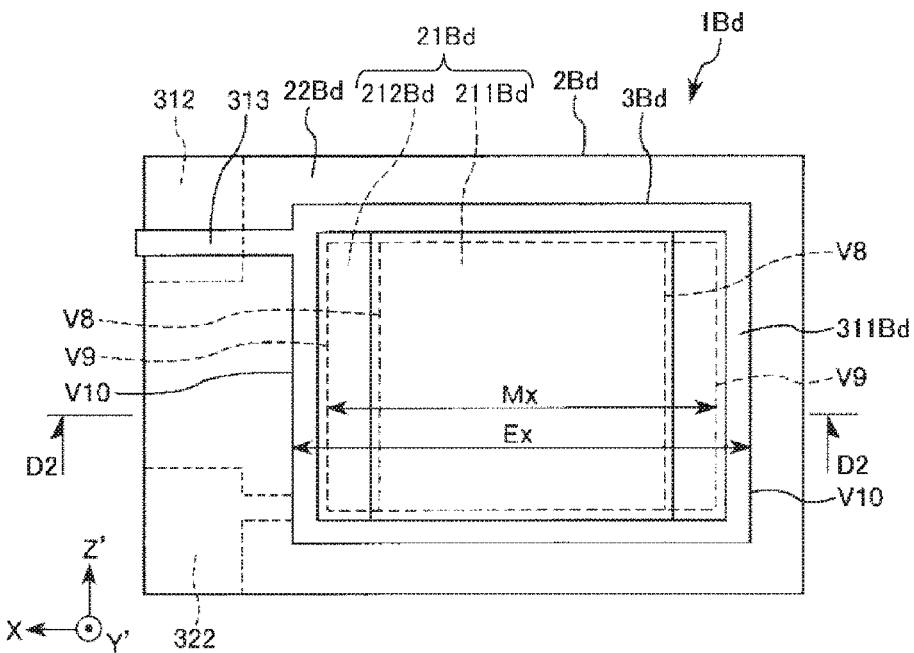
FIG. 36A is a top view of a resonator element according to a tenth embodiment of the invention.
Figure 36B:
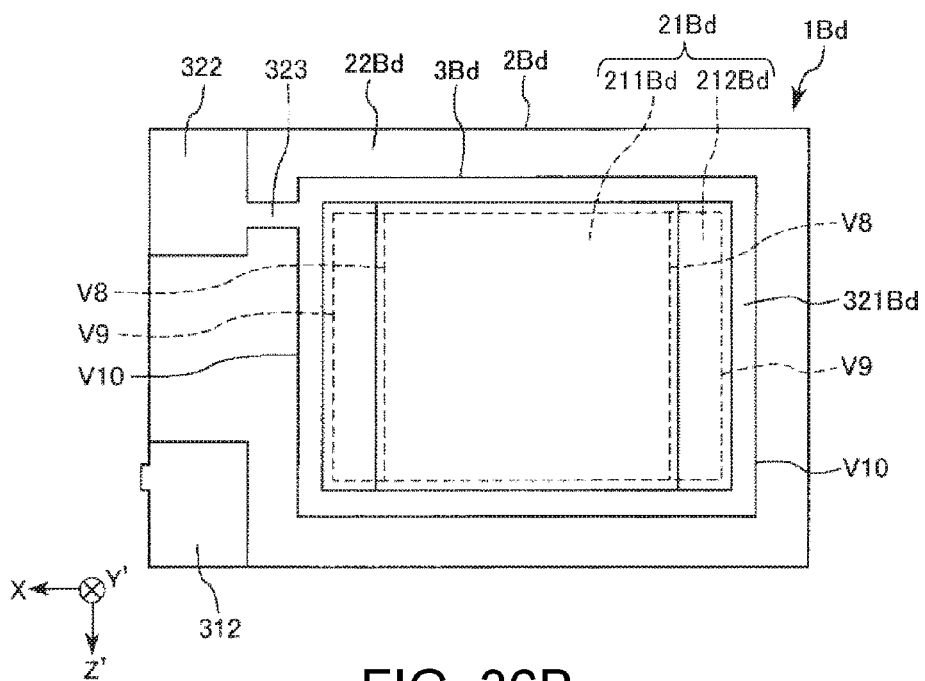
FIG. 36B is a bottom view of the resonator element according to the tenth embodiment of the invention.
Figure 37:
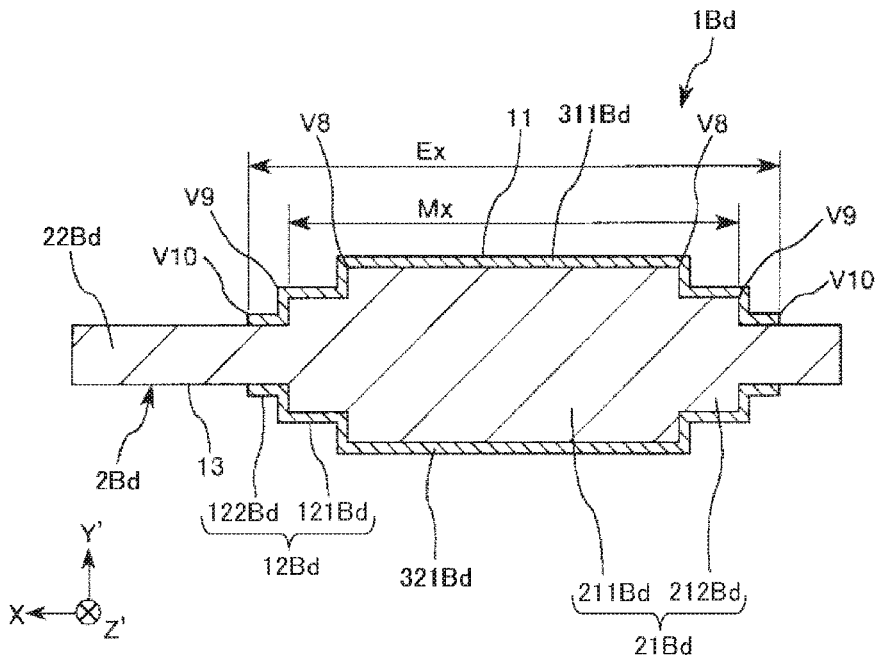
FIG. 37 is a sectional view taken along the line D2-D2 in FIG. 36A.
Figure 38:
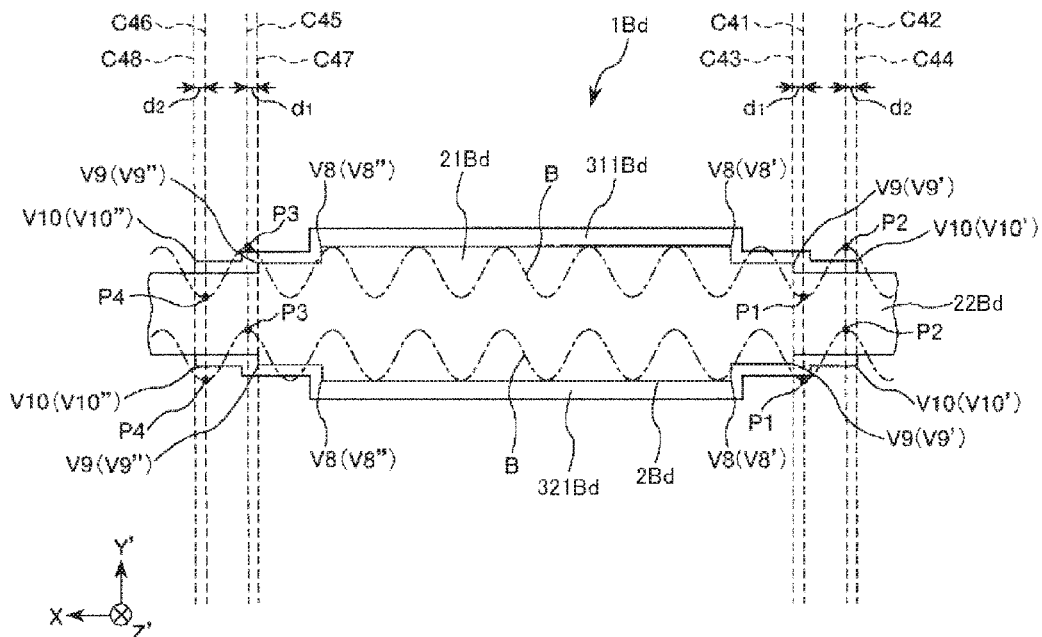
FIG. 38 is a diagram illustrating a positional relationship between a step difference and a waveform of flexural vibration.
Figure 39:
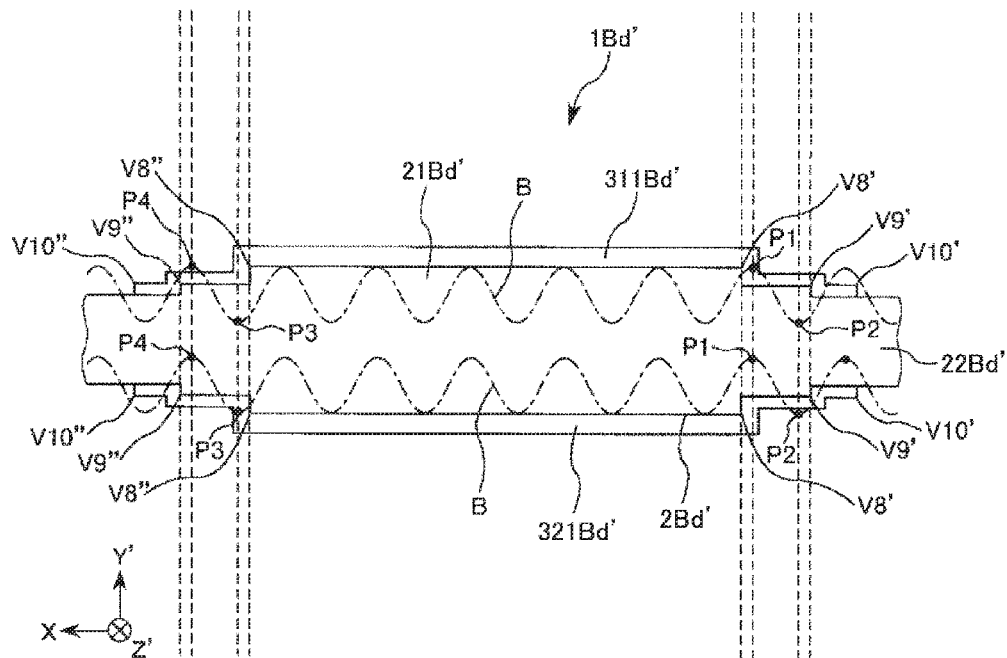
FIG. 39 is a diagram illustrating a positional relationship between a step difference and a waveform of flexural vibration.
Figure 40:
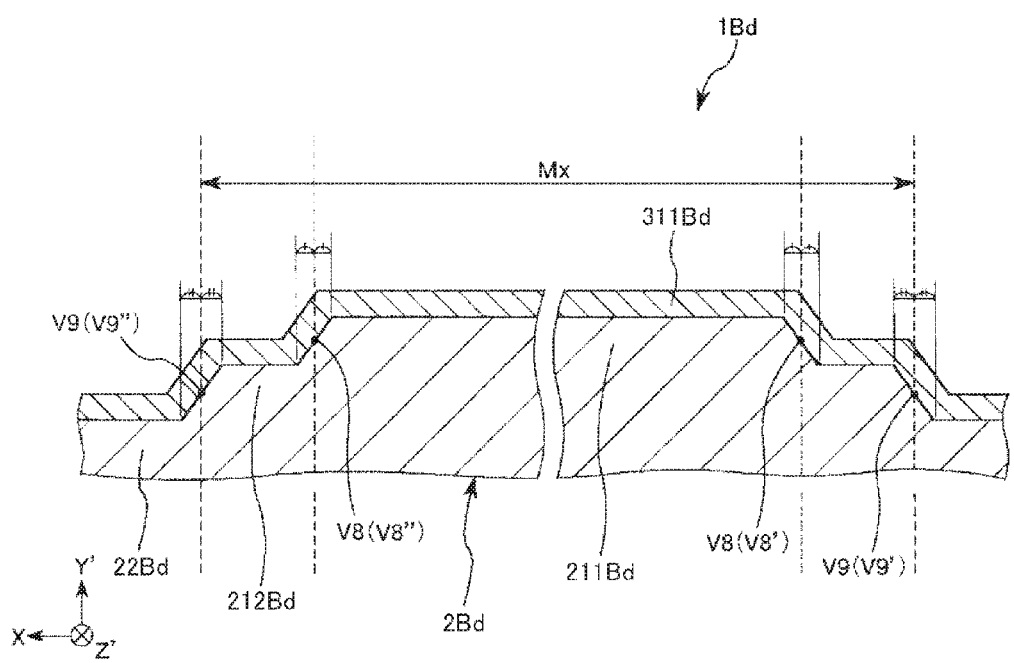
FIG. 40 is a sectional view illustrating a quartz crystal substrate which is formed through wet etching.

FIG. 36A is a top view of a resonator element according to the tenth embodiment of the invention, and FIG. 36B is a bottom view of the resonator element. FIG. 37 is a sectional view taken along the line D2-D2 in FIG. 36A. FIGS. 38 and 39 are diagrams illustrating a positional relationship between a step difference and a waveform of flexural vibration. FIG. 40 is a sectional view illustrating a quartz crystal substrate which is formed through wet etching.

Hereinafter, a description will be made of the resonator element of the tenth embodiment focusing on a difference from the above-described embodiments, and a description of the same content will be omitted.

The resonator element according to the tenth embodiment of the invention is the same as in the eighth embodiment except that a vibration portion is formed in two stages (a so-called "multistage mesa type"). The same constituent elements as in the above-described embodiments are given the same reference numerals.

As illustrated in FIGS. 36A, 36B and 37, a vibration portion 21Bd of a resonator element 1Bd of the present embodiment includes a first region 211Bd which is located at the center and is thick, and a second region 212Bd which is located around the first region 211Bd and is thinner than the first region 211Bd.

A length Ex (a length L2 of a middle section) of excitation electrodes 311Bd and 321Bd in the X axis direction is larger than a length Mx (a length L1 of a thick section) of a vibration portion 21Bd in the X axis direction, that is, a relationship of Ex>Mx is satisfied, and both ends of the excitation electrodes 311Bd and 321Bd in the X axis direction are disposed so as to protrude from the vibration portion 21Bd on a thin portion 22Bd.

In the resonator element 1Bd, the first region 211Bd forms a thick section 11 which is thickest; the second region 212Bd forms a first middle section 121Bd which is thinner than the thick section 11; a portion of the thin portion 22Bd where the excitation electrodes 311Bd and 321Bd are disposed forms a second middle section 122Bd which is thinner than the first middle section 121Bd; and the thin portion 22Bd located therearound forms a thin section 13 which is thinner than the second middle section 122Bd.

For this reason, in the X axis direction, a step difference (first step difference) V8 is formed at a boundary between the first region 211Bd and the second region 212Bd; a step difference (second step difference) V9 is formed at a boundary between the second region 212Bd and the thin portion 22Bd; and a step difference (third step difference) V10 is formed at a boundary between the excitation electrodes 311Bd and 321Bd and the thin portion 22Bd.

Hereinafter, the step difference V8 located on the −X axis side is referred to as a step difference V8', and the step difference V8 located on the +X axis side is referred to as a step difference V8". Similarly, the step difference V9 located on the −X axis side is referred to as a step difference V9', and the step difference V9 located on the +X axis side is referred to as a step difference V9", and the step difference V10 located on the −X axis side is referred to as a step difference V10', and the step difference V10 located on the +X axis side is referred to as a step difference V10".

As illustrated in FIG. 38, two adjacent antinodes of flexural vibration which is spurious occurring in the quartz crystal substrate 2Bd are located between the step difference V9' and the step difference V10', and, similarly, two adjacent antinodes of flexural vibration are also located between the step difference V9" and the step difference V10". Specifically, when a virtual straight line which is parallel to the Y' axis through a peak P1 of an expected waveform B of the flexural vibration is indicated by C41; a virtual straight line which is parallel to the Y' axis through a peak P2 which is adjacent to the peak P1 of the waveform B on the −X axis side is indicated by C42; a virtual straight line which is parallel to the Y' axis through the step difference V9' is indicated by C43; and a virtual straight line which is parallel to the Y' axis through the step difference V10' is indicated by C44, the virtual straight lines C41 and C42 are located between the virtual straight lines C43 and C44. Similarly, when a virtual straight line which is parallel to the Y' axis through a peak P3 of the waveform B is indicated by C45; a virtual straight line which is parallel to the Y' axis through a peak P4 which is adjacent to the peak P3 of the waveform B on the +X axis side is indicated by C46; a virtual straight line which is parallel to the Y' axis through the step difference V9" is indicated by C47; and a virtual straight line which is parallel to the Y' axis through the step difference V10" is indicated by C48, the virtual straight lines C45 and C46 are located between the virtual straight lines C47 and C48.

In other words, when a wavelength of the flexural vibration is indicated by λ, a clearance between the virtual straight line C41 and the virtual straight line C43 (a clearance between the virtual straight line C45 and the virtual straight line C47) is set to a distance d1, and a clearance between the virtual straight line C42 and the virtual straight line C44 (a clearance between the virtual straight line C46 and the virtual straight line C48) is set to a distance d2, a relationship of $(Ex-Mx)/2=\lambda/2-d1-d2$ is satisfied. As a result, the unwanted vibration can be effectively confined between the step differences V9 and V10. For this reason, the spurious can be reduced, and thus a CI value of the resonator element 1Bd is reduced and vibration characteristics are improved.

Particularly, in the present embodiment, the virtual straight lines C41 and C42 are located in a symmetrical manner between the virtual straight lines C43 and C44, and the virtual straight lines C45 and C46 are located in a symmetrical manner between the virtual straight lines C47 and C48. In other words, a relationship of d1=d2 is satisfied. Consequently, it is possible to more effectively reduce the spurious. In addition, it is preferable that d1 and d2 satisfy a relationship of $0<d1\leq\lambda/8$ and $0<d2\leq\lambda/8$, and also satisfy a relationship of $Mx/2=(n/2+1/4)\lambda-d1-d2$ (where n is an integer). Consequently, it is possible to even more effectively reduce the spurious.

As a modification example of the present embodiment, as in a resonator element 1Bd' illustrated in FIG. 39, two adjacent antinodes of flexural vibration which is spurious occurring in the quartz crystal substrate 2Bd' may be located between the step differences V8' and V9', and, similarly, two adjacent antinodes of flexural vibration may also be located between the step differences V8" and V9". In other words, if two antinodes are located between the step differences V9 and V10, or two antinodes are located between the step differences V8 and V9, it is possible to effectively reduce the spurious as described above.

The above description relates to the tenth embodiment. For example, in a case where the quartz crystal substrate 2Bd is formed by patterning a quartz crystal substrate through wet etching, as illustrated in FIG. 40, a crystal surface of the quartz crystal substrate 2Bd appears, and thus a sidewall of each of the first region 211Bd and the second region 212Bd is a tilt surface. The step difference V8 (V8' and V8") in this case is a portion located at the center between a boundary of a main surface and a tilt surface of the first region 211Bd and a boundary of the tilt surface and a main surface of the second region 212Bd. The step difference V9 (V9' and V9") is a portion located at the center between a boundary of the main surface and the tilt surface of the second region 212Bd and a boundary of the tilt surface and a main surface of the thin portion 22Bd. In this case, the length Mx of the vibration portion 21Bd in the X axis direction is a clearance between the step differences V9' and V9".

The tenth embodiment can also exhibit the same effects as the above-described embodiments.

Eleventh Embodiment

Next, a description will be made of a resonator element according to an eleventh embodiment of the invention.

Figure 41A:
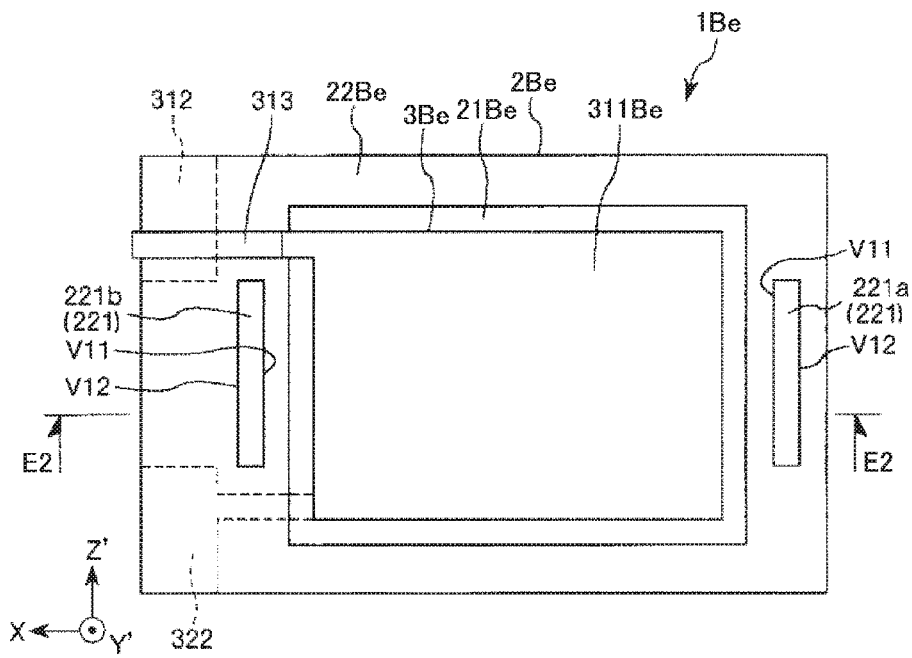
FIG. 41A is a top view of a resonator element according to an eleventh embodiment of the invention.
Figure 41B:
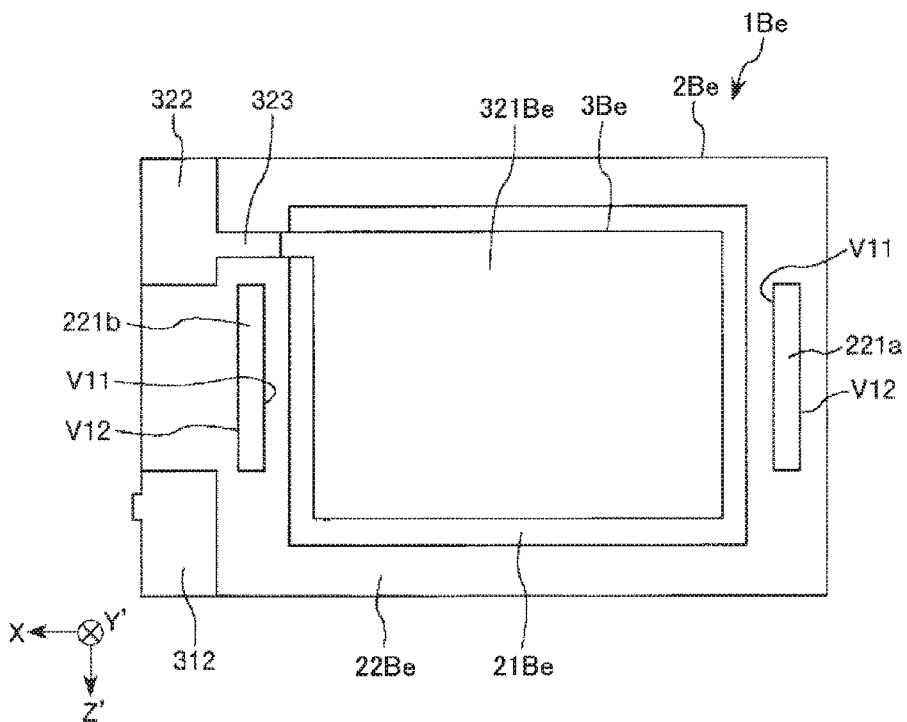
FIG. 41B is a bottom view of the resonator element according to the eleventh embodiment of the invention.
Figure 42:
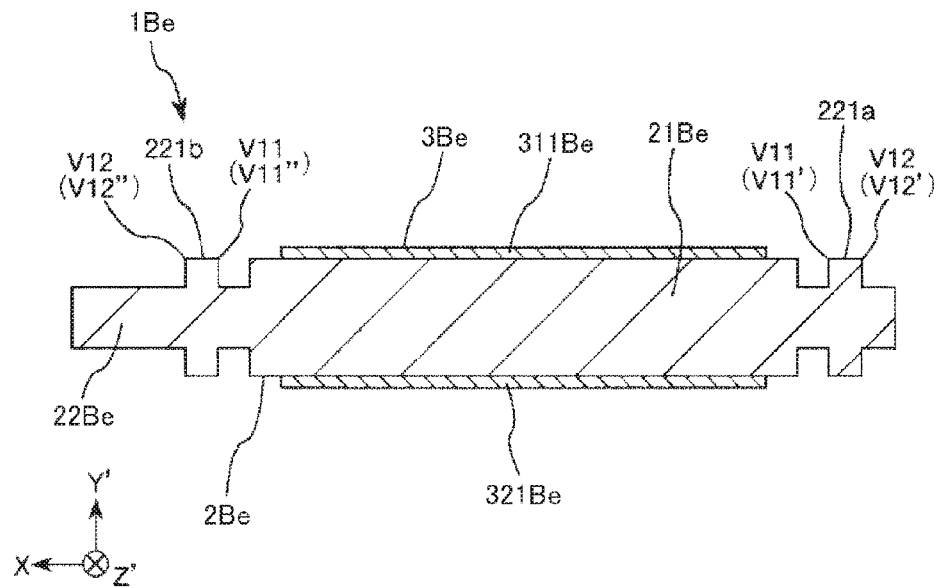
FIG. 42 is a sectional view taken along the line E2-E2 in FIG. 41A.
Figure 43:
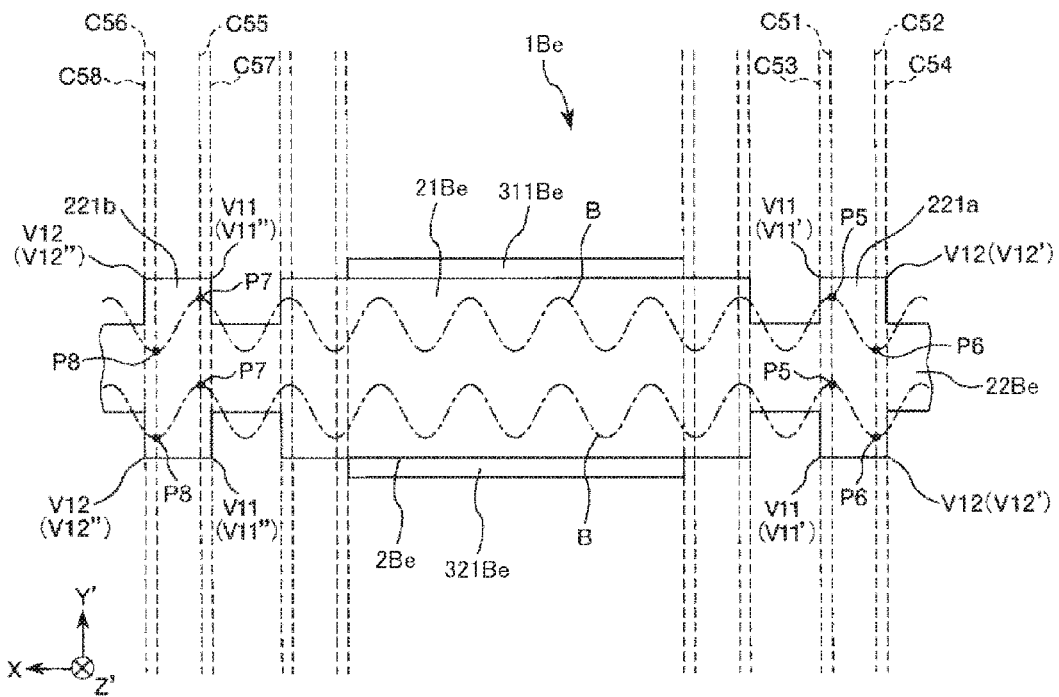
FIG. 43 is a diagram illustrating a positional relationship between a step difference and a waveform of flexural vibration.

FIG. 41A is a top view of a resonator element according to the eleventh embodiment of the invention, and FIG. 41B is a bottom view of the resonator element. FIG. 42 is a sectional view taken along the line E2-E2 in FIG. 41A. FIG. 43 is a diagram illustrating a positional relationship between a step difference and a waveform of flexural vibration.

Hereinafter, a description will be made of the resonator element of the eleventh embodiment focusing on a difference from the above-described embodiments, and a description of the same content will be omitted.

The resonator element according to the eleventh embodiment of the invention is the same as in the seventh embodiment except that a protrusion is disposed at a thin portion. The same constituent elements as in the above-described embodiments are given the same reference numerals.

As illustrated in FIGS. 41A, 41B and 42, a protrusion 221 is provided at a thin portion 22Be of a resonator element 1Be of the present embodiment. The protrusion 221 includes, in a plan view, a first protrusion 221a which is separated from a vibration portion 21Be toward the −X axis side and extends in the Z' axis direction (a direction along an outer edge intersecting the vibration direction (X axis direction) of the thickness shear vibration of the vibration portion 21Be), and a second protrusion 221b which is separated from the vibration portion 21Be toward the +X axis side and extends in the Z' axis direction. In the present embodiment, the first protrusion 221a and the second protrusion 221b (the first and second protrusions 221a and 221b) are integrally formed with the thin portion 22Be, but the first and second protrusions 221a and 221b may be disposed, for example, by depositing a separate material such as $SiO_2$ on a surface of the thin portion 22Be. The first and second protrusions 221a and 221b may be integrally formed, for example, by a frame-shaped portion which is disposed so as to surround the periphery of the vibration portion 21Be.

In the resonator element 1Be, step differences V11 and V12 are formed at boundaries between the protrusion 221 and the thin portion 22Be in the X axis direction. Hereinafter, the step difference V11 located on the +X axis side of the first protrusion 221a is referred to as a step difference V11', and the step difference V11 located on the −X axis side of the second protrusion 221b is referred to as a step difference V11". Similarly, the step difference V12 located on the −X axis side of the first protrusion 221a is referred to as a step difference V12', and the step difference V12 located on the +X axis side of the second protrusion 221b is referred to as a step difference V12".

As illustrated in FIG. 43, two adjacent antinodes of flexural vibration which is spurious occurring in the quartz crystal substrate 2Be are located between the step difference V11' and the step difference V12', and, similarly, two adjacent antinodes of flexural vibration are also located between the step difference V11" and the step difference V12". Specifically, when a virtual straight line which is parallel to the Y' axis through a peak P5 of an expected waveform B of the flexural vibration is indicated by C51; a virtual straight line which is parallel to the Y' axis through a peak P6 which is adjacent to the peak P5 of the waveform B on the −X axis side is indicated by C52; a virtual straight line which is parallel to the Y' axis through the step difference V11' is indicated by C53; and a virtual straight line which is parallel to the Y' axis through the step difference V12' is indicated by C54, the virtual straight lines C51 and C52 are located between the virtual straight lines C53 and C54. Similarly, when a virtual straight line which is parallel to the Y' axis through a peak P7 of the waveform B is indicated by C55; a virtual straight line which is parallel to the Y' axis through a peak P8 which is adjacent to the peak P7 of the waveform B on the +X axis side is indicated by C56; a virtual straight line which is parallel to the Y' axis through the step difference V11" is indicated by C57; and a virtual straight line which is parallel to the Y' axis through the step difference V12" is indicated by C58, the virtual straight lines C55 and C56 are located between the virtual straight lines C57 and C58. As a result, the resonator element 1Be can more effectively minimize a flexural vibration component and can thus more effectively reduce the spurious.

The eleventh embodiment can also exhibit the same effects as the above-described embodiments.

Twelfth Embodiment

Next, a description will be made of a resonator element according to a twelfth embodiment of the invention.

Figure 44A:
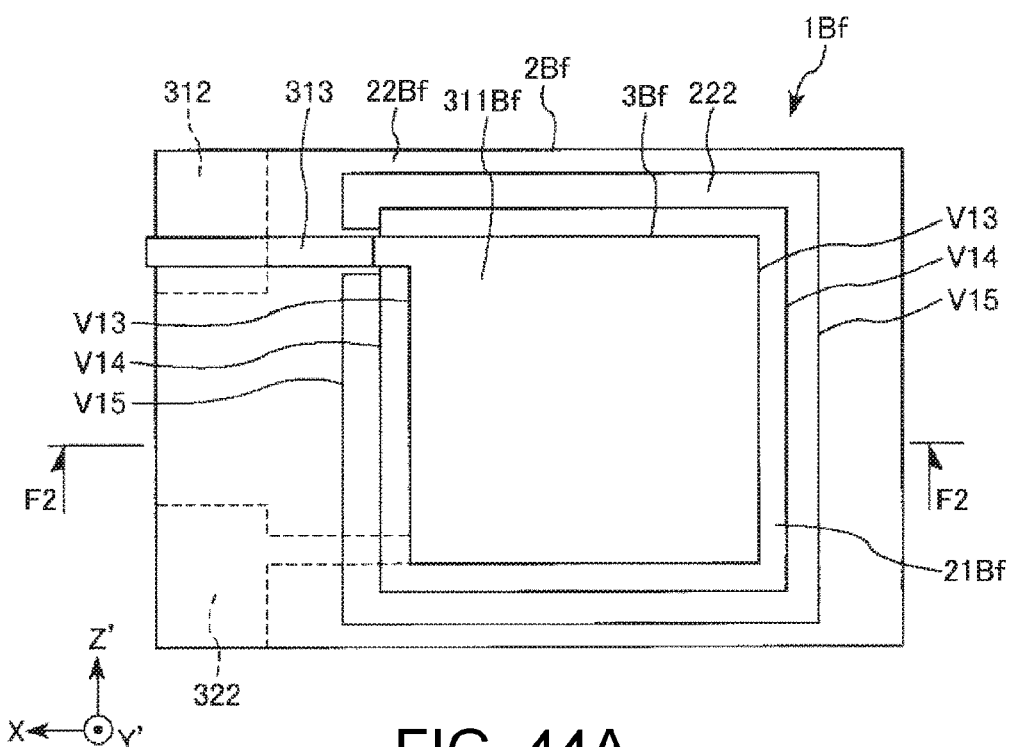
FIG. 44A is a top view of a resonator element according to a twelfth embodiment of the invention.
Figure 44B:
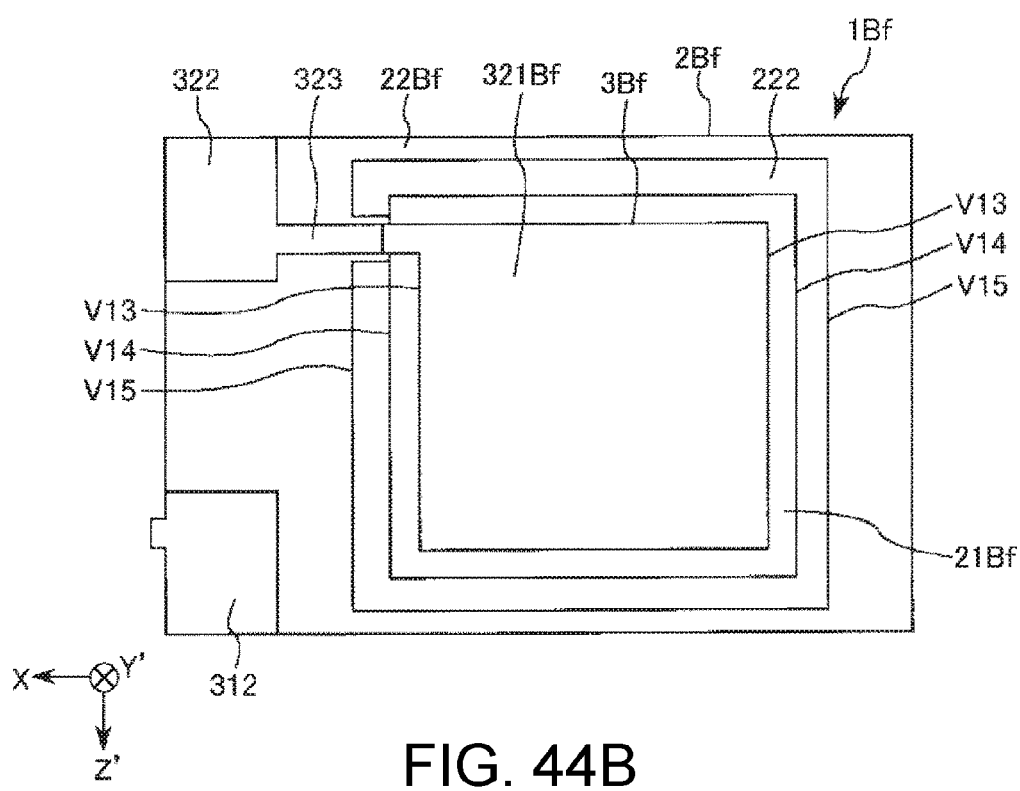
FIG. 44B is a bottom view of the resonator element according to the twelfth embodiment of the invention.
Figure 45:
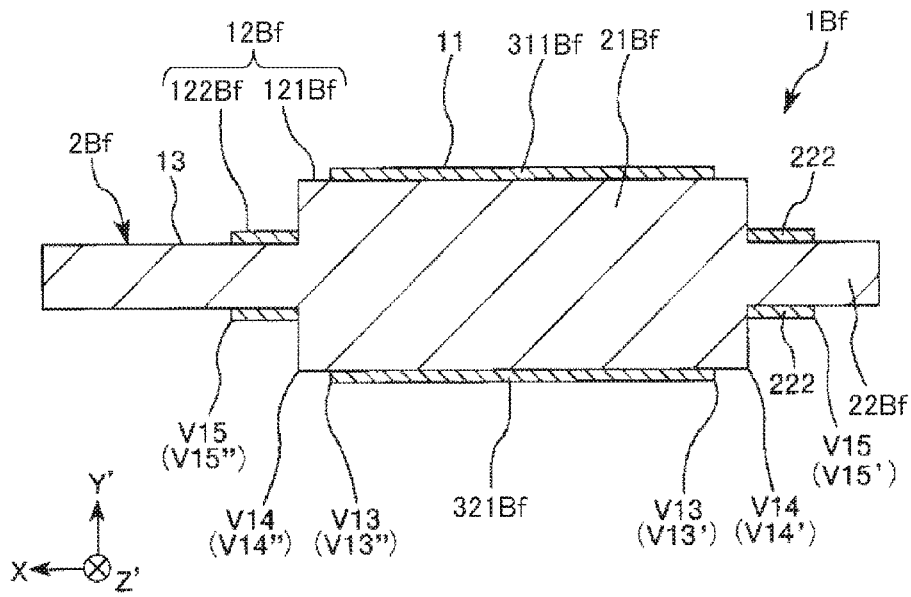
FIG. 45 is a sectional view taken along the line F2-F2 in FIG. 44A.
Figure 46:
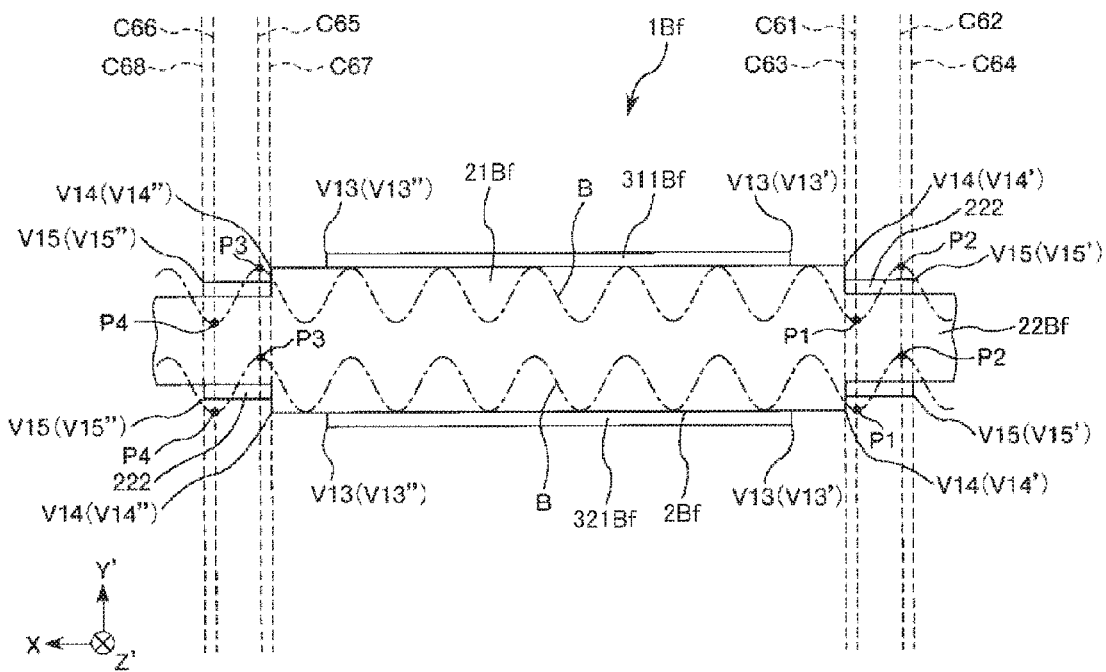
FIG. 46 is a diagram illustrating a positional relationship between a step difference and a waveform of flexural vibration.

FIG. 44A is a top view of a resonator element according to the twelfth embodiment of the invention, and FIG. 44B is a bottom view of the resonator element. FIG. 45 is a sectional view taken along the line F2-F2 in FIG. 44A. FIG. 46 is a diagram illustrating a positional relationship between a step difference and a waveform of flexural vibration.

Hereinafter, a description will be made of the resonator element of the twelfth embodiment focusing on a difference from the above-described embodiments, and a description of the same content will be omitted.

The resonator element according to the twelfth embodiment of the invention is the same as in the seventh embodiment except that a protrusion is disposed at a thin portion. The same constituent elements as in the above-described embodiments are given the same reference numerals.

As illustrated in FIGS. 44A, 44B and 45, a protrusion 222 is provided at a thin portion 22Bf of a resonator element 1Bf of the present embodiment. The protrusion 222 has a frame shape which is in contact with an outer circumference of a vibration portion 21Bf and surrounds the vibration portion 21Bf in a plan view. However, the protrusion 222 is not formed at portions which overlap the extraction electrodes 313 and 323. The protrusion 222 is made of, for example, the same material as that of an electrode 3Bf and is thus formed along with the electrode 3Bf. However, a material forming the protrusion 222 is not limited thereto, and, for example, $SiO_2$ may be used.

In the resonator element 1Bf, a portion of the vibration portion 21Bf where excitation electrodes 311Bf and 321Bf are disposed forms a thick section 11 which is thickest; the vibration portion 21Bf therearound forms a first middle section 121Bf which is thinner than the thick section 11; a portion of a thin portion 22Bf where the protrusion 222 is disposed forms a second middle section 122Bf which is thinner than the first middle section 121Bf; and the thin portion 22Bf forms a thin section 13 which is thinner than the second middle section 122Bf.

For this reason, in the X axis direction, a step difference (first step difference) V13 is formed at a boundary between the excitation electrodes 311Bf and 321Bf and the vibration portion 21Bf; a step difference (second step difference) V14 is formed at a boundary between the vibration portion 21Bf and the protrusion 222; and a step difference (third step difference) V15 is formed at a boundary between the protrusion 222 and the thin portion 22Bf.

Hereinafter, the step difference V13 located on the −X axis side is referred to as a step difference V13', and the step difference V13 located on the +X axis side is referred to as a step difference V13". Similarly, the step difference V14 located on the −X axis side is referred to as a step difference V14', and the step difference V14 located on the +X axis side is referred to as a step difference V14", and the step difference V15 located on the −X axis side is referred to as a step difference V15', and the step difference V15 located on the +X axis side is referred to as a step difference V15".

As illustrated in FIG. 46, two adjacent antinodes of flexural vibration which is spurious occurring in the quartz crystal substrate 2Bf are located between the step difference V14' and the step difference V15', and, similarly, two adjacent antinodes of flexural vibration are also located between the step difference V14" and the step difference V15". Specifically, when a virtual straight line which is parallel to the Y' axis through a peak P1 of an expected waveform B of the flexural vibration is indicated by C61; a virtual straight line which is parallel to the Y' axis through a peak P2 which is adjacent to the peak P1 of the waveform B on the −X axis side is indicated by C62; a virtual straight line which is parallel to the Y' axis through the step difference V14' is indicated by C63; and a virtual straight line which is parallel to the Y' axis through the step difference V15' is indicated by C64, the virtual straight lines C61 and C62 are located between the virtual straight lines C63 and C64. Similarly, when a virtual straight line which is parallel to the Y' axis through a peak P3 of the waveform B is indicated by C65; a virtual straight line which is parallel to the Y' axis through a peak P4 which is adjacent to the peak P3 of the waveform B on the +X axis side is indicated by C66; a virtual straight line which is parallel to the Y' axis through the step difference V14" is indicated by C67; and a virtual straight line which is parallel to the Y' axis through the step difference V15" is indicated by C68, the virtual straight lines C65 and C66 are located between the virtual straight lines C67 and C68.

As a result, the unwanted vibration can be effectively confined between the step differences V14 and V15. For this reason, the spurious can be reduced, and thus a CI value of the resonator element 1Bf is reduced and vibration characteristics are improved.

The twelfth embodiment can also exhibit the same effects as the above-described embodiments.

Thirteenth Embodiment

Figure 47A:
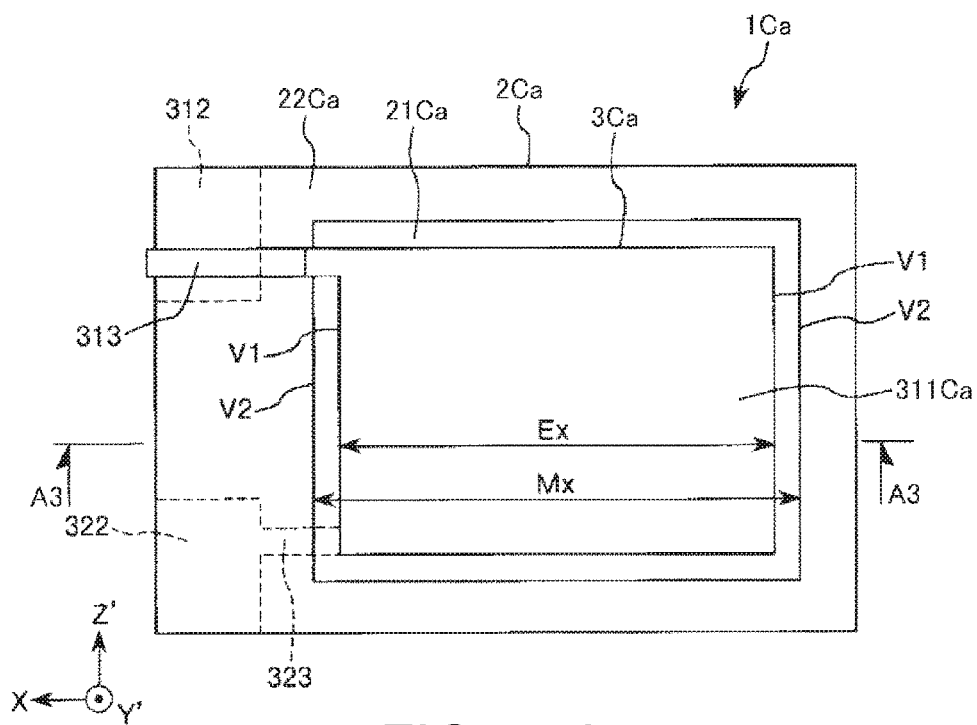
FIG. 47A is a top view of a resonator element according to a thirteenth embodiment of the invention.
Figure 47B:
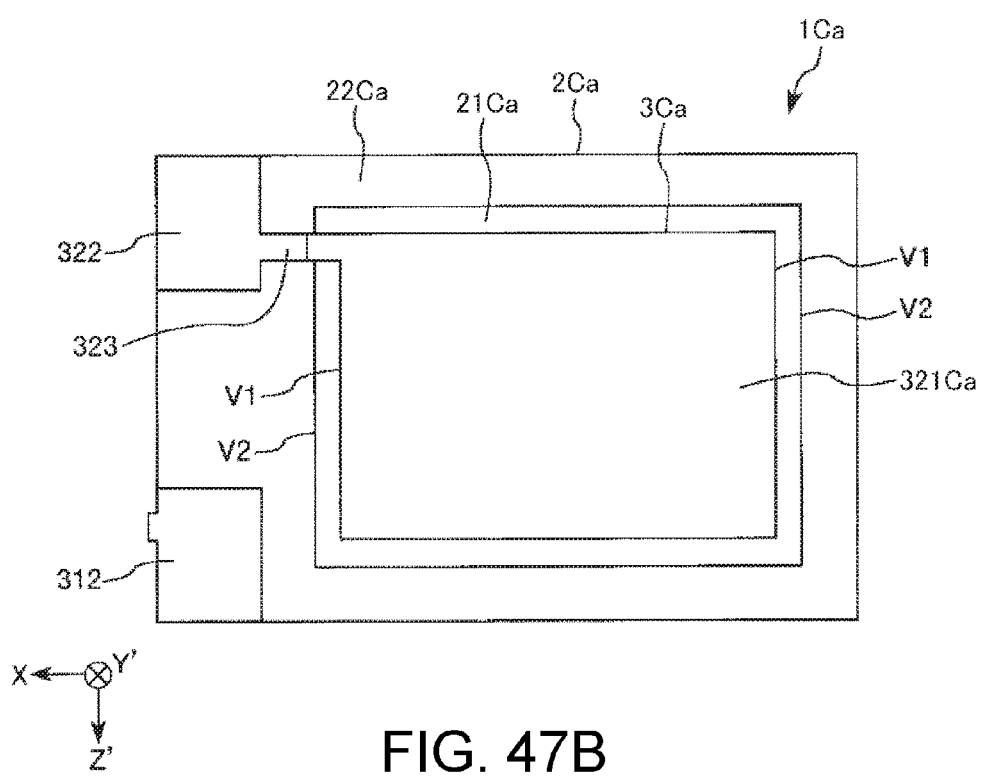
FIG. 47B is a bottom view of the resonator element according to the thirteenth embodiment of the invention.
Figure 48:
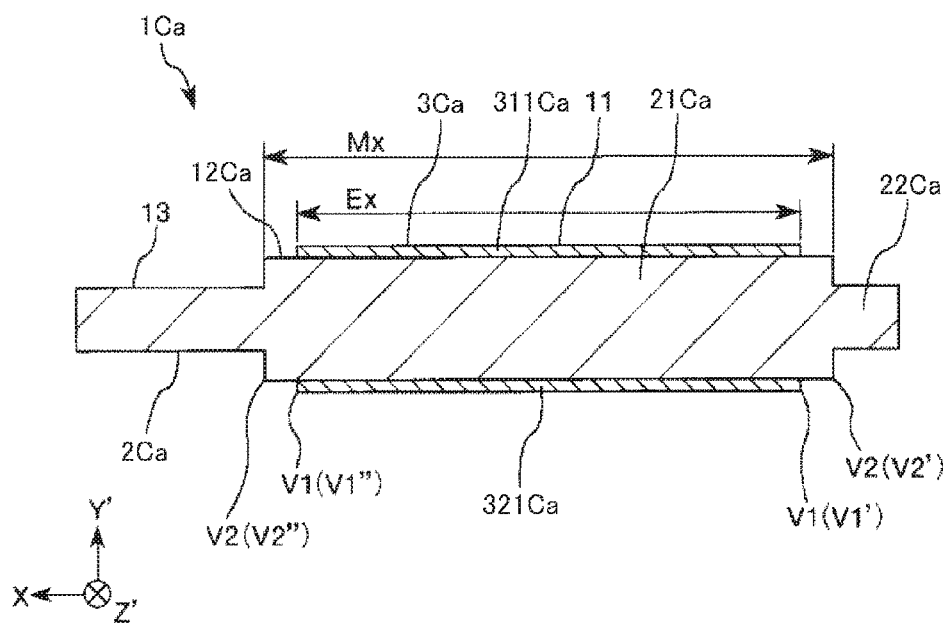
FIG. 48 is a sectional view taken along the line A3-A3 in FIG. 47A.
Figure 49:
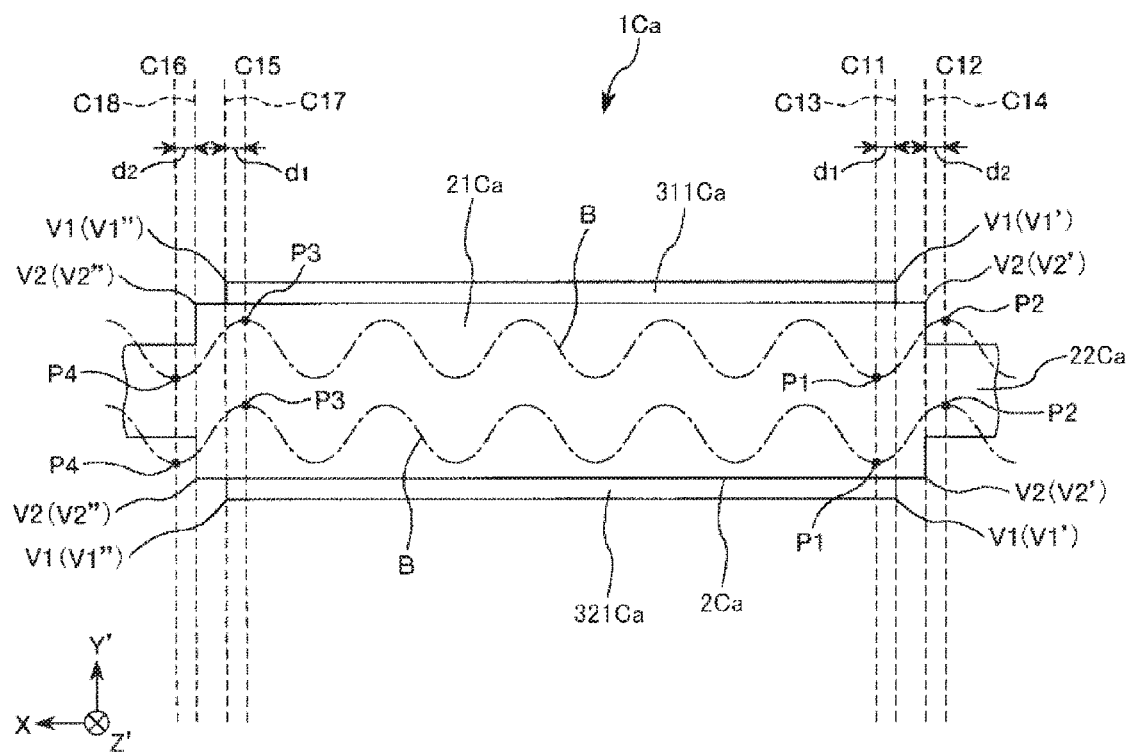
FIG. 49 is a diagram illustrating a positional relationship between a step difference and a waveform of flexural vibration.
Figure 50:
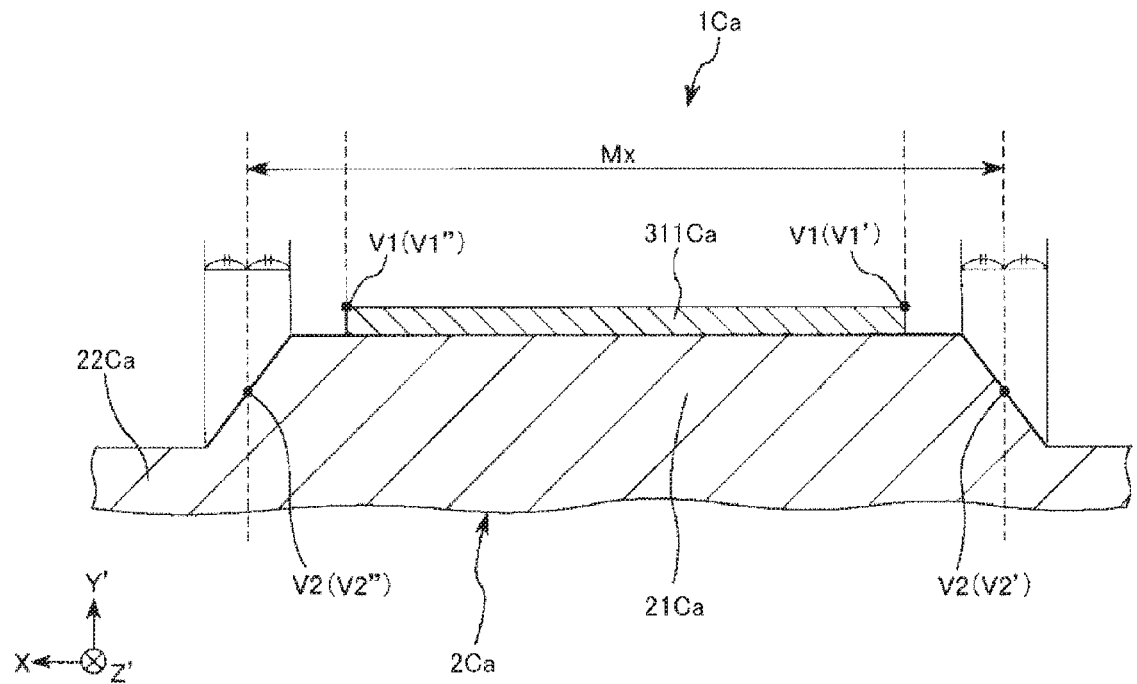
FIG. 50 is a sectional view illustrating a quartz crystal substrate which is formed through wet etching.

FIG. 47A is a top view of a resonator element according to a thirteenth embodiment of the invention, and FIG. 47B is a bottom view of the resonator element. FIG. 48 is a sectional view taken along the line A3-A3 in FIG. 47A. FIG. 49 is a diagram illustrating a positional relationship between a step difference and a waveform of flexural vibration. FIG. 50 is a sectional view illustrating a quartz crystal substrate which is formed through wet etching.

As illustrated in FIGS. 47A, 47B and 48, a resonator element 1Ca includes a quartz crystal substrate (piezoelectric substrate) 2Ca, and an electrode 3Ca formed on the quartz crystal substrate 2Ca.
Quartz Crystal Substrate The quartz crystal substrate is the same as the quartz crystal substrate described in the first embodiment, and description thereof will be omitted.

As illustrated in FIGS. 47A, 47B and 48, the quartz crystal substrate 2Ca includes a vibration portion 21Ca which performs thickness shear vibration, and a thin portion 22Ca which is located around the vibration portion 21Ca so as to be integrally formed with the vibration portion 21Ca and is thinner than the vibration portion 21Ca. The vibration portion 21Ca protrudes toward both of +Y' axis side and −Y' axis side of the thin portion 22Ca. However, the vibration portion 21Ca may protrude toward at least one of +Y' axis side and −Y' axis side.

The quartz crystal substrate 2Ca may have undergone, for example, bevel machining for grinding the periphery of the quartz crystal substrate 2Ca, or convex machining for forming an upper surface and a lower surface as convex surfaces. The four corners of the vibration portion 21Ca may be rounded.

The electrode 3Ca includes a pair of excitation electrodes 311Ca and 321Ca, a pair of pad electrodes 312 and 322, and a pair of extraction electrodes 313 and 323. The excitation electrode 311Ca is disposed on a front surface of the vibration portion 21Ca, and the excitation electrode 321Ca is disposed on a rear surface of the vibration portion 21Ca so as to oppose the excitation electrode 311Ca. A length Ex (a length L1 of a thick section) of the excitation electrodes 311Ca and 321Ca in the X axis direction is smaller than a length Mx (a length L2 of a middle section) of the vibration portion 21Ca in the X axis direction, that is, a relationship of Ex<Mx is satisfied. The excitation electrodes 311Ca and 321Ca are disposed at the center so as not to overlap both ends of the vibration portion 21Ca in the X axis direction.

The pad electrodes 312 and 322 are arranged in the Z' axis direction on a lower surface of the thin portion 22Ca located at ends of the quartz crystal substrate 2Ca on the +X axis side. The extraction electrode 313 is disposed so as to connect the excitation electrode 311Ca and the pad electrode 312 to each other, and the extraction electrode 323 is disposed so as to connect the excitation electrode 321Ca and the pad electrode 322 to each other.

A configuration of the electrodes is the same as in the first embodiment, and thus description thereof will be omitted.

The above description relates to the configuration of the resonator element 1Ca. In the resonator element 1Ca, as illustrated in FIG. 48, a portion of the vibration portion 21Ca where the excitation electrodes 311Ca and 321Ca are provided forms a thick section 11 which is thickest; the vibration portion 21Ca located therearound forms a middle section 12Ca which is thinner than the thick section 11; and the thin portion 22Ca located to surround the vibration portion 21Ca forms a thin section 13 which is thinner than the middle section 12Ca. For this reason, in the resonator element 1Ca, a step difference (first step difference) V1 is formed at a boundary between the vibration portion 21Ca and the excitation electrodes 311Ca and 321Ca, and a step difference (second step difference) V2 is formed at a boundary between the vibration portion 21Ca and the thin portion 22Ca, in the X axis direction. Hereinafter, the step difference V1 located on the −X axis side is referred to as a step difference V1', and the step difference V1 located on the +X axis side is referred to as a step difference V1". Similarly, the step difference V2 located on the −X axis side is referred to as a step difference V2', and the step difference V2 located on the +X axis side is referred to as a step difference V2".

As illustrated in FIG. 49, both of the step differences V1' and V2' are located between adjacent antinodes (maximum amplitude positions) of flexural vibration which is spurious (unwanted vibration) occurring in the quartz crystal substrate 2Ca, and, similarly, both of the step differences V1" and V2" are located between adjacent antinodes (maximum amplitude positions) of flexural vibration. Specifically, when a virtual straight line which is parallel to the Y' axis through a peak (maximum amplitude point) P1 of an expected waveform B of the flexural vibration is indicated by C11; a virtual straight line which is parallel to the Y' axis through a peak P2 which is adjacent to the peak P1 of the waveform B on the −X axis side is indicated by C12; a virtual straight line which is parallel to the Y' axis through the step difference V1' is indicated by C13; and a virtual straight line which is parallel to the Y' axis through the step difference V2' is indicated by C14, both of the virtual straight lines C13 and C14 are located between the virtual straight lines C11 and C12. Similarly, when a virtual straight line which is parallel to the Y' axis through a peak P3 of the waveform B is indicated by C15; a virtual straight line which is parallel to the Y' axis through a peak P4 which is adjacent to the peak P3 of the waveform B on the +X axis side is indicated by C16; a virtual straight line which is parallel to the Y' axis through the step difference V1" is indicated by C17; and a virtual straight line which is parallel to the Y' axis through the step difference V2" is indicated by C18, both of the virtual straight lines C17 and C18 are located between the virtual straight lines C15 and C16. In other words, when a wavelength of the flexural vibration is indicated by λ, a clearance between the virtual straight line C11 and the virtual straight line C13 (a clearance between the virtual straight line C15 and the virtual straight line C17) is set to a distance d1, and a clearance between the virtual straight line C12 and the virtual straight line C14 (a clearance between the virtual straight line C16 and the virtual straight line C18) is set to a distance d2, a relationship of (Mx−Ex)/2=λ/2+d1+d2 is satisfied. As a result, the spurious can be effectively confined between the step differences V1' and V2' (V1" and V2"). For this reason, the spurious (unwanted vibration) can be reduced, and thus a CI value of the resonator element 1Ca is reduced and vibration characteristics are improved.

Particularly, in the present embodiment, the virtual straight lines C13 and C14 are located in a symmetrical manner between the virtual straight lines C11 and C12, and the virtual straight lines C17 and C18 are located in a symmetrical manner between the virtual straight lines C15 and C16. In other words, a relationship of d1=d2 is satisfied. Consequently, it is possible to more effectively confine the spurious and thus to reduce the spurious. In addition, it is preferable that d1 and d2 satisfy a relationship of 0≤d1≤λ/8 and 0≤d2≤λ/8, and also satisfy a relationship of Mx/2=(n/2+1/4)λ+d1+d2 (where n is an integer). Consequently, it is possible to even more effectively reduce the spurious. The wavelength λ of the flexural vibration can be obtained according to an equation such as λ/2=(1.332/f)−0.0024 by using a resonance frequency f of the resonator element 1Ca.

The above description relates to the thirteenth embodiment. For example, in a case where the quartz crystal substrate 2Ca is formed by patterning a quartz crystal substrate through wet etching, as illustrated in FIG. 50, a crystal surface of the quartz crystal substrate 2Ca appears, and thus a sidewall of the vibration portion 21Ca is a tilt surface. The step difference V2 (V2' and V2") in this case is a portion located at the center between a boundary of a main surface and a tilt surface of the vibration portion 21Ca and a boundary of the tilt surface and a main surface of the thin portion 22Ca. The length Mx of the vibration portion 21Ca in the X axis direction is a clearance between the step differences V2' and V2".

Fourteenth Embodiment

Next, a description will be made of a resonator element according to a fourteenth embodiment of the invention.

Figure 51A:
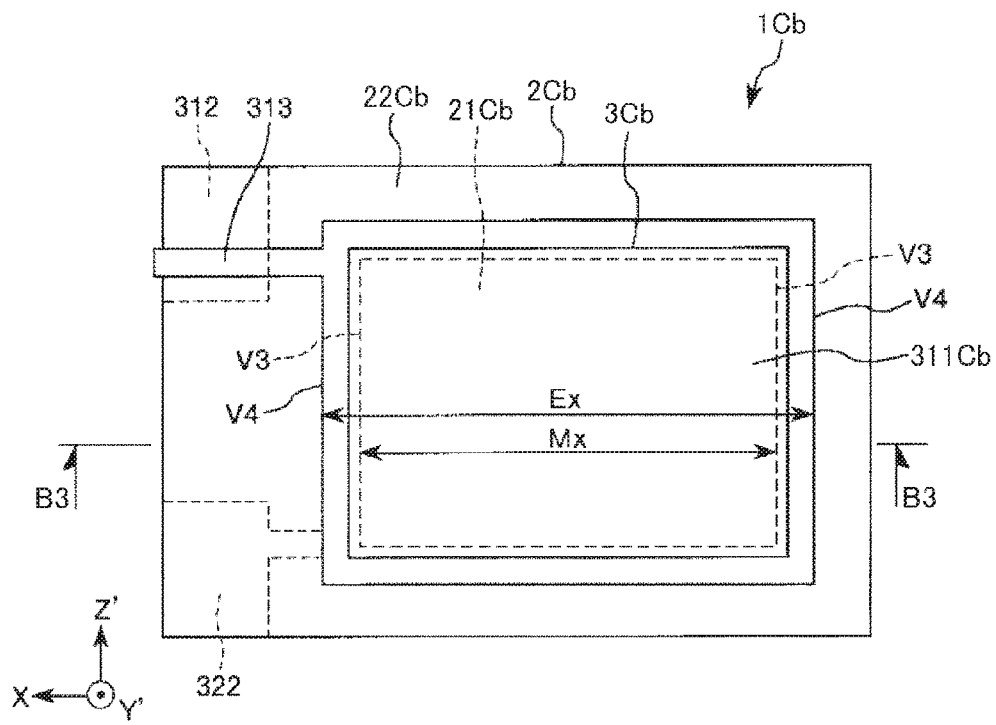
FIG. 51A is a top view of a resonator element according to a fourteenth embodiment of the invention.
Figure 51B:
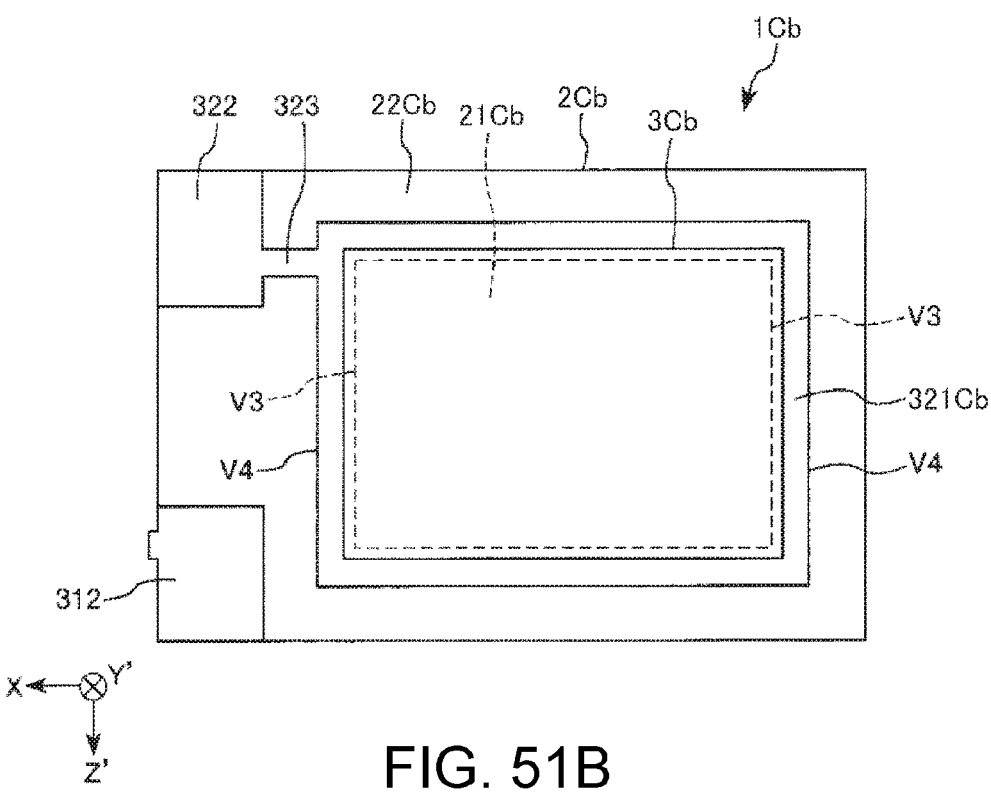
FIG. 51B is a bottom view of the resonator element according to the fourteenth embodiment of the invention.
Figure 52:
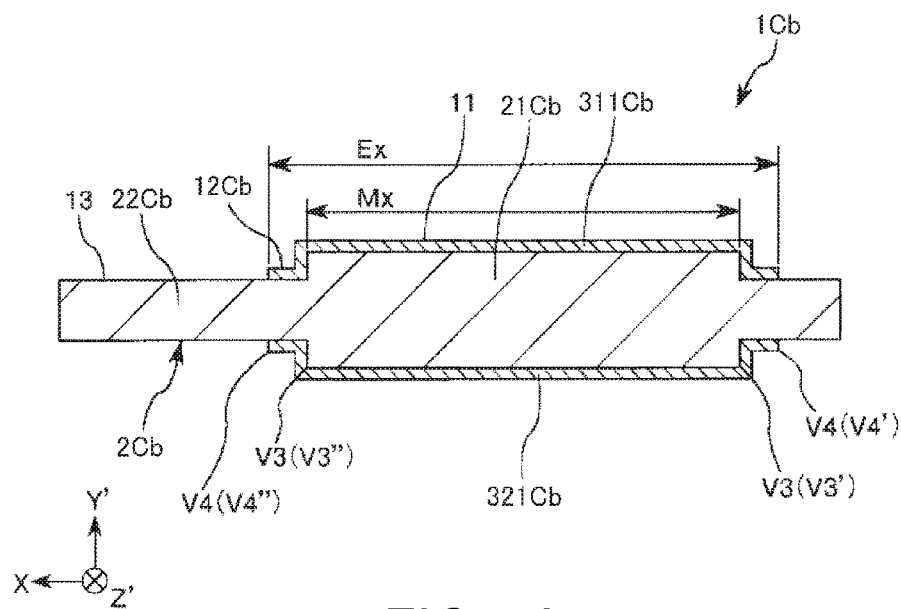
FIG. 52 is a sectional view taken along the line B3-B3 in FIG. 51A.
Figure 53:
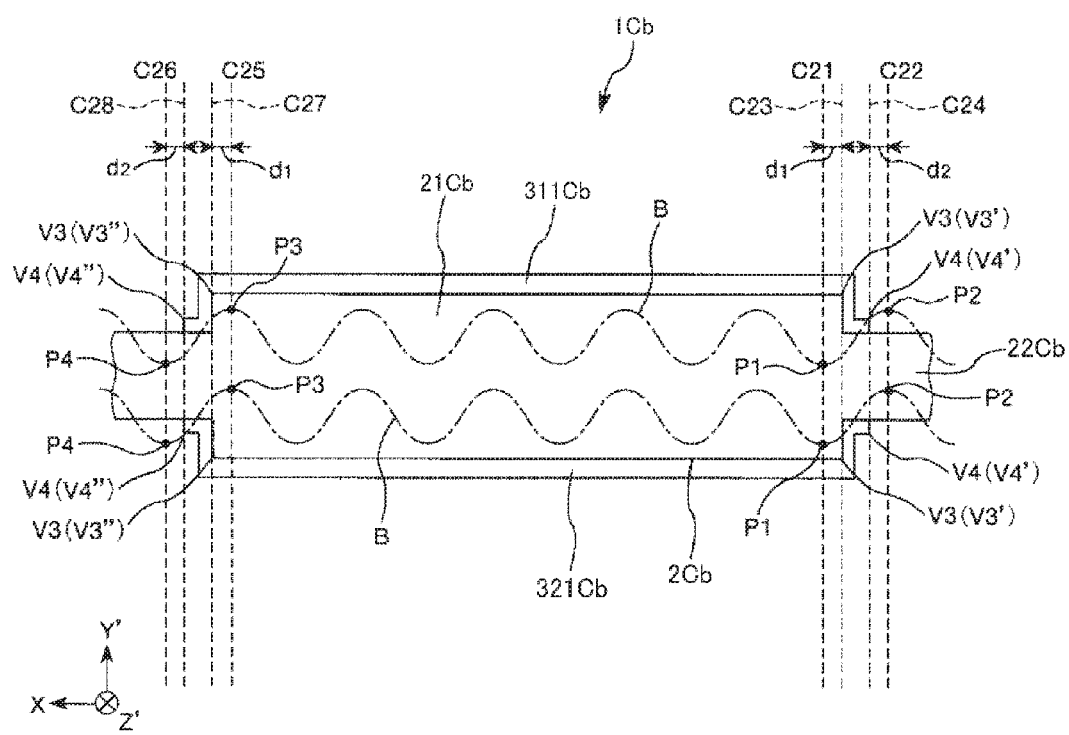
FIG. 53 is a diagram illustrating a positional relationship between a step difference and a waveform of flexural vibration.
Figure 54:
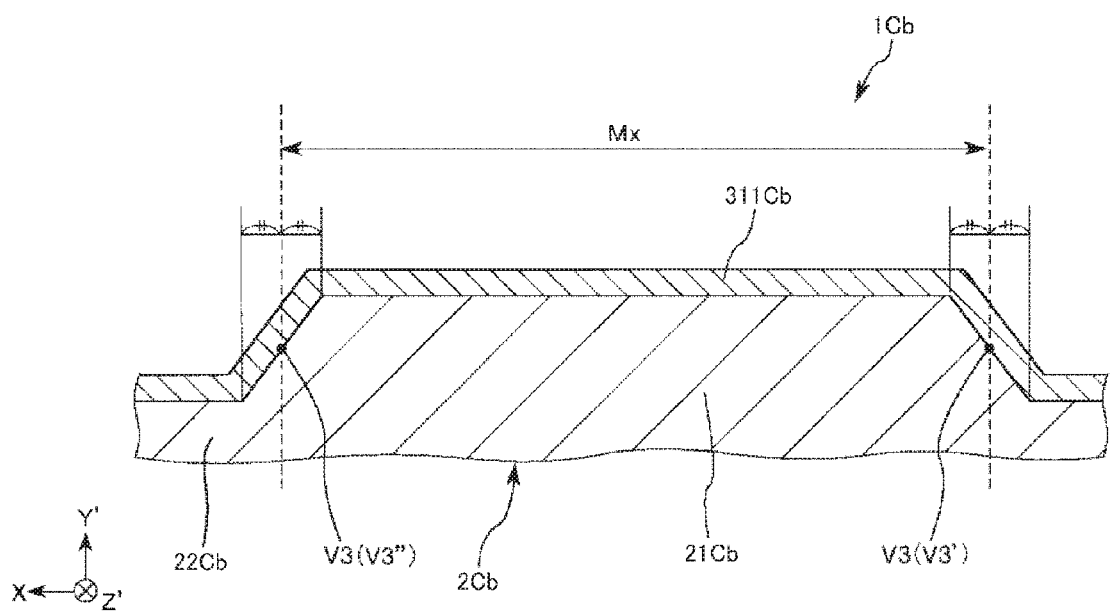
FIG. 54 is a sectional view illustrating a quartz crystal substrate which is formed through wet etching.

FIG. 51A is a top view of a resonator element according to the fourteenth embodiment of the invention, and FIG. 51B is a bottom view of the resonator element. FIG. 52 is a sectional view taken along the line B3-B3 in FIG. 51A. FIG. 53 is a diagram illustrating a positional relationship between a step difference and a waveform of flexural vibration. FIG. 54 is a sectional view illustrating a quartz crystal substrate which is formed through wet etching.

Hereinafter, a description will be made of the resonator element of the fourteenth embodiment focusing on a difference from the thirteenth embodiment, and a description of the same content will be omitted.

The resonator element according to the fourteenth embodiment of the invention is the same as in the thirteenth embodiment except for a difference in arrangement of electrodes. The same constituent elements as in the above-described embodiment are given the same reference numerals.

As illustrated in FIGS. 51A, 51B and 52, in a resonator element 1Cb of the present embodiment, a length Ex (a length L2 of a middle section) of excitation electrodes 311Cb and 321Cb in the X axis direction is larger than a length Mx (a length L1 of a thick section) of the vibration portion 21Cb in the X axis direction, that is, a relationship of Ex>Mx is satisfied. Both ends of the excitation electrodes 311Cb and 321Cb in the X axis direction are disposed so as to protrude from a vibration portion 21Cb on a thin portion 22Cb.

In the resonator element 1Cb, the vibration portion 21Cb forms a thick section 11 which is thickest; a portion of the thin portion 22Cb on which the excitation electrodes 311Cb and 321Cb are disposed forms a middle section 12Cb which is thinner than the thick section 11; and the thin portion 22Cb located therearound forms a thin section 13 which is thinner than the middle section 12Cb.

For this reason, a step difference (first step difference) V3 is formed at a boundary between the vibration portion 21Cb and the thin portion 22Cb, and a step difference (second step difference) V4 is formed at a boundary between the excitation electrodes 311Cb and 321Cb and the thin portion 22Cb, in the X axis direction. Hereinafter, the step difference V3 located on the −X axis side is referred to as a step difference V3', and the step difference V3 located on the +X axis side is referred to as a step difference V3". Similarly, the step difference V4 located on the −X axis side is referred to as a step difference V4', and the step difference V4 located on the +X axis side is referred to as a step difference V4".

As illustrated in FIG. 53, both of the step differences V3' and V4' are located between adjacent antinodes of flexural vibration which is spurious occurring in the quartz crystal substrate 2Cb, and, similarly, both of the step differences V3" and V4" are located between adjacent antinodes of flexural vibration. Specifically, when a virtual straight line which is parallel to the Y' axis through a peak P1 of an expected waveform B of the flexural vibration is indicated by C21; a virtual straight line which is parallel to the Y' axis through a peak P2 which is adjacent to the peak P1 of the waveform B on the −X axis side is indicated by C22; a virtual straight line which is parallel to the Y' axis through the step difference V3' is indicated by C23; and a virtual straight line which is parallel to the Y' axis through the step difference V4' is indicated by C24, both of the virtual straight lines C23 and C24 are located between the virtual straight lines C21 and C22. Similarly, when a virtual straight line which is parallel to the Y' axis through a peak P3 of the waveform B is indicated by C25; a virtual straight line which is parallel to the Y' axis through a peak P4 which is adjacent to the peak P3 of the waveform B on the +X axis side is indicated by C26; a virtual straight line which is parallel to the Y' axis through the step difference V3" is indicated by C27; and a virtual straight line which is parallel to the Y' axis through the step difference V4" is indicated by C28, both of the virtual straight lines C27 and C28 are located between the virtual straight lines C25 and C26. In other words, when a wavelength of the flexural vibration is indicated by λ, a clearance between the virtual straight line C21 and the virtual straight line C23 (a clearance between the virtual straight line C25 and the virtual straight line C27) is set to a distance d1, and a clearance between the virtual straight line C22 and the virtual straight line C24 (a clearance between the virtual straight line C26 and the virtual straight line C28) is set to a distance d2, a relationship of (Ex−Mx)/2=λ/2+d1+d2 is satisfied. As a result, the unwanted vibration can be effectively confined between the step differences V3 and V4. For this reason, the spurious can be reduced, and thus a CI value of the resonator element 1Cb is reduced and vibration characteristics are improved.

Particularly, in the present embodiment, the virtual straight lines C23 and C24 are located in a symmetrical manner between the virtual straight lines C21 and C22, and the virtual straight lines C27 and C28 are located in a symmetrical manner between the virtual straight lines C25 and C26. In other words, a relationship of d1=d2 is satisfied. Consequently, it is possible to more effectively reduce the spurious. In addition, it is preferable that d1 and d2 satisfy a relationship of 0≤d1≤λ/8 and 0≤d2≤λ/8, and also satisfy a relationship of Mx/2=(n/2+1/4)λ+d1+d2 (where n is an integer). Consequently, it is possible to even more effectively reduce the spurious.

The above description relates to the fourteenth embodiment. For example, in a case where the quartz crystal substrate 2Cb is formed by patterning a quartz crystal substrate through wet etching, as illustrated in FIG. 54, a crystal surface of the quartz crystal substrate 2Cb appears, and thus a sidewall of the vibration portion 21Cb is a tilt surface. The step difference V3 (V3' and V3") in this case is a portion located at the center between a boundary of a main surface and a tilt surface of the vibration portion 21Cb and a boundary of the tilt surface and a main surface of the thin portion 22Cb. The length Mx of the vibration portion 21Cb in the X axis direction is a clearance between the step differences V3' and V3".

The fourteenth embodiment can also exhibit the same effects as the above-described embodiment.

In the present embodiment, the excitation electrodes 311Cb and 321Cb are also disposed so as to exceed the vibration portion 21Cb in the Z' axis direction, but may be disposed so as not to exceed the vibration portion 21Cb in the Z' axis direction.

Fifteenth Embodiment

Next, a description will be made of a resonator element according to a fifteenth embodiment of the invention.

Figure 55A:
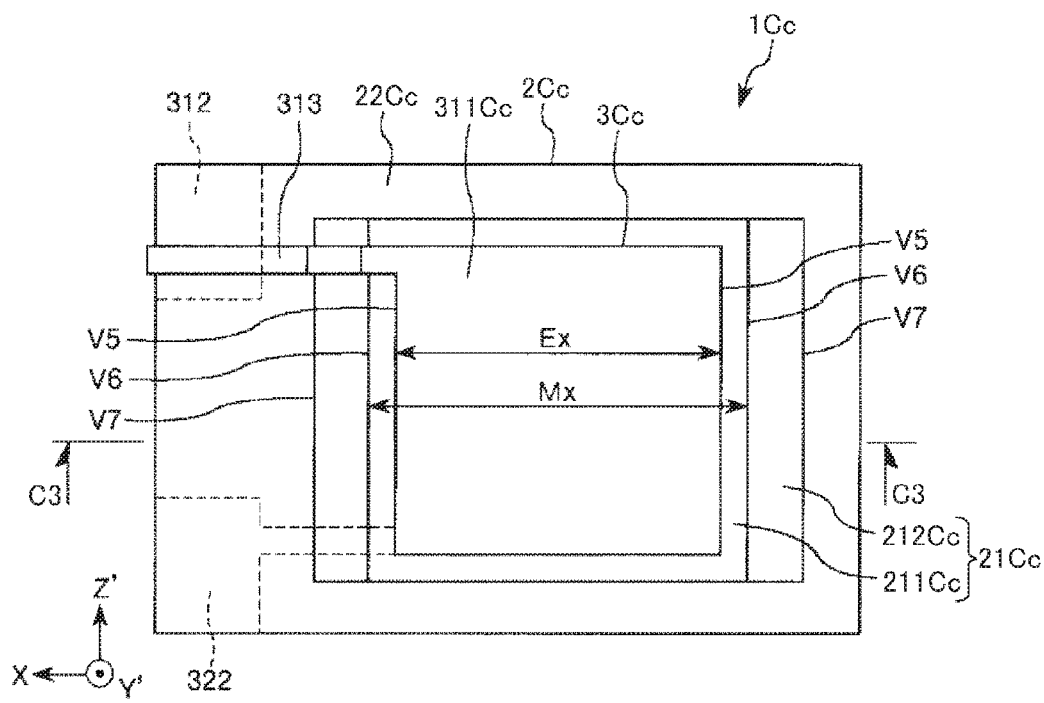
FIG. 55A is a top view of a resonator element according to a fifteenth embodiment of the invention.
Figure 55B:
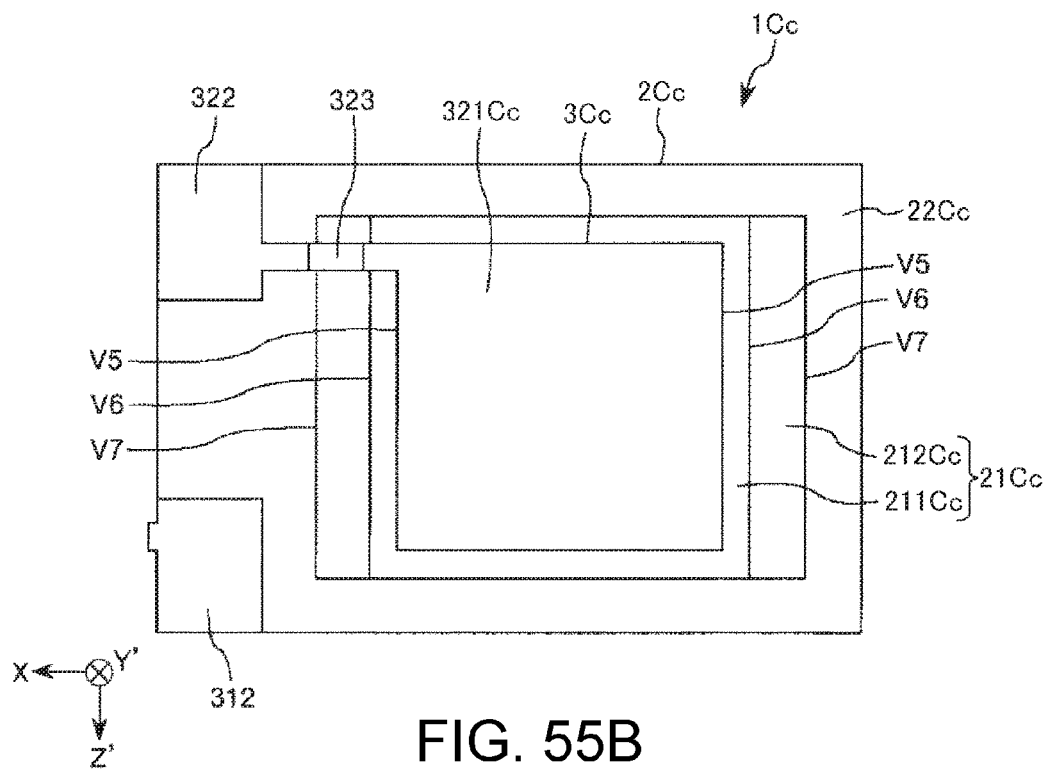
FIG. 55B is a bottom view of the resonator element according to the fifteenth embodiment of the invention.
Figure 56:
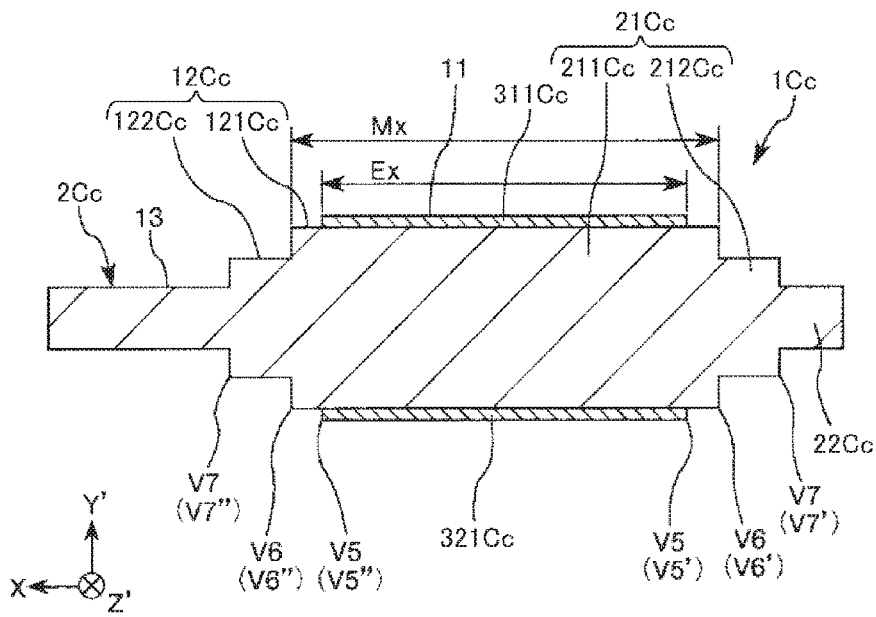
FIG. 56 is a sectional view taken along the line C3-C3 in FIG. 55A.
Figure 57:
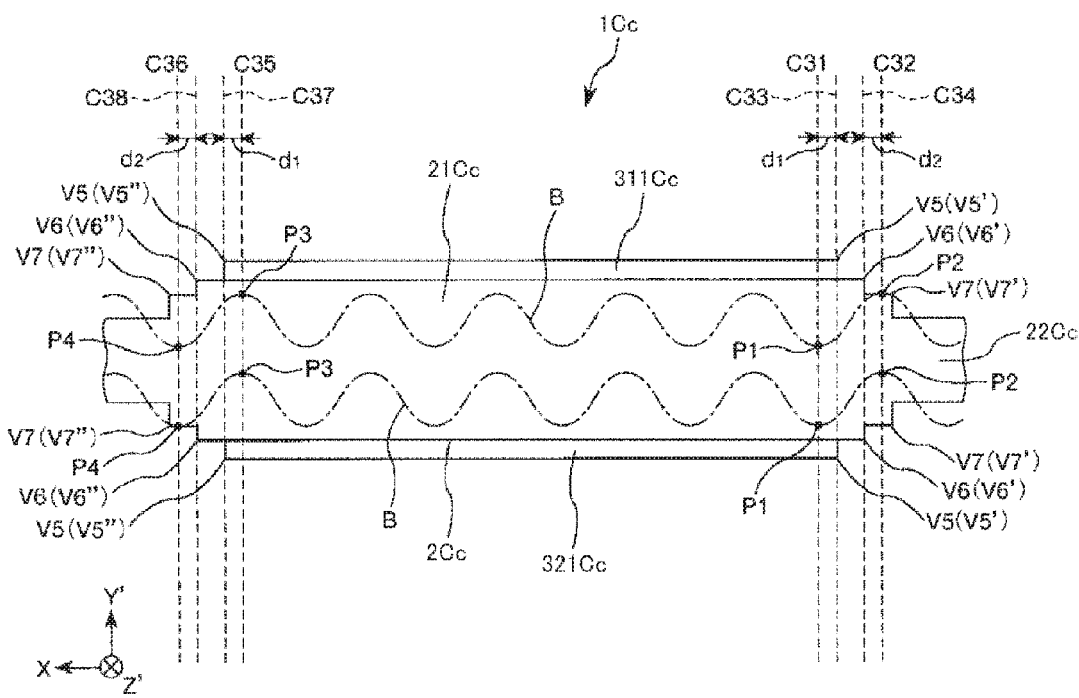
FIG. 57 is a diagram illustrating a positional relationship between a step difference and a waveform of flexural vibration.
Figure 58:
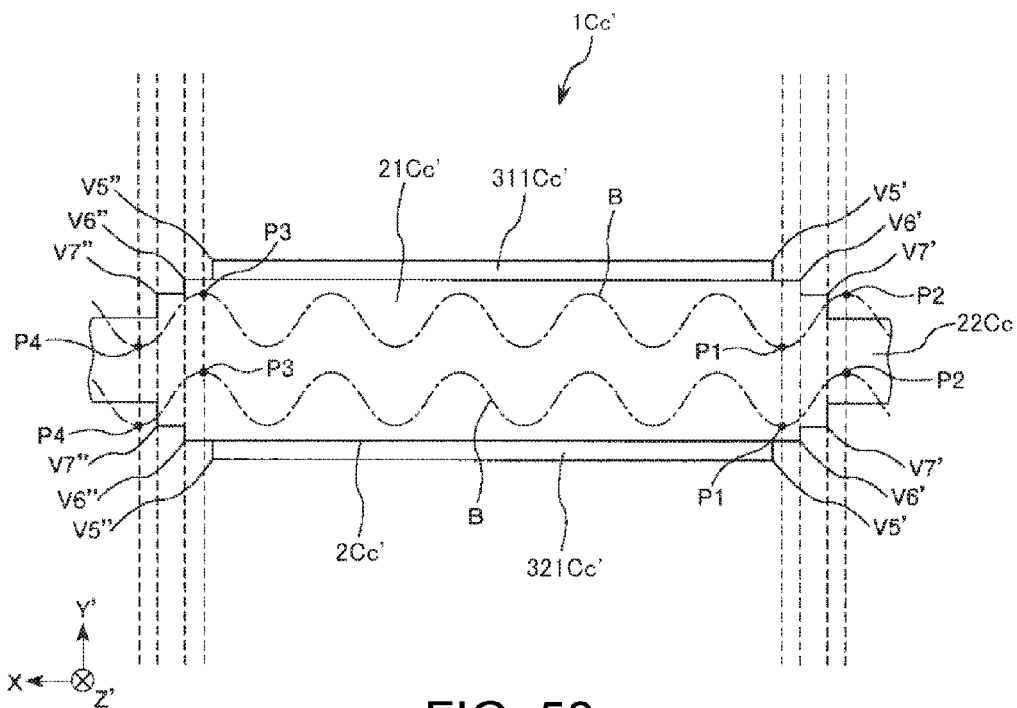
FIG. 58 is a diagram illustrating a positional relationship between a step difference and a waveform of flexural vibration.
Figure 59:
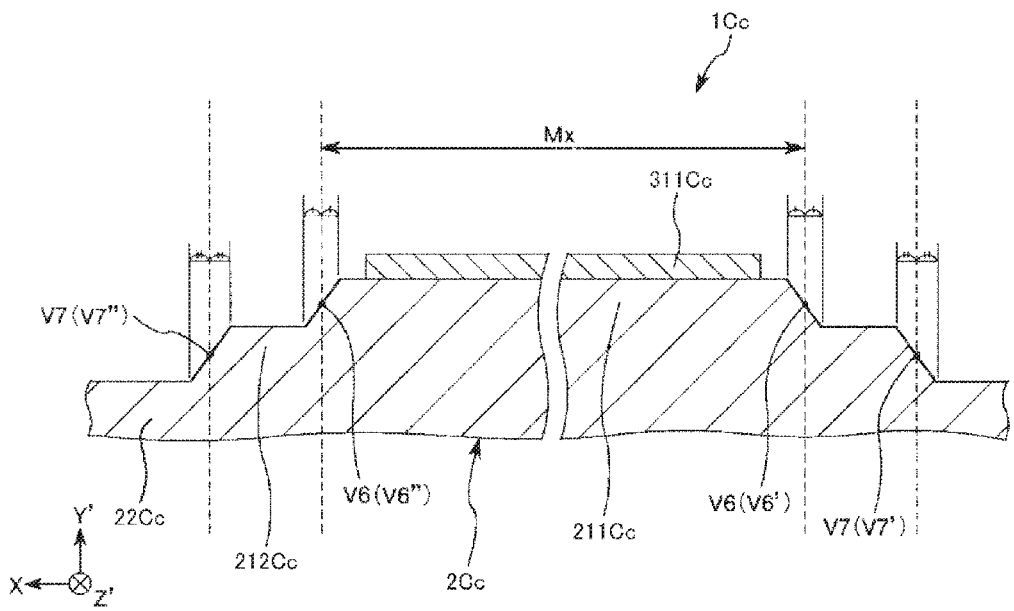
FIG. 59 is a sectional view illustrating a quartz crystal substrate which is formed through wet etching.

FIG. 55A is a top view of a resonator element according to the fifteenth embodiment of the invention, and FIG. 55B is a bottom view of the resonator element. FIG. 56 is a sectional view taken along the line C3-C3 in FIG. 55A. FIGS. 57 and 58 are diagrams illustrating a positional relationship between a step difference and a waveform of flexural vibration. FIG. 59 is a sectional view illustrating a quartz crystal substrate which is formed through wet etching.

Hereinafter, a description will be made of the resonator element of the fifteenth embodiment focusing on a difference from the above-described embodiments, and a description of the same content will be omitted.

The resonator element according to the fifteenth embodiment of the invention is the same as in the thirteenth embodiment except that a vibration portion is formed in two stages (a so-called "multistage mesa type"). The same constituent elements as in the above-described embodiments are given the same reference numerals.

As illustrated in FIGS. 55A, 55B and 56, a vibration portion 21Cc of a resonator element 1Cc of the present embodiment includes a first region 211Cc which is located at the center and is thick, and a second region 212Cc which is located around the first region 211Cc (both sides in the X axis direction) and is thinner than the first region 211Cc. As mentioned above, the vibration portion 21Cc is formed in multiple stages, and thus it is possible to efficiently confine energy with the vibration portion 21Cc. For this reason, it is possible to exhibit better vibration characteristics.

An excitation electrode 311Cc is disposed on a front surface of the first region 211Cc, and an excitation electrode 321Cc is disposed on a rear surface of the first region 211Cc so as to oppose the excitation electrode 311Cc. A length Ex (a length L1 of a thick section) of the excitation electrodes 311Cc and 321Cc in the X axis direction is smaller than a length Mx (a length L2 of a middle section) of the first region 211Cc in the X axis direction, that is, a relationship of Ex<Mx is satisfied. The excitation electrodes 311Cc and 321Cc are disposed at the center so as not to overlap both ends of the first region 211Cc in the X axis direction.

In the resonator element 1Cc, a portion of the first region 211Cc where the excitation electrodes 311Cc and 321Cc are disposed forms a thick section 11 which is thickest; the first region 211Cc therearound forms a first middle section 121Cc which is thinner than the thick section 11; the second region 212Cc forms a second middle section 122Cc which is thinner than the first middle section 121Cc; and a thin portion 22Cc forms a thin section 13 which is thinner than the second middle section 122Cc. For this reason, in the X axis direction, a step difference (first step difference) V5 is formed at a boundary between the excitation electrodes 311Cc and 321Cc and the first region 211Cc; a step difference (second step difference) V6 is formed at a boundary between the first region 211Cc and the second region 212Cc; and a step difference (third step difference) V7 is formed at a boundary between the second region 212Cc and the thin portion 22Cc.

Hereinafter, the step difference V5 located on the -X axis side is referred to as a step difference V5', and the step difference V5 located on the +X axis side is referred to as a step difference V5". Similarly, the step difference V6 located on the -X axis side is referred to as a step difference V6', and the step difference V6 located on the +X axis side is referred to as a step difference V6", and the step difference V7 located on the -X axis side is referred to as a step difference V7', and the step difference V7 located on the +X axis side is referred to as a step difference V7".

As illustrated in FIG. 57, the step differences V5' and V6' are located between adjacent antinodes of flexural vibration which is spurious occurring in the quartz crystal substrate 2Cc, and, similarly, the step differences V5" and V6" are located between adjacent antinodes of flexural vibration. Specifically, when a virtual straight line which is parallel to the Y' axis through a peak P1 of an expected waveform B of the flexural vibration is indicated by C31; a virtual straight line which is parallel to the Y' axis through a peak P2 which is adjacent to the peak P1 of the waveform B on the -X axis side is indicated by C32; a virtual straight line which is parallel to the Y' axis through the step difference V5' is indicated by C33; and a virtual straight line which is parallel to the Y' axis through the step difference V6' is indicated by C34, the virtual straight lines C33 and C34 are located between the virtual straight lines C31 and C32. Similarly, when a virtual straight line which is parallel to the Y' axis through a peak P3 of the waveform B is indicated by C35; a virtual straight line which is parallel to the Y' axis through a peak P4 which is adjacent to the peak P3 of the waveform B on the +X axis side is indicated by C36; a virtual straight line which is parallel to the Y' axis through the step difference V5" is indicated by C37; and a virtual straight line which is parallel to the Y' axis through the step difference V6" is indicated by C38, the virtual straight lines C37 and C38 are located between the virtual straight lines C35 and C36. In other words, when a wavelength of the flexural vibration is indicated by λ, a clearance between the virtual straight line C31 and the virtual straight line C33 (a clearance between the virtual straight line C35 and the virtual straight line C37) is set to a distance d1, and a clearance between the virtual straight line C32 and the virtual straight line C34 (a clearance between the virtual straight line C36 and the virtual straight line C38) is set to a distance d2, a relationship of (Mx−Ex)/2=λ/2+d1+d2 is satisfied. As a result, the unwanted vibration can be effectively confined between the step differences V5 and V6. For this reason, the spurious can be reduced, and thus a CI value of the resonator element 1Cc is reduced and vibration characteristics are improved.

Particularly, in the present embodiment, the virtual straight lines C33 and C34 are located in a symmetrical manner between the virtual straight lines C31 and C32, and the virtual straight lines C37 and C38 are located in a symmetrical manner between the virtual straight lines C35 and C36. In other words, a relationship of d1=d2 is satisfied. Consequently, it is possible to more effectively reduce the spurious. In addition, it is preferable that d1 and d2 satisfy a relationship of $0 \leq d1 \leq \lambda/8$ and $0 \leq d2 \leq \lambda/8$, and also satisfy a relationship of $Mx/2=(n/2+1/4)\lambda+d1+d2$ (where n is an integer). Consequently, it is possible to even more effectively reduce the spurious.

As a modification example of the present embodiment, as in a resonator element 1Cc' illustrated in FIG. 58, the step differences V6' and V7' may be located between two adjacent antinodes of flexural vibration which is spurious occurring in the quartz crystal substrate 2Cc', and, similarly, the step differences V6" and V7" may also be located between two adjacent antinodes of flexural vibration. In other words, if the step differences V5' and V6' or the step differences V6' and V7' are located between the virtual straight lines C31 and C32, or the step differences V5" and V6" or the step differences V6" and V7" are located between the virtual straight lines C35 and C36, it is possible to effectively reduce the spurious as described above.

The above description relates to the fifteenth embodiment. For example, in a case where the quartz crystal substrate 2Cc is formed by patterning a quartz crystal substrate through wet etching, as illustrated in FIG. 59, a crystal surface of the quartz crystal substrate 2Cc appears, and thus a sidewall of each of the first region 211Cc and the second region 212Cc is a tilt surface. The step difference V6 (V6' and V6") in this case is a portion located at the center between a boundary of a main surface and a tilt surface of the first region 211Cc and a boundary of the tilt surface and a main surface of the second region 212Cc. The step difference V7 (V7' and V7") is a portion located at the center between a boundary of the main surface and the tilt surface of the second region 212Cc and a boundary of the tilt surface and a main surface of the thin portion 22Cc. In this case, the length Mx of the first region 211Bc in the X axis direction is a clearance between the step differences V6' and V6".

The fifteenth embodiment can also exhibit the same effects as the above-described embodiments.

Sixteenth Embodiment

Next, a description will be made of a resonator element according to a sixteenth embodiment of the invention.

Figure 60A:
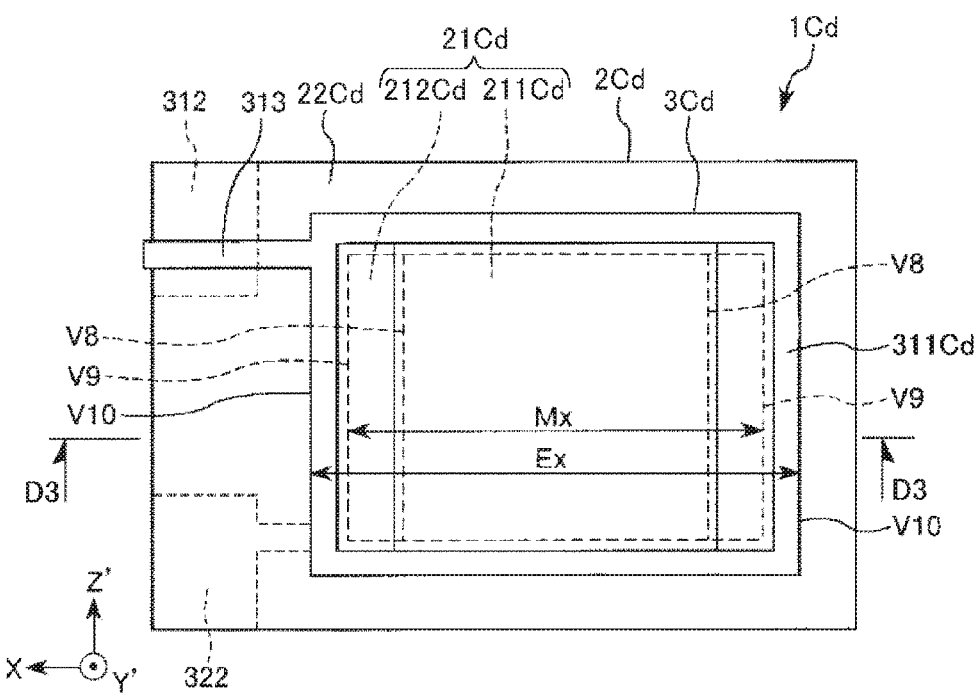
FIG. 60A is a top view of a resonator element according to a sixteenth embodiment of the invention.
Figure 60B:
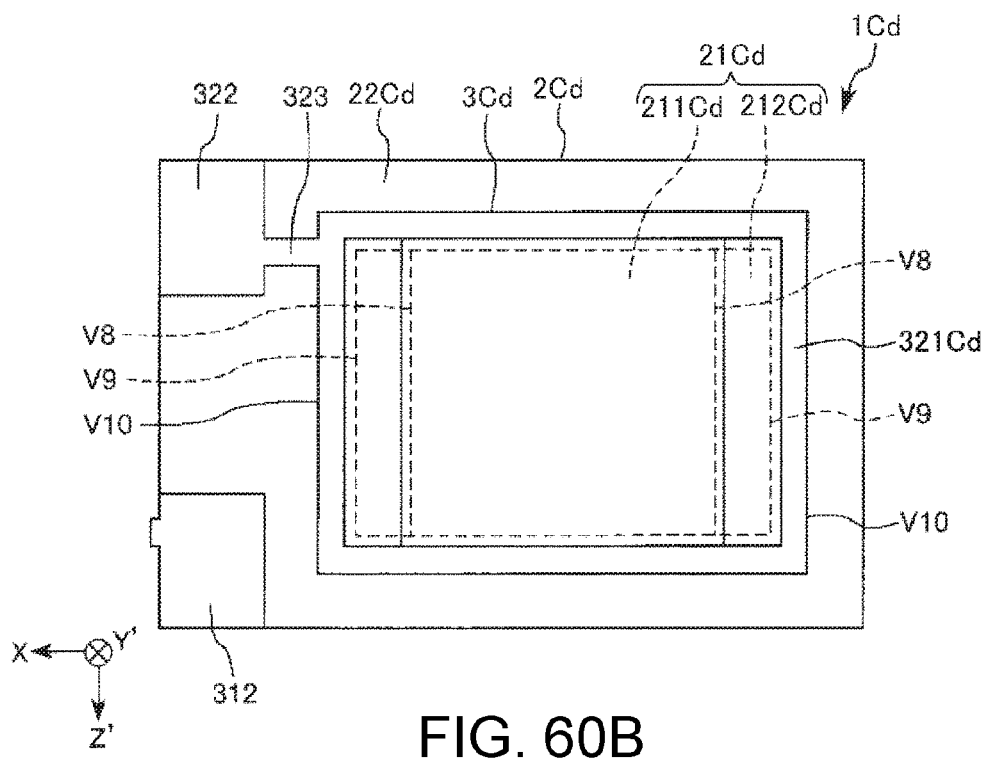
FIG. 60B is a bottom view of the resonator element according to the sixteenth embodiment of the invention.
Figure 61:
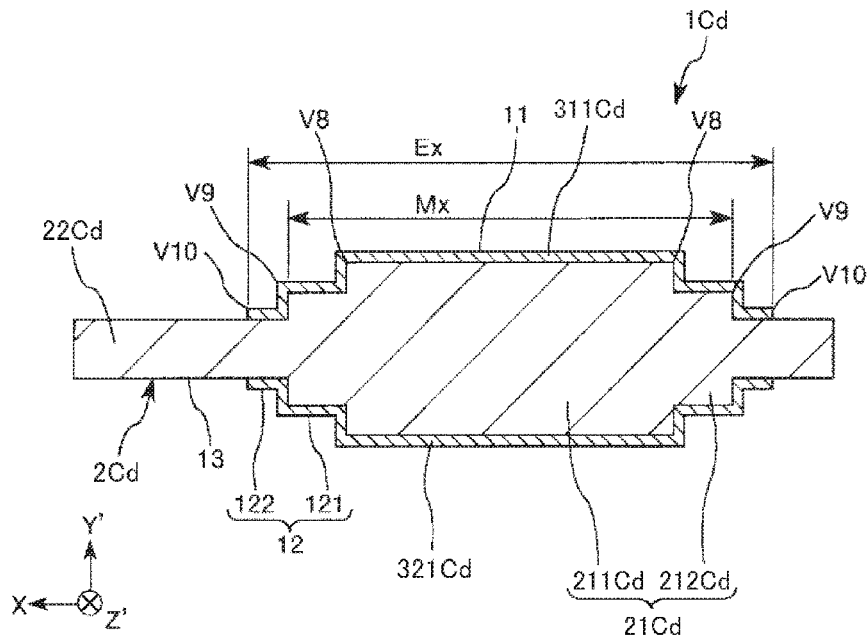
FIG. 61 is a sectional view taken along the line D3-D3 in FIG. 60A.
Figure 62:
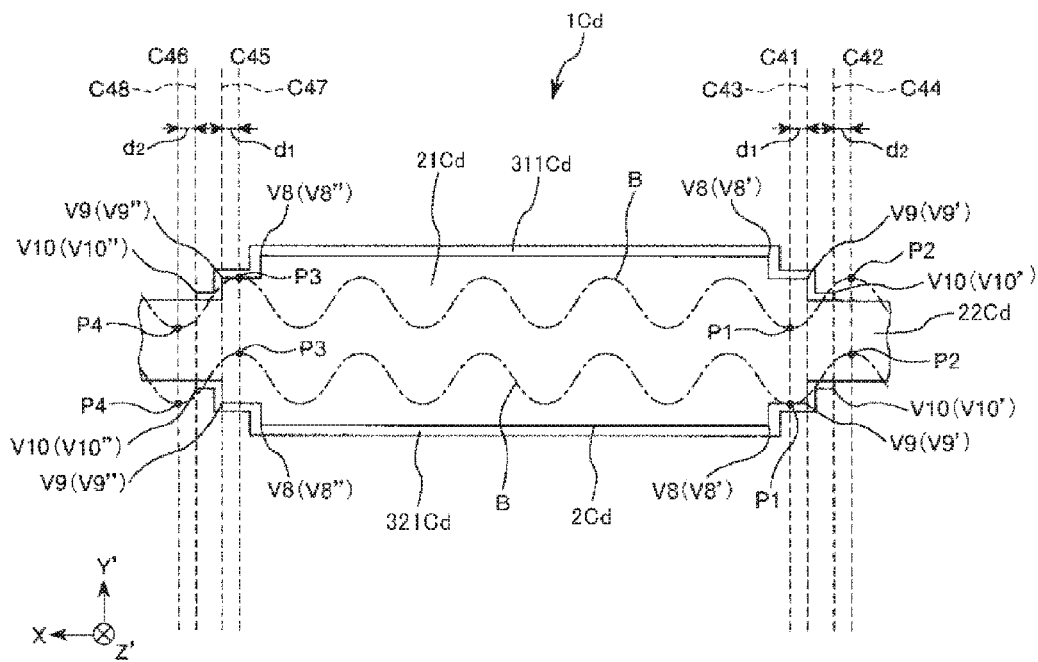
FIG. 62 is a diagram illustrating a positional relationship between a step difference and a waveform of flexural vibration.
Figure 63:
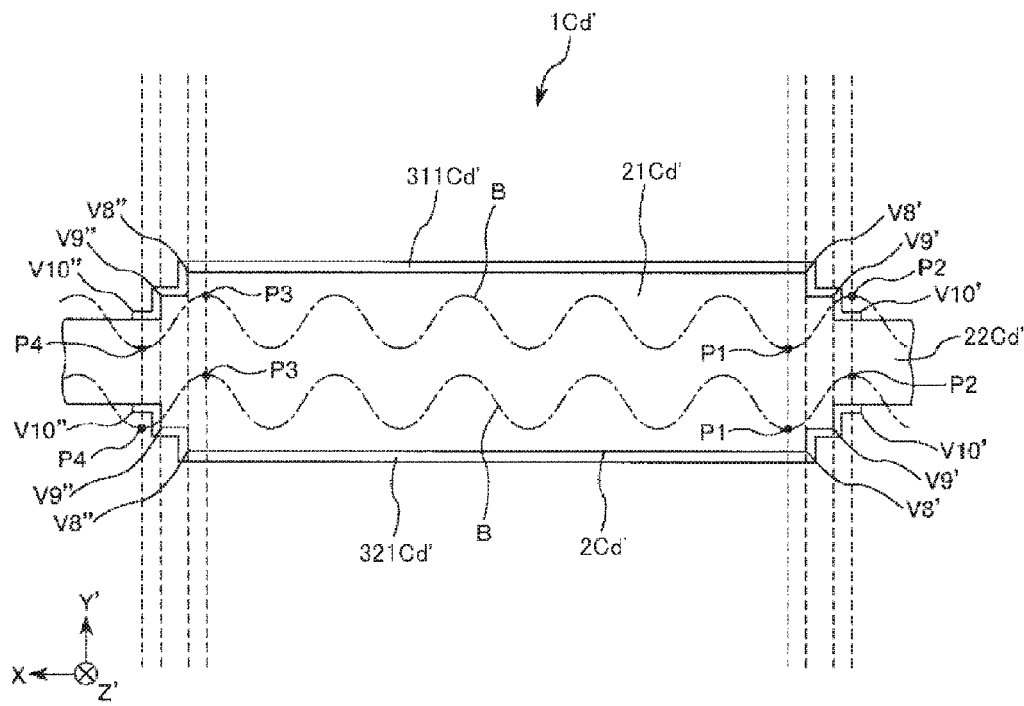
FIG. 63 is a diagram illustrating a positional relationship between a step difference and a waveform of flexural vibration.
Figure 64:
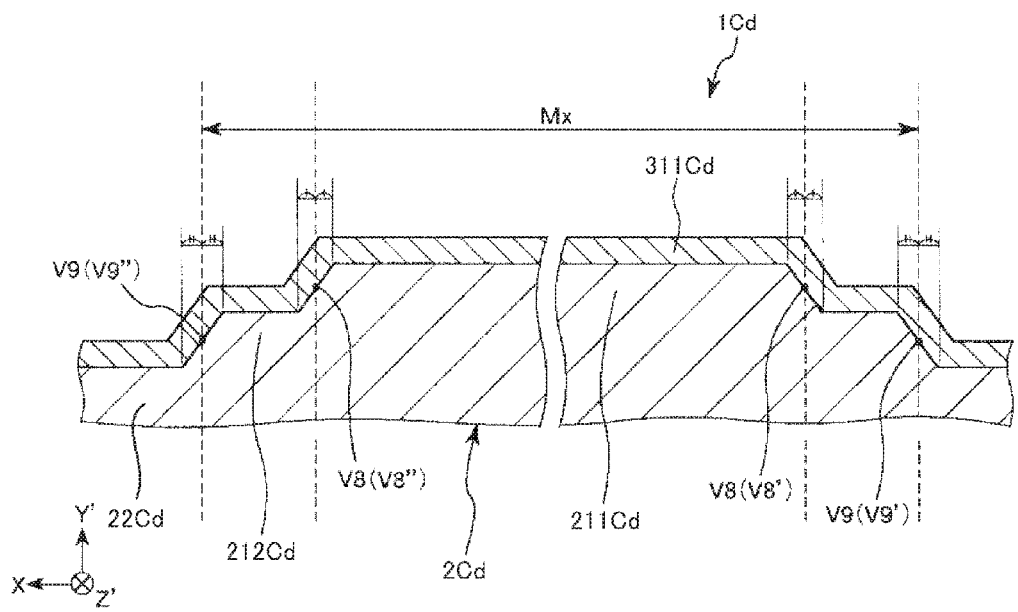
FIG. 64 is a sectional view illustrating a quartz crystal substrate which is formed through wet etching.

FIG. 60A is a top view of a resonator element according to the sixteenth embodiment of the invention, and FIG. 60B is a bottom view of the resonator element. FIG. 61 is a sectional view taken along the line D3-D3 in FIG. 60A. FIGS. 62 and 63 are diagrams illustrating a positional relationship between a step difference and a waveform of flexural vibration. FIG. 64 is a sectional view illustrating a quartz crystal substrate which is formed through wet etching.

Hereinafter, a description will be made of the resonator element of the sixteenth embodiment focusing on a difference from the above-described embodiments, and a description of the same content will be omitted.

The resonator element according to the sixteenth embodiment of the invention is the same as in the fourteenth embodiment except that a vibration portion is formed in two stages (a so-called "multistage mesa type"). The same constituent elements as in the above-described embodiments are given the same reference numerals.

As illustrated in FIGS. 60A, 60B and 61, a vibration portion 21Cd of a resonator element 1Cd of the present embodiment includes a first region 211Cd which is located at the center and is thick, and a second region 212Cd which is located around the first region 211Cd and is thinner than the first region 211Cd.

A length Ex (a length L2 of a middle section) of excitation electrodes 311Cd and 321Cd in the X axis direction is larger than a length Mx (a length L1 of a thick section) of a vibration portion 21Cd in the X axis direction, that is, a relationship of Ex>Mx is satisfied, and both ends of the excitation electrodes 311Cd and 321Cd in the X axis direction are disposed so as to protrude from the vibration portion 21Cd on a thin portion 22Cd.

In the resonator element 1Cd, the first region 211Cd forms a thick section 11 which is thickest; the second region 212Cd forms a first middle section 121Cd which is thinner than the thick section 11; a portion of the thin portion 22Cd where the excitation electrodes 311Cd and 321Cd are disposed forms a second middle section 122Cd which is thinner than the first middle section 121Cd; and the thin portion 22Cd located therearound forms a thin section 13 which is thinner than the second middle section 122Cd. For this reason, in the X axis direction, a step difference (first step difference) V8 is formed at a boundary between the first region 211Cd and the second region 212Cd; a step difference (second step difference) V9 is formed at a boundary between the second region 212Cd and the thin portion 22Cd; and a step difference (third step difference) V10 is formed at a boundary between the excitation electrodes 311Cd and 321Cd and the thin portion 22Cd.

Hereinafter, the step difference V8 located on the −X axis side is referred to as a step difference V8', and the step difference V8 located on the +X axis side is referred to as a step difference V8". Similarly, the step difference V9 located on the −X axis side is referred to as a step difference V9', and the step difference V9 located on the +X axis side is referred to as a step difference V9", and the step difference V10 located on the −X axis side is referred to as a step difference V10', and the step difference V10 located on the +X axis side is referred to as a step difference V10".

As illustrated in FIG. 62, both of the step differences V9' and V10' are located between adjacent antinodes of flexural vibration which is spurious occurring in the quartz crystal substrate 2Cd, and, similarly, both of the step differences V9" and V10" are located between adjacent antinodes of flexural vibration.

Specifically, when a virtual straight line which is parallel to the Y' axis through a peak P1 of an expected waveform B of the flexural vibration is indicated by C41; a virtual straight line which is parallel to the Y' axis through a peak P2 which is adjacent to the peak P1 of the waveform B on the −X axis side is indicated by C42; a virtual straight line which is parallel to the Y' axis through the step difference V9' is indicated by C43; and a virtual straight line which is parallel to the Y' axis through the step difference V10' is indicated by C44, the virtual straight lines C43 and C44 are located between the virtual straight lines C41 and C42. Similarly, when a virtual straight line which is parallel to the Y' axis through a peak P3 of the waveform B is indicated by C45; a virtual straight line which is parallel to the Y' axis through a peak P4 which is adjacent to the peak P3 of the waveform B on the +X axis side is indicated by C46; a virtual straight line which is parallel to the Y' axis through the step difference V9" is indicated by C47; and a virtual straight line which is parallel to the Y' axis through the step difference V10" is indicated by C48, the virtual straight lines C47 and C48 are located between the virtual straight lines C45 and C46. In other words, when a wavelength of the flexural vibration is indicated by λ, a clearance between the virtual straight line C41 and the virtual straight line C43 (a clearance between the virtual straight line C45 and the virtual straight line C47) is set to a distance d1, and a clearance between the virtual straight line C42 and the virtual straight line C44 (a clearance between the virtual straight line C46 and the virtual straight line C48) is set to a distance d2, a relationship of (Ex−Mx)/2=λ/2+d1+d2 is satisfied. As a result, the unwanted vibration can be effectively confined between the step differences V9 and V10. For this reason, the spurious can be reduced, and thus a CI value of the resonator element 1Cd is reduced and vibration characteristics are improved.

Particularly, in the present embodiment, the virtual straight lines C43 and C44 are located in a symmetrical manner between the virtual straight lines C41 and C42, and the virtual straight lines C47 and C48 are located in a symmetrical manner between the virtual straight lines C45 and C46. In other words, a relationship of d1=d2 is satisfied. Consequently, it is possible to more effectively reduce the spurious. In addition, it is preferable that d1 and d2 satisfy a relationship of 0≤d1≤λ/8 and 0≤d2≤λ/8, and also satisfy a relationship of Mx/2=(n/2+1/4)λ+d1+d2 (where n is an integer). Consequently, it is possible to even more effectively reduce the spurious.

As a modification example of the present embodiment, as in a resonator element 1Cd' illustrated in FIG. 63, between two adjacent antinodes of flexural vibration which is spurious occurring in the quartz crystal substrate 2Cd', the step differences V8' and V9' may be located, and, similarly, between two adjacent antinodes of flexural vibration, the step differences V8" and V9" may also be located. In other words, if the step differences V9' and V10' or the step differences V8' and V9' are located between the virtual straight lines C41 and C42, or the step differences V9" and V10" or the step differences V8" and V9" are located between the virtual straight lines C45 and C46, it is possible to effectively reduce the spurious as described above.

The above description relates to the sixteenth embodiment. For example, in a case where the quartz crystal substrate 2Cd is formed by patterning a quartz crystal substrate through wet etching, as illustrated in FIG. 64, a crystal surface of the quartz crystal substrate 2Cd appears, and thus a sidewall of each of the first region 211Cd and the second region 212Cd is a tilt surface. The step difference V8 (V8' and V8") in this case is a portion located at the center between a boundary of a main surface and a tilt surface of the first region 211Cd and a boundary of the tilt surface and a main surface of the second region 212Cd. The step difference V9 (V9' and V9") is a portion located at the center between a boundary of the main surface and the tilt surface of the second region 212Cd and a boundary of the tilt surface and a main surface of the thin portion 22Cd. In this case, the length Mx of the vibration portion 21Cd in the X axis direction is a clearance between the step differences V9' and V9".

The sixteenth embodiment can also exhibit the same effects as the above-described embodiments.

Seventeenth Embodiment

Next, a description will be made of a resonator element according to a seventeenth embodiment of the invention.

Figure 65A:
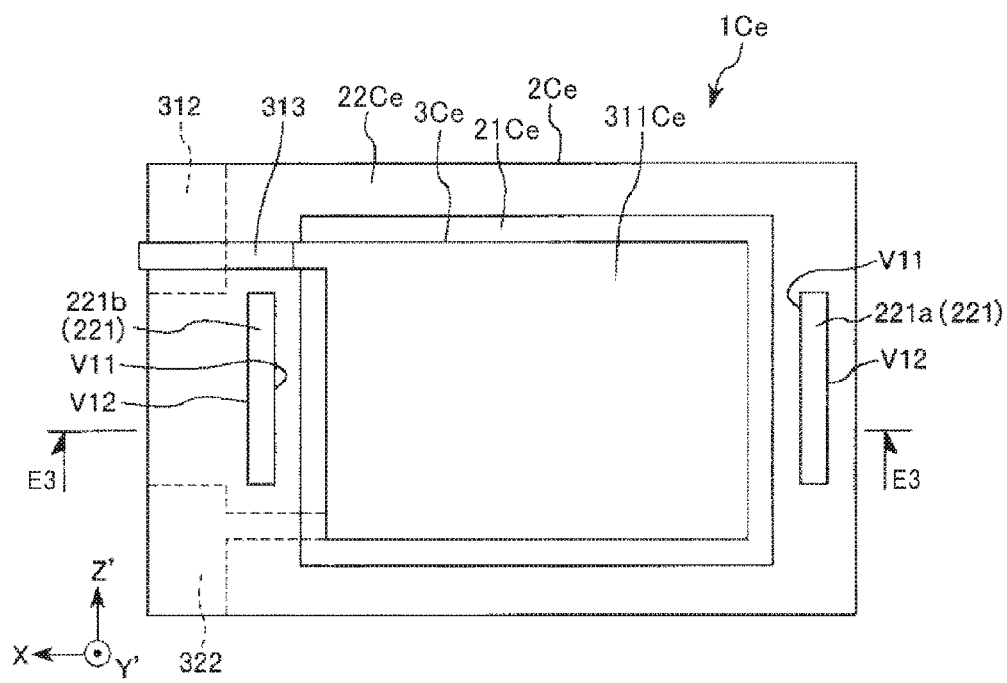
FIG. 65A is a top view of a resonator element according to a seventeenth embodiment of the invention.
Figure 65B:
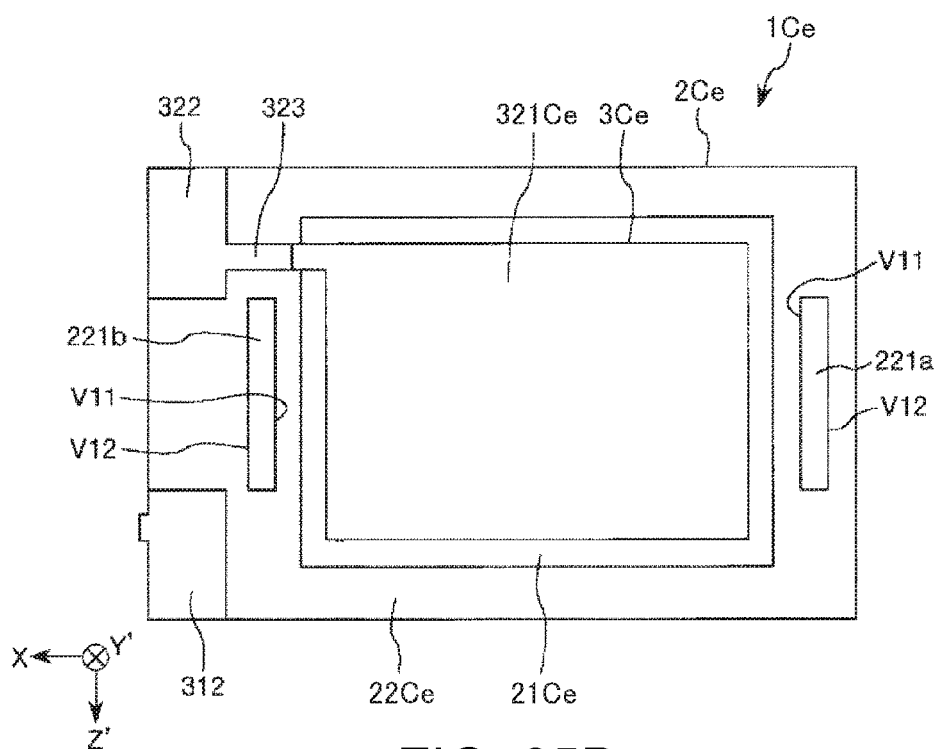
FIG. 65B is a bottom view of the resonator element according to the seventeenth embodiment of the invention.
Figure 66:
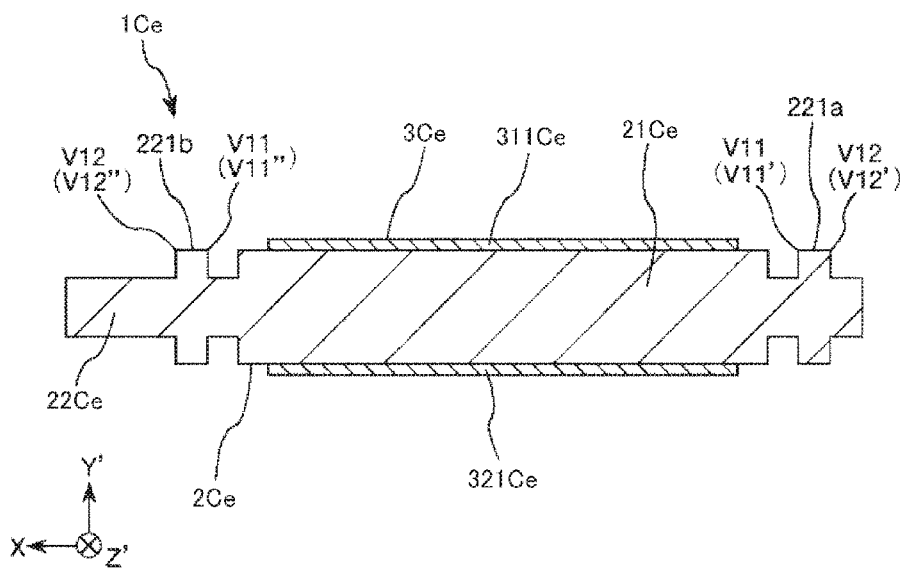
FIG. 66 is a sectional view taken along the line E3-E3 in FIG. 65A.
Figure 67:
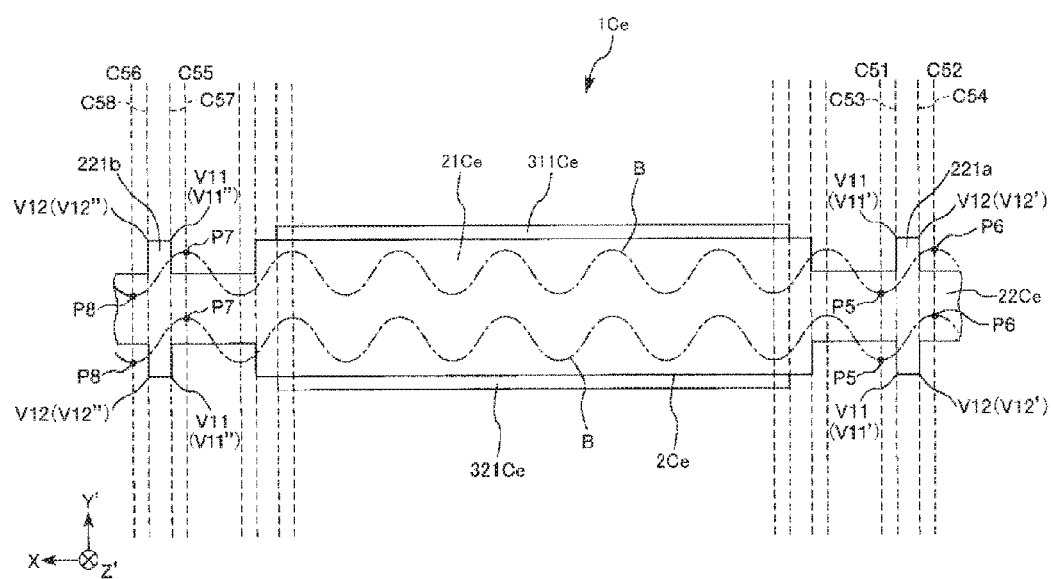
FIG. 67 is a diagram illustrating a positional relationship between a step difference and a waveform of flexural vibration.

FIG. 65A is a top view of a resonator element according to the seventeenth embodiment of the invention, and FIG. 65B is a bottom view of the resonator element. FIG. 66 is a sectional view taken along the line E3-E3 in FIG. 65A. FIG. 67 is a diagram illustrating a positional relationship between a step difference and a waveform of flexural vibration.

Hereinafter, a description will be made of the resonator element of the seventeenth embodiment focusing on a difference from the above-described embodiments, and a description of the same content will be omitted.

The resonator element according to the seventeenth embodiment of the invention is the same as in the thirteenth embodiment except that a protrusion is disposed at a thin portion. The same constituent elements as in the above-described embodiments are given the same reference numerals.

As illustrated in FIGS. 65A, 65B and 66, a protrusion 221 is provided at a thin portion 22Ce of a resonator element 1Ce of the present embodiment. The protrusion 221 includes, in a plan view, a first protrusion 221a which is separated from a vibration portion 21Ce toward the −X axis side and extends in the Z' axis direction (a direction along an outer edge intersecting the vibration direction (X axis direction) of the thickness shear vibration of the vibration portion 21Ce), and a second protrusion 221b which is separated from the vibration portion 21Ce toward the +X axis side and extends in the Z' axis direction. In the present embodiment, the first protrusion 221a and the second protrusion 221b are integrally formed with the thin portion 22Ce, but the first and second protrusions 221a and 221b may be disposed, for example, by depositing a separate material such as SiO₂ on a surface of the thin portion 22Ce. The first and second protrusions 221a and 221b may be integrally formed, for example, by a frame-shaped portion which is disposed so as to surround the periphery of the vibration portion 21Ce.

In the resonator element 1Ce, step differences V11 and V12 are formed at boundaries between the protrusion 221 and the thin portion 22Ce in the X axis direction. Hereinafter, the step difference V11 located on the +X axis side of the first protrusion 221a is referred to as a step difference V11', and the step difference V11 located on the −X axis side of the second protrusion 221b is referred to as a step difference V11". Similarly, the step difference V12 located on the −X axis side of the first protrusion 221a is referred to as a step difference V12', and the step difference V12 located on the +X axis side of the second protrusion 221b is referred to as a step difference V12".

As illustrated in FIG. 67, both of the step differences V11' and V12' are located between adjacent antinodes of flexural vibration which is spurious occurring in the quartz crystal substrate 2Ce, and, similarly, both of the step differences V11" and V12" are located between adjacent antinodes of flexural vibration. Specifically, when a virtual straight line which is parallel to the Y' axis through a peak P5 of an expected waveform B of the flexural vibration is indicated by C51; a virtual straight line which is parallel to the Y' axis through a peak P6 which is adjacent to the peak P5 of the waveform B on the −X axis side is indicated by C52; a virtual straight line which is parallel to the Y' axis through the step difference V11' is indicated by C53; and a virtual straight line which is parallel to the Y' axis through the step difference V12' is indicated by C54, the virtual straight lines C53 and C54 are located between the virtual straight lines C51 and C52. Similarly, when a virtual straight line which is parallel to the Y' axis through a peak P7 of the waveform B is indicated by C55; a virtual straight line which is parallel to the Y' axis through a peak P8 which is adjacent to the peak P7 of the waveform B on the +X axis side is indicated by C56; a virtual straight line which is parallel to the Y' axis through the step difference V11" is indicated by C57; and a virtual straight line which is parallel to the Y' axis through the step difference V12" is indicated by C58, the virtual straight lines C57 and C58 are located between the virtual straight lines C55 and C56. As a result, the resonator element 1Ce can more effectively minimize a flexural vibration component and can thus more effectively reduce the spurious.

The seventeenth embodiment can also exhibit the same effects as the above-described embodiments.

Eighteenth Embodiment

Next, a description will be made of a resonator element according to an eighteenth embodiment of the invention.

Figure 68A:
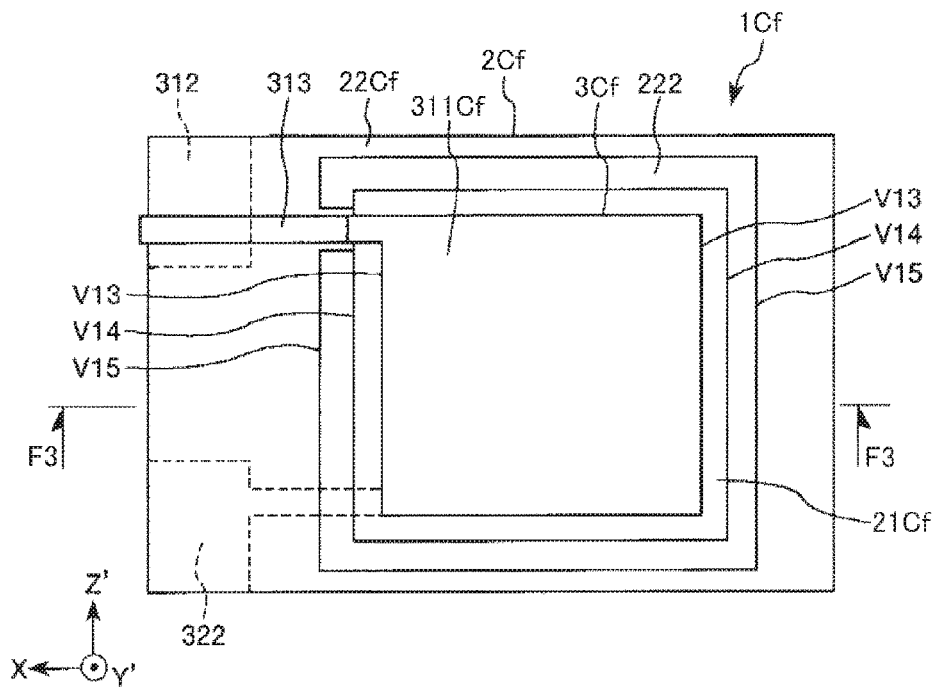
FIG. 68A is a top view of a resonator element according to an eighteenth embodiment of the invention.
Figure 68B:
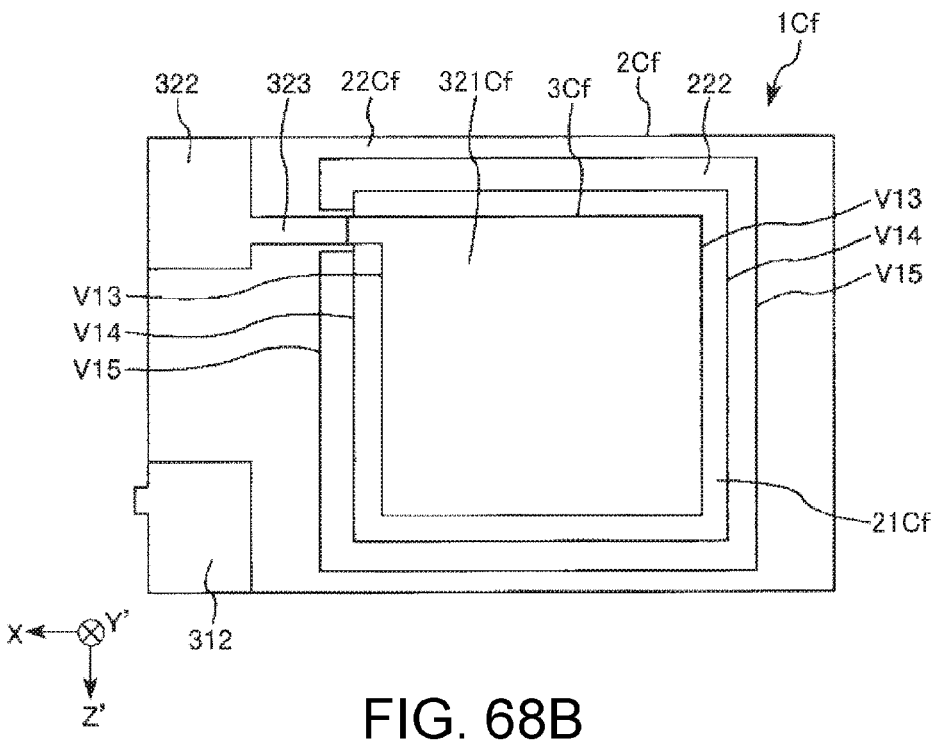
FIG. 68B is a bottom view of the resonator element according to the eighteenth embodiment of the invention.
Figure 69:
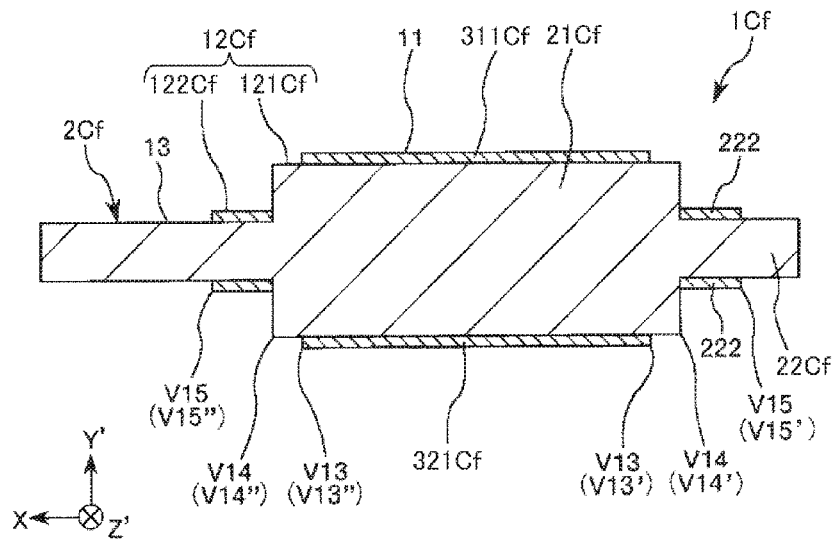
FIG. 69 is a sectional view taken along the line F3-F3 in FIG. 68A.
Figure 70:
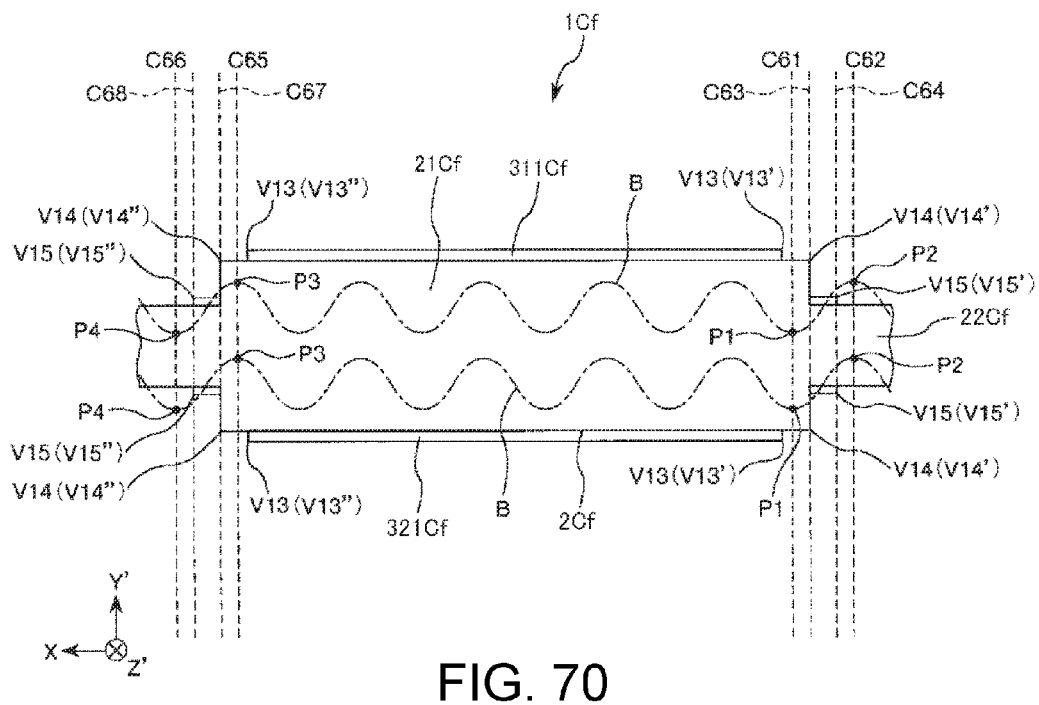
FIG. 70 is a diagram illustrating a positional relationship between a step difference and a waveform of flexural vibration.

FIG. 68A is a top view of a resonator element according to the eighteenth embodiment of the invention, and FIG. 68B is a bottom view of the resonator element. FIG. 69 is a sectional view taken along the line F3-F3 in FIG. 68A. FIG. 70 is a diagram illustrating a positional relationship between a step difference and a waveform of flexural vibration.

Hereinafter, a description will be made of the resonator element of the eighteenth embodiment focusing on a difference from the above-described embodiments, and a description of the same content will be omitted.

The resonator element according to the eighteenth embodiment of the invention is the same as in the thirteenth embodiment except that a protrusion is disposed at a thin portion. The same constituent elements as in the above-described embodiments are given the same reference numerals.

As illustrated in FIGS. 68A, 68B and 69, a protrusion 222 is provided at a thin portion 22Cf of a resonator element 1Cf of the present embodiment. The protrusion 222 has a frame shape which is in contact with an outer circumference of a vibration portion 21Cf and surrounds the vibration portion 21Cf in a plan view. However, the protrusion 222 is not formed at portions which overlap the extraction electrodes 313 and 323. The protrusion 222 is made of, for example, the same material as that of an electrode 3Cf and is thus formed along with the electrode 3Cf. However, a material forming the protrusion 222 is not limited thereto, and, for example, $SiO_2$ may be used.

In the resonator element 1Cf, a portion of the vibration portion 21Cf where excitation electrodes 311Cf and 321Cf are disposed forms a thick section 11 which is thickest; the vibration portion 21Cf therearound forms a first middle section 121Cf which is thinner than the thick section 11; a portion of a thin portion 22Cf where the protrusion 222 is disposed forms a second middle section 122Cf which is thinner than the first middle section 121Cf; and the thin portion 22Cf forms a thin section 13 which is thinner than the second middle section 122Cf.

For this reason, in the X axis direction, a step difference (first step difference) V13 is formed at a boundary between the excitation electrodes 311Cf and 321Cf and the vibration portion 21Cf; a step difference (second step difference) V14 is formed at a boundary between the vibration portion 21Cf and the protrusion 222; and a step difference (third step difference) V15 is formed at a boundary between the protrusion 222 and the thin portion 22Cf.

Hereinafter, the step difference V13 located on the −X axis side is referred to as a step difference V13', and the step difference V13 located on the +X axis side is referred to as a step difference V13". Similarly, the step difference V14 located on the −X axis side is referred to as a step difference V14', and the step difference V14 located on the +X axis side is referred to as a step difference V14", and the step difference V15 located on the −X axis side is referred to as a step difference V15', and the step difference V15 located on the +X axis side is referred to as a step difference V15".

As illustrated in FIG. 70, the step differences V14' and V15' are located between adjacent antinodes of flexural vibration which is spurious occurring in the quartz crystal substrate 2Cf, and, similarly, the step differences V14" and V15" are located between adjacent antinodes of flexural vibration. Specifically, when a virtual straight line which is parallel to the Y' axis through a peak P1 of an expected waveform B of the flexural vibration is indicated by C61; a virtual straight line which is parallel to the Y' axis through a peak P2 which is adjacent to the peak P1 of the waveform B on the −X axis side is indicated by C62; a virtual straight line which is parallel to the Y' axis through the step difference V14' is indicated by C63; and a virtual straight line which is parallel to the Y' axis through the step difference V15' is indicated by C64, the virtual straight lines C63 and C64 are located between the virtual straight lines C61 and C62. Similarly, when a virtual straight line which is parallel to the Y' axis through a peak P3 of the waveform B is indicated by C65; a virtual straight line which is parallel to the Y' axis through a peak P4 which is adjacent to the peak P3 of the waveform B on the +X axis side is indicated by C66; a virtual straight line which is parallel to the Y' axis through the step difference V14" is indicated by C67; and a virtual straight line which is parallel to the Y' axis through the step difference V15" is indicated by C68, the virtual straight lines C67 and C68 are located between the virtual straight lines C65 and C66.

As a result, the unwanted vibration can be effectively confined between the step differences V14 and V15. For this reason, the spurious can be reduced, and thus a CI value of the resonator element 1Cf is reduced and vibration characteristics are improved.

The eighteenth embodiment can also exhibit the same effects as the above-described embodiments.

2. Resonator

Next, a description will be made of a preferred embodiment and a modification example related to a resonator (a resonator to which the invention is applied) which employs the above-described resonator element.

Figure 71:
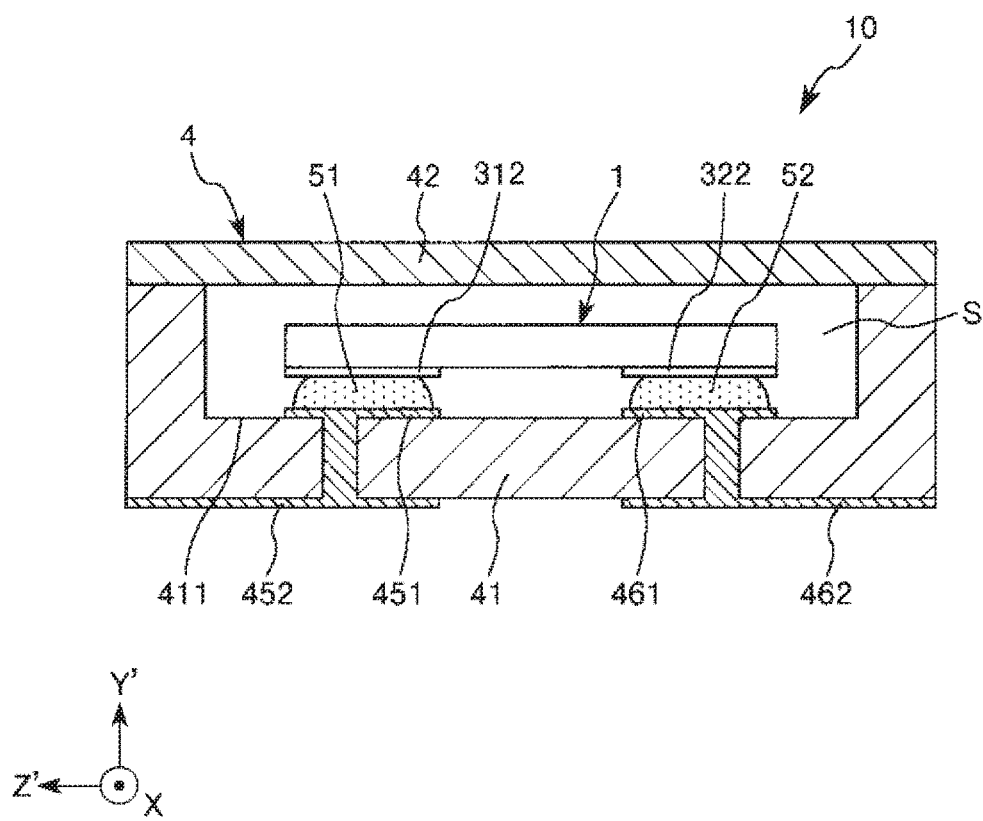
FIG. 71 is a sectional view illustrating a resonator according to an embodiment of the invention.

FIG. 71 is a sectional view illustrating a resonator according to an embodiment of the invention.

A resonator 10 illustrated in FIG. 71 includes the resonator element 1 according to any one of the above-described embodiments and a package 4 in which the resonator element 1 is accommodated.

The package 4 includes a box-shaped base 41 having a recess 411 which is open upward, and a plate-shaped lid 42 which closes the opening of the recess 411 and is joined to the base 41. The resonator element 1 is accommodated in an accommodation space S which is formed by the lid 42 closing the recess 411. The accommodation space S may be in a decompressed (vacuum) state, and may be filled with an inert gas such as nitrogen, helium, or argon.

Although not particularly limited, various ceramics such as aluminum oxide may be used as a forming material of the base 41. In addition, although not particularly limited, a material with a linear expansion coefficient similar to that of a forming material of the base 41 may be used as a forming material of the lid 42. For example, in a case where the above-described ceramics are used as a forming material of the base 41, an alloy such as Kovar is preferably used. Further, joining between the base 41 and the lid 42 is not particularly limited, and may be performed, for example, using an adhesive, using seam welding, and the like.

Connection electrodes 451 and 461 are formed on a bottom of the recess 411 of the base 41. In addition, external mounting terminals 452 and 462 are formed on a lower surface of the base 41. The connection electrode 451 is electrically connected to the external mounting terminal 452 via a through electrode formed in the base 41, and the connection electrode 461 is electrically connected to the external mounting terminal 462 via a through electrode formed in the base 41.

The resonator element 1 accommodated in the accommodation space S is fixed to the base 41 via two conductive adhesive materials 51 and 52 at the ends on the +X axis side so that the lower surface thereof is directed toward the base 41 side. The conductive adhesive material 51 is provided so as to be in contact with the connection electrode 451 and the pad electrode 312. Consequently, the connection electrode 451 is electrically connected to the pad electrode 312 via the conductive adhesive material 51. On the other hand, the conductive adhesive material 52 is provided so as to be in contact with the connection electrode 461 and the pad electrode 322. Consequently, the connection electrode 461 is electrically connected to the pad electrode 322 via the conductive adhesive material 52. The conductive adhesive materials 51 and 52 are not particularly limited as long as the adhesive materials are conductive and adhesive, and may employ, for example, ones in which conductive fillers are dispersed in an adhesive material based on silicone, epoxy, acryl, polyimide, bismaleimide, and the like.

The resonator 10 includes the resonator element 1 which is the resonator element according to any one of the above-described embodiments. Consequently, it is possible to provide the resonator with high reliability, which can achieve the same effects as in the above-described embodiments.

Modification Example

Next, a description will be made of a resonator according to a modification example of the invention.

Figure 72A:
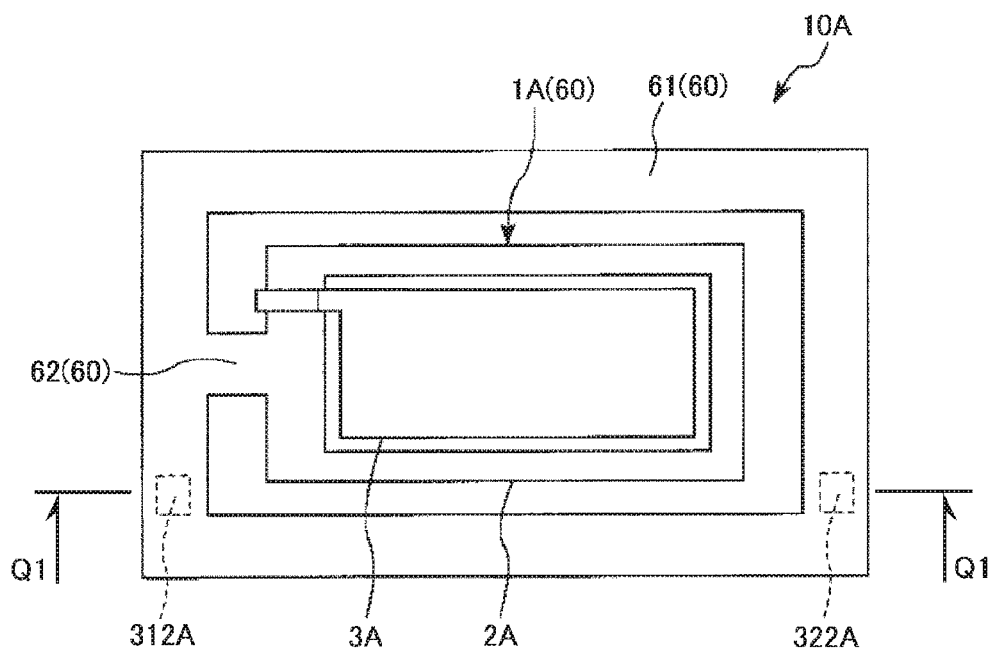
FIG. 72A is a top view illustrating a resonator according to a modification example of the invention.
Figure 72B:
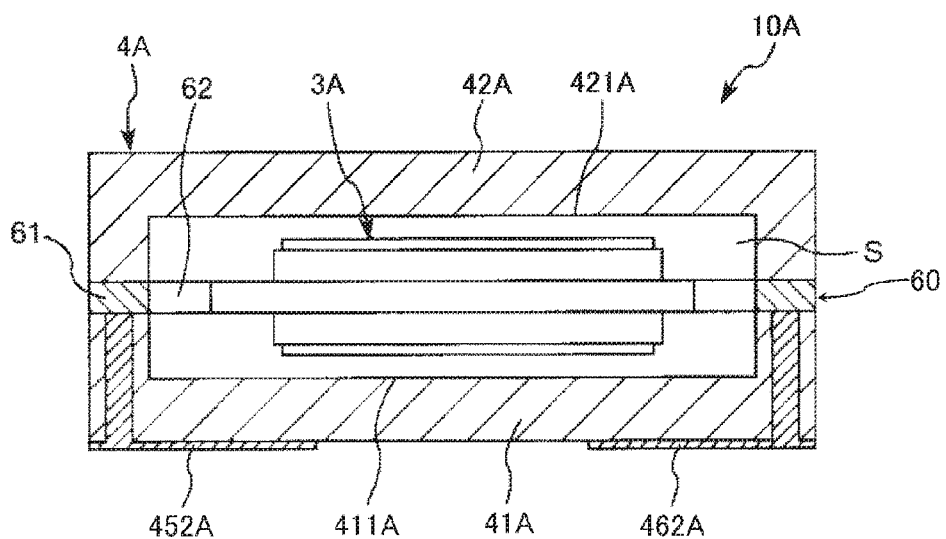
FIG. 72B is a sectional view taken along the line Q1-Q1 in FIG. 72A.

FIG. 72A is a top view illustrating the resonator according to the modification example of the invention, and FIG. 72B is a sectional view taken along line Q1-Q1 in FIG. 72A. In FIG. 72A, the lid 42 is not illustrated.

The resonator 10A of the modification example is a so-called "MAT" type resonator. As illustrated in FIGS. 72A and 72B, the resonator 10A of the modification example includes a resonator element 1A and a package 4A in which the resonator element 1A is accommodated.

In the resonator element 1A (including a quartz crystal substrate 2A and an electrode 3A), in the same manner as in the above-described resonator element 1, a step difference (not illustrated) is provided at least at one of a boundary between a thick section and a middle section, and a boundary between the middle section and a thin section. The package 4A includes a box-shaped base 41A having a recess 411A, and a plate-shaped lid 42A having a recess 421A.

The resonator 10A has a configuration in which a resonator element containing layer 60 is interposed between the box-shaped base 41A and the box-shaped lid 42A, the resonator element containing layer 60 being a layer in which the resonator element 1A (quartz crystal substrate 2A), a frame 61 located around the resonator element 1A, and a connection portion 62 which connects the frame 61 to the quartz crystal substrate 2A are integrally formed with each other.

More specifically, the base 41A has the recess 411A which is open upward, and an upper surface thereof is joined to a lower surface of the frame 61. On the other hand, the lid 42A has the recess 421A which is open downward, and a lower surface thereof is joined to an upper surface of the frame 61. Consequently, an accommodation space S is formed to be surrounded by the base 41A, the lid 42A, and the frame 61, and the resonator element 1A is accommodated in the accommodation space S. The frame 61 is provided with pad electrodes 312A and 322A, and the pad electrodes 312A and 322A are electrically connected to external mounting terminals 452A and 462A via through electrodes formed at the base 41A.

The step differences are also provided in the resonator element 1A included in the resonator 10A of the present modification example in the same manner as in the resonator element 1, and thus it is possible to provide the resonator which can achieve the same effects as in the above-described embodiments and has high reliability.

3. Oscillator

Next, a description will be made of an oscillator (an oscillator to which the invention is applied) which employs the above-described resonator.

Figure 73:
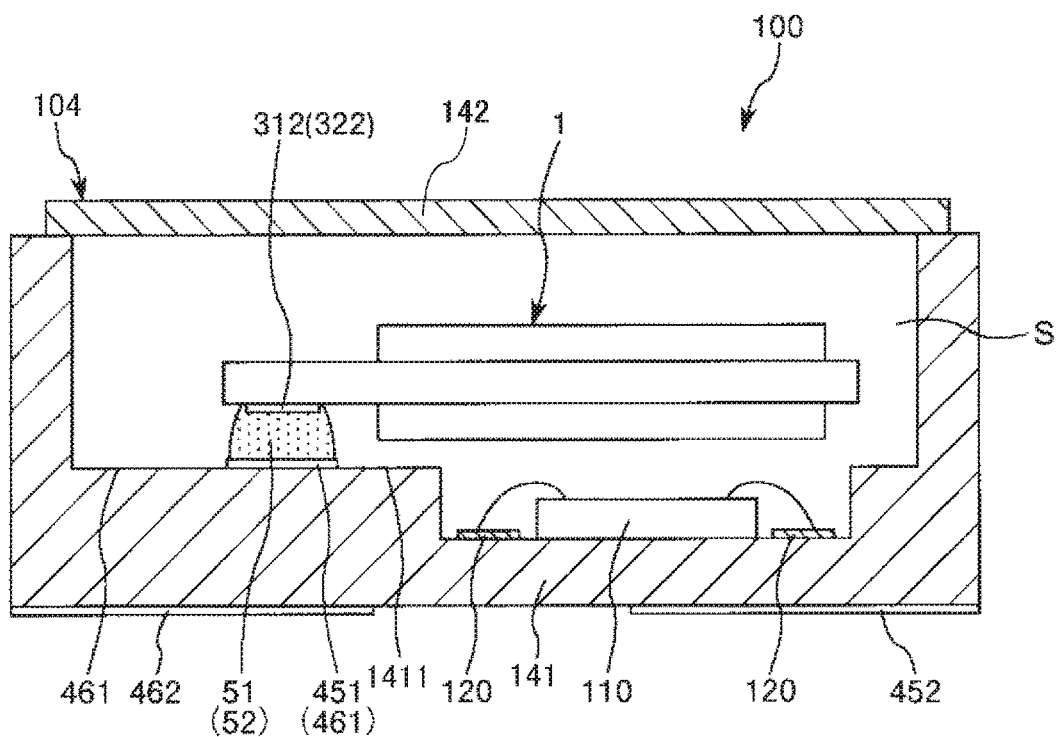
FIG. 73 is a cross-sectional view illustrating an oscillator according to a preferred embodiment of the invention.

FIG. 73 is a sectional view illustrating an oscillator according to a preferred embodiment of the invention.

An oscillator 100 illustrated in FIG. 73 includes the resonator element 1 and an IC chip 110 provided with circuits. Hereinafter, the oscillator 100 will be described. The same constituent elements as described above are given the same reference numerals, and description thereof will be omitted.

As illustrated in FIG. 73, the oscillator 100 includes the resonator element 1, the IC chip 110, and a package 104 in which the resonator element 1 and the IC chip 110 are accommodated.

The package 104 includes a box-shaped base 141 having a recess 1411 which is open upward, and a plate-shaped lid 142 which closes the opening of the recess 1411 and is joined to the base 141. The resonator element 1 is accommodated in an accommodation space S which is formed by the lid 142 closing the recess 1411.

Materials forming the base 141 and the lid 142 and methods of joining the base and lid are the same as those in the base 41 and the lid 42 described above, and thus description thereof will be omitted.

A bottom of the recess 1411 of the base 141 is formed in a stepwise shape, and the IC chip 110 is fixed to the bottom of the recess 1411. The IC chip 110 is electrically connected to a plurality of internal terminals 120 formed on the bottom of the recess 1411. The plurality of internal terminals 120 include terminals connected to the connection electrodes 451 and 461 and terminals connected to the external mounting terminals 452 and 462.

The IC chip 110 includes an oscillation circuit (circuit) which controls driving of the resonator element 1. When the IC chip 110 drives the resonator element 1, a signal with a predetermined frequency can be extracted.

The oscillator 100 includes the above-described resonator element 1. Consequently, it is possible to provide the oscillator with high reliability, which can achieve the same effects as in the above-described embodiments.

4. Electronic Apparatus

Next, a description will be made of an electronic apparatus (an electronic apparatus to which the invention is applied) which employs the resonator (resonator element) to which the invention is applied.

Figure 74:
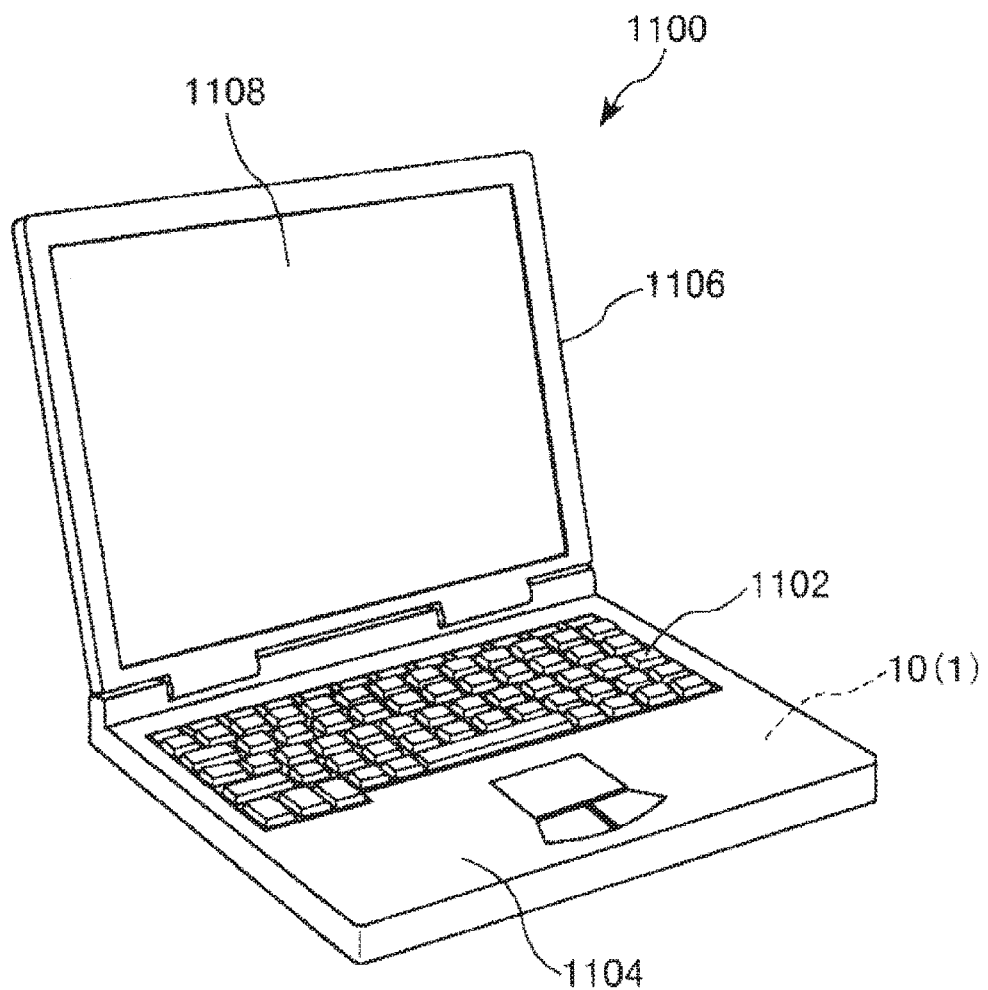
FIG. 74 is a perspective view illustrating a configuration of a personal computer as an example of an electronic apparatus to which the invention is applied.

FIG. 74 is a perspective view illustrating a configuration of a personal computer as an example of an electronic apparatus to which the invention is applied.

In FIG. 74, a personal computer 1100 is a mobile type (or a notebook type) personal computer, and is constituted by a main body portion 1104 having a keyboard 1102 and a display unit 1106 having a display portion 1108, and the display unit 1106 is supported so as to be rotatably moved with respect to the main body portion 1104 via a hinge structure portion. The personal computer 1100 includes the resonator 10 (the resonator element 1), built thereinto, which functions as a filter, a resonator, a reference clock and the like.

Figure 75:
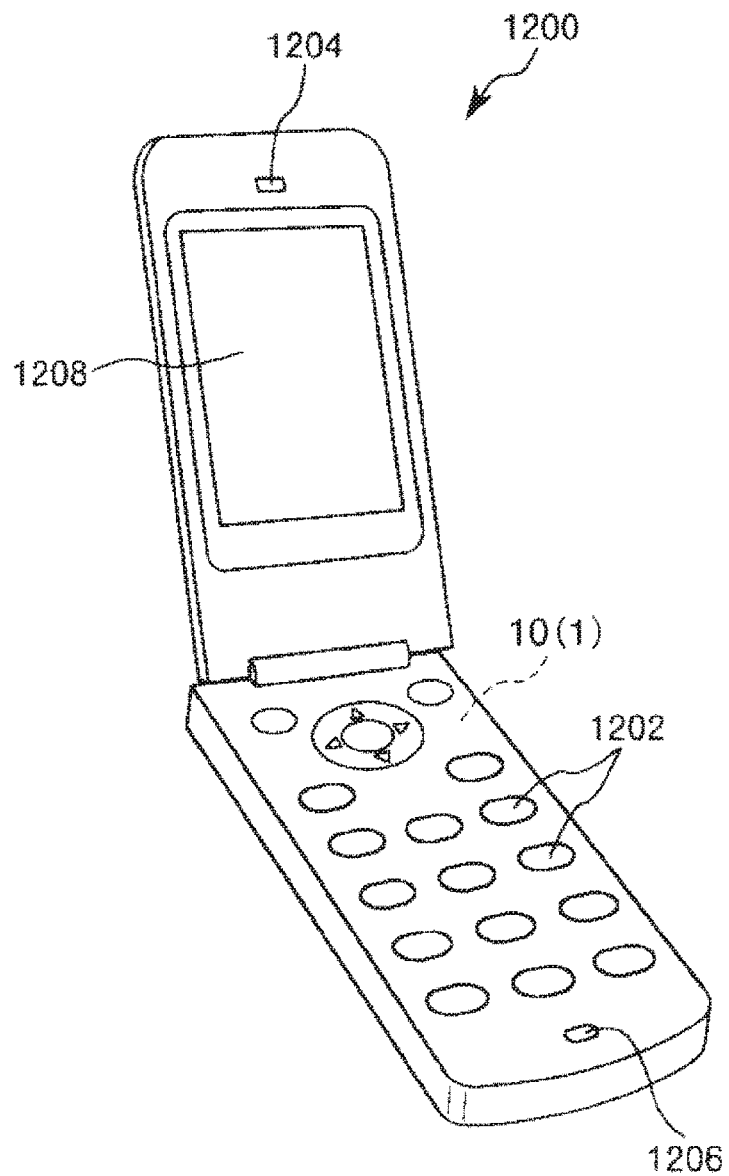
FIG. 75 is a perspective view illustrating a configuration of a mobile phone (including PHS) as an example of an electronic apparatus to which the invention is applied.

FIG. 75 is a perspective view illustrating a configuration of a mobile phone (including PHS) as an example of an electronic apparatus to which the invention is applied.

In FIG. 75, a mobile phone 1200 includes a plurality of operation buttons 1202, an earpiece 1204, and a mouthpiece 1206, and a display portion 1208 is disposed between the operation buttons 1202 and the earpiece 1204. The mobile phone 1200 includes the resonator 10 (the resonator element 1), built thereinto, which functions as a filter, a resonator, and the like.

Figure 76:
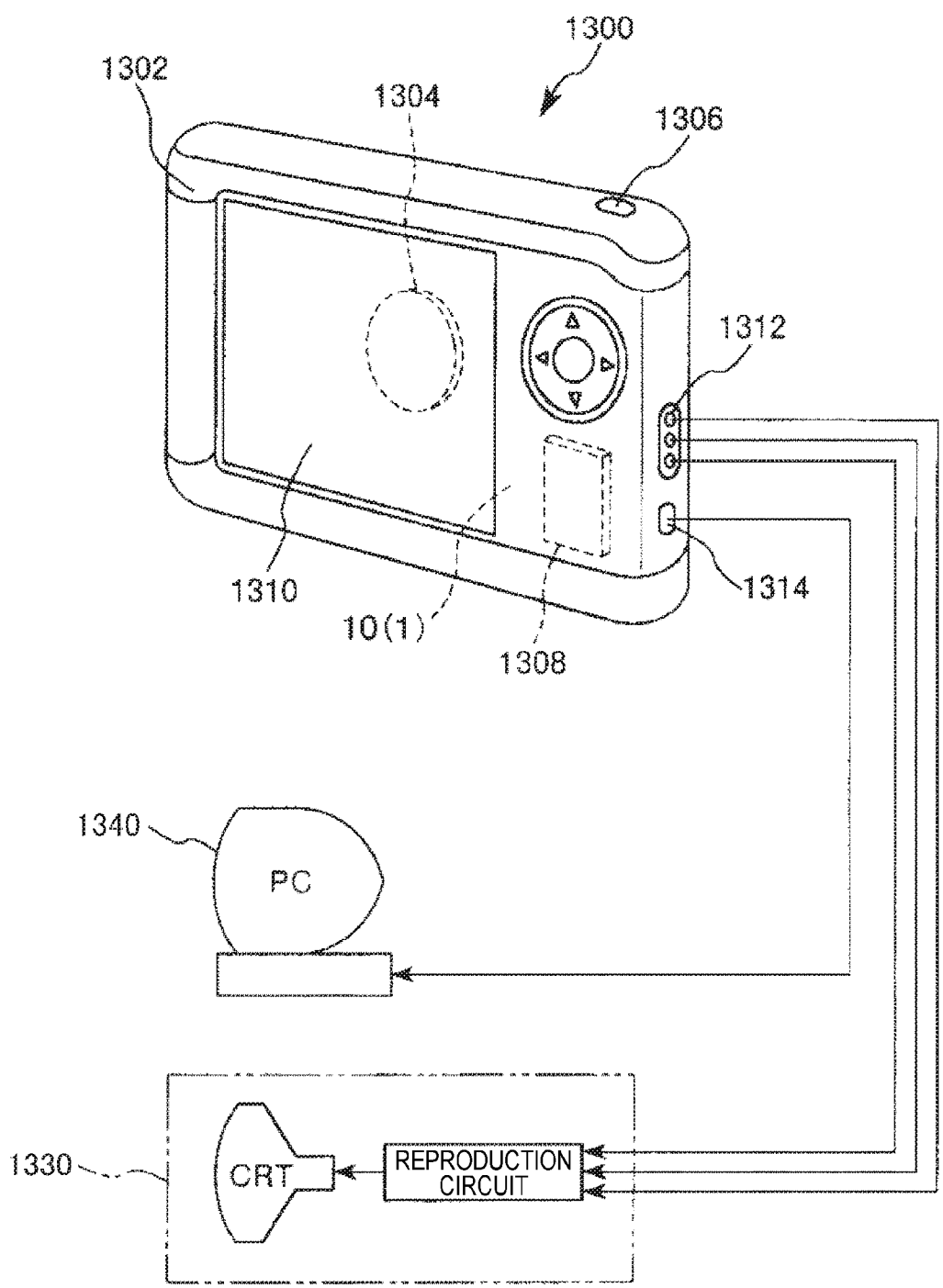
FIG. 76 is a perspective view illustrating a configuration of a digital still camera as an example of an electronic apparatus to which the invention is applied.

FIG. 76 is a perspective view illustrating a configuration of a digital still camera as an example of an electronic apparatus to which the invention is applied. In addition, in FIG. 76, connection to an external apparatus is also briefly illustrated.

A display portion 1310 is provided on a rear side of a case (body) 1302 of the digital still camera 1300 and performs display on the basis of an imaging signal generated by a CCD, and the display portion 1310 functions as a view finder which displays a subject as an electronic image. In addition, a light sensing unit 1304 which includes an optical lens (imaging optical system), a CCD, and the like is provided on a front side (the rear side in FIG. 76) of the case 1302.

When a photographer confirms a subject image displayed on the display portion 1310 and presses a shutter button 1306, an imaging signal of the CCD at this point is transmitted to and stored in a memory 1308. In this digital still camera 1300, video signal output terminals 1312 and input and output terminals 1314 for data communication are provided on a side surface of the case 1302. As illustrated in FIG. 76, the video signal output terminals 1312 are connected to a television monitor 1330 and the input and output terminals 1314 for data communication are connected to a personal computer 1340 as necessary. An imaging signal stored in the memory 1308 is output to the television monitor 1330 or the personal computer 1340 through a predetermined operation. The digital still camera 1300 includes the resonator 10 (the resonator element 1), built thereinto, which functions as a filter, a resonator, and the like.

The electronic apparatuses according to the embodiments include the above-described resonator element 1. Consequently, it is possible to provide the electronic apparatuses with high reliability, which can achieve the same effects as in the above-described embodiments.

The electronic apparatus including the resonator element to which the invention is applied is not limited to the personal computer (a mobile type personal computer) illustrated in FIG. 74, the mobile phone illustrated in FIG. 75, and the digital still camera illustrated in FIG. 76, and is also applicable to, for example, an ink jet type ejection apparatus (for example, an ink jet printer), a laptop type personal computer, a television set, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, electronic binoculars, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), and a flight simulator.

5. Moving Object

Next, a description will be made of a moving object (a moving object to which the invention is applied) which employs the resonator (resonator element) to which the invention is applied on the basis of a preferred embodiment.

Figure 77:
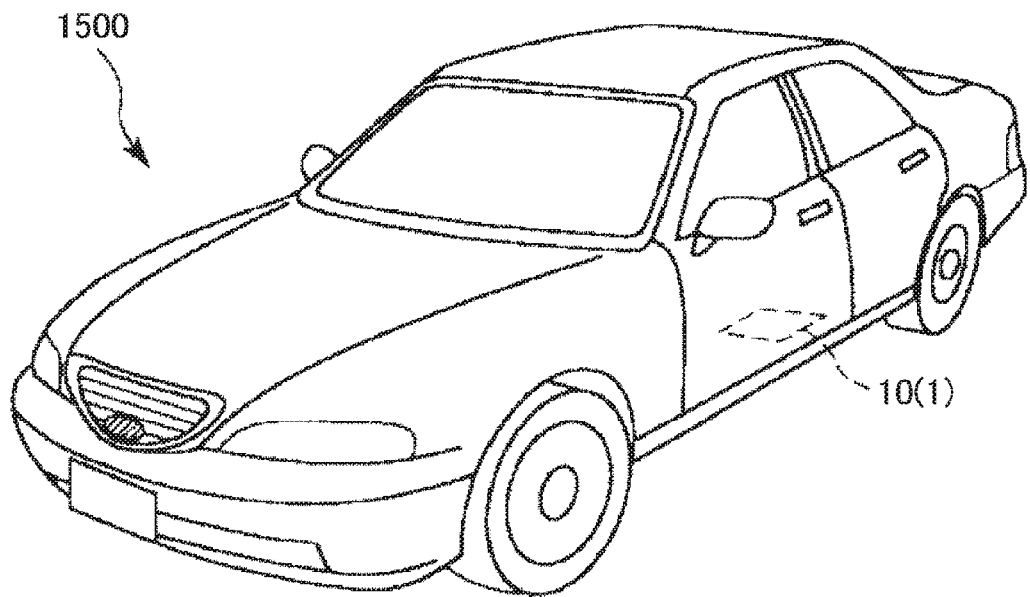
FIG. 77 is a perspective view schematically illustrating an automobile as an example of a moving object to which the invention is applied.

FIG. 77 is a perspective view schematically illustrating an automobile as an example of a moving object to which the invention is applied. In FIG. 77, an automobile 1500 includes the resonator 10 (the resonator element 1) mounted therein. The resonator 10 is widely applicable to electronic control units (ECUs) such as a keyless entry, an immobilizer, a car navigation system, a car air conditioner, an antilock brake system (ABS), an air bag, a tire pressure monitoring system (TPMS), engine control, a battery monitor of a hybrid car or an electric car, and a vehicle dynamic control system.

The moving object according to the embodiment includes the above-described resonator element 1. Consequently, it is possible to provide the moving object with high reliability, which can achieve the same effects as in the above-described embodiments.

As mentioned above, although the resonator element, the resonator, the oscillator, the electronic apparatus, and the moving object according to the embodiments of the invention have been described in detail, the invention is not limited thereto, and a configuration of each part may be replaced with any configuration having the same function. Any other configuration may be added to the invention. The above-described embodiments may be combined with each other as appropriate.

In the above-described embodiments, the quartz crystal substrate is used as a piezoelectric substrate, but, alternatively, various piezoelectric substrates using, for example, Lithium Niobate and Lithium Tantalate may be employed.

The entire disclosure of Japanese Patent Application No.: 2015-008176, filed Jan. 19, 2015, 2015-008177, filed Jan. 19, 2015 and 2015-008178, filed Jan. 19, 2015 are expressly incorporated by reference herein.

What is claimed is:

1. A resonator element comprising:
   a thick section;
   a middle section that is located adjacent to the thick section and is thinner than the thick section; and a thin section that is located around the thick section and the middle section, and is thinner than the middle section, wherein at least the thick section performs thickness shear vibration, wherein a first step difference is provided at a boundary between the thick section and the middle section, and a second step difference is provided at a boundary between the middle section and the thin section, in a direction of the thickness shear vibration, wherein a first antinode of flexural vibration is located between the first step difference and the second step difference, and wherein, when, in the direction of the thickness shear vibration, a distance between the first antinode and the first step difference is indicated by d1, a distance between the first antinode and the second step difference is indicated by d2, and a wavelength of the flexural vibration is indicated by $\lambda$, a relationship of $0 \leq d1 \leq \lambda/8$ and $0 \leq d2 \leq \lambda/8$ is satisfied.

2. The resonator element according to claim 1, further comprising:
a vibration portion;
a peripheral portion that is thinner than the vibration portion and surrounds the vibration portion; and
an excitation electrode that is located on a central portion of the vibration portion in the direction of the thickness shear vibration,
wherein the thick section is a region in which the vibration portion overlaps the excitation electrode in a plan view,
wherein the middle section is the vibration portion adjacent to the thick section,
wherein the thin section is the peripheral portion, and
wherein, when a length of the vibration portion in the direction of the thickness shear vibration is indicated by Mx, a relationship of $Mx/2 = (n/2 + 1/4)\lambda + d1 + d2$ (where n is an integer) is satisfied.

3. The resonator element according to claim 2,
wherein, when a length of the excitation electrode in the direction of the thickness shear vibration is indicated by Ex, a relationship of $(Mx - Ex)/2 = d1 + d2$ is satisfied.

4. The resonator element according to claim 1, further comprising:
a vibration portion;
a peripheral portion that is thinner than the vibration portion and surrounds the vibration portion; and
an excitation electrode that overlaps the vibration portion and the peripheral portion in a plan view in the direction of the thickness shear vibration,
wherein the thick section is a region in which the vibration portion overlaps the excitation electrode in a plan view,
wherein the middle section is a region in which the peripheral portion overlaps the excitation electrode in a plan view,
wherein the thin section is the peripheral portion surrounding the excitation electrode in a plan view, and
wherein, when a length of the vibration portion in the direction of the thickness shear vibration is indicated by Mx, a relationship of $Mx/2 = (n/2 + 1/4)\lambda + d1 + d2$ (where n is an integer) is satisfied.

5. The resonator element according to claim 4,
wherein, when a length of the excitation electrode in the direction of the thickness shear vibration is indicated by Ex, a relationship of $(Ex - Mx)/2 = d1 + d2$ is satisfied.

6. The resonator element according to claim 4,
wherein the vibration portion includes
a first region; and
a second region that is thinner than the first region, and is located between the first region and the peripheral portion in at least the direction of the thickness shear vibration in a plan view.

7. A resonator comprising:
the resonator element according to claim 4; and
a package in which the resonator element is accommodated.

8. A resonator element comprising:
a thick section;
a middle section that is located adjacent to the thick section and is thinner than the thick section; and
a thin section that is located around the thick section and the middle section, and is thinner than the middle section,
wherein at least the thick section performs thickness shear vibration,
wherein a first step difference is provided at a boundary between the thick section and the middle section, and a second step difference is provided at a boundary between the middle section and the thin section, in a direction of the thickness shear vibration,
wherein a first antinode and a second antinode, adjacent to each other, of flexural vibration are located between the first step difference and the second step difference, and
wherein, when, in the direction of the thickness shear vibration, a distance between the first antinode and the first step difference is indicated by d1, a distance between the second antinode and the second step difference is indicated by d2, and a wavelength of the flexural vibration is indicated by $\lambda$, a relationship of $0 < d1 \leq \lambda/8$ and $0 < d2 \leq \lambda/8$ is satisfied.

9. The resonator element according to claim 8, further comprising:
a vibration portion;
a peripheral portion that is thinner than the vibration portion and surrounds the vibration portion; and
an excitation electrode that is located on a central portion of the vibration portion in the direction of the thickness shear vibration,
wherein the thick section is a region in which the vibration portion overlaps the excitation electrode in a plan view,
wherein the middle section is the vibration portion adjacent to the thick section,
wherein the thin section is the peripheral portion, and
wherein, when a length of the vibration portion in the direction of the thickness shear vibration is indicated by Mx, a relationship of $Mx/2 = (n/2 + 1/4)\lambda - d1 - d2$ (where n is an integer) is satisfied.

10. The resonator element according to claim 9,
wherein, when a length of the excitation electrode in the direction of the thickness shear vibration is indicated by Ex, a relationship of $(Mx - Ex)/2 = \lambda/2 - d1 - d2$ is satisfied.

11. The resonator element according to claim 8, further comprising:
a vibration portion;
a peripheral portion that is thinner than the vibration portion and surrounds the vibration portion; and
an excitation electrode that overlaps the vibration portion and the peripheral portion in a plan view in the direction of the thickness shear vibration,
wherein the thick section is a region in which the vibration portion overlaps the excitation electrode in a plan view, wherein the middle section is a region in which the peripheral portion overlaps the excitation electrode in a plan view, wherein the thin section is the peripheral portion surrounding the excitation electrode in a plan view, and wherein, when a length of the vibration portion in the direction of the thickness shear vibration is indicated by Mx, a relationship of $Mx/2=(n/2+1/4)\lambda-d1-d2$ (where n is an integer) is satisfied.

12. The resonator element according to claim 11, wherein, when a length of the excitation electrode in the direction of the thickness shear vibration is indicated by Ex, a relationship of $(Ex-Mx)/2=\lambda/2-d1-d2$ is satisfied.

13. The resonator element according to claim 11, wherein the vibration portion includes a first region; and a second region that is thinner than the first region, and is located between the first region and the peripheral portion in at least the direction of the thickness shear vibration in a plan view.

14. A resonator comprising:

the resonator element according to claim 11; and a package in which the resonator element is accommodated.

15. A oscillator comprising:

the resonator element according to claim 11; and a circuit that drives the resonator element.

16. An electronic apparatus comprising the resonator element according to claim 11.

17. A moving object comprising the resonator element according to claim 11.

18. A resonator element comprising:

a thick section;

a middle section that is located adjacent to the thick section and is thinner than the thick section; and a thin section that is located around the thick section and the middle section, and is thinner than the middle section, wherein at least the thick section performs thickness shear vibration, wherein a first step difference is provided at a boundary between the thick section and the middle section, and a second step difference is provided at a boundary between the middle section and the thin section, in a direction of the thickness shear vibration, wherein both of the first step difference and the second step difference are located between a first antinode and a second antinode, adjacent to each other, of flexural vibration, and wherein, when, in the direction of the thickness shear vibration, a distance between the first antinode and the first step difference is indicated by d1, a distance between the second antinode and the second step difference is indicated by d2, and a wavelength of the flexural vibration is indicated by $\lambda$, a relationship of $0 \le d1 \le \lambda/8$ and $0 \le d2 \le \lambda/8$ is satisfied.

19. The resonator element according to claim 18, further comprising:

a vibration portion;

a peripheral portion that is thinner than the vibration portion and surrounds the vibration portion; and an excitation electrode that is located on a central portion of the vibration portion in the direction of the thickness shear vibration, wherein the thick section is a region in which the vibration portion overlaps the excitation electrode in a plan view, wherein the middle section is the vibration portion adjacent to the thick section, wherein the thin section is the peripheral portion, and wherein, when a length of the vibration portion in the direction of the thickness shear vibration is indicated by Mx, a relationship of $Mx/2=(n/2+1/4)\lambda+d1+d2$ (where n is an integer) is satisfied.

20. The resonator element according to claim 19, wherein, when a length of the excitation electrode in the direction of the thickness shear vibration is indicated by Ex, a relationship of $(Mx-Ex)/2=\lambda/2+d1+d2$ is satisfied.

21. The resonator element according to claim 18, further comprising:

a vibration portion;

a peripheral portion that is thinner than the vibration portion and surrounds the vibration portion; and an excitation electrode that overlaps the vibration portion and the peripheral portion in a plan view in the direction of the thickness shear vibration, wherein the thick section is a region in which the vibration portion overlaps the excitation electrode in a plan view, wherein the middle section is a region in which the peripheral portion overlaps the excitation electrode in a plan view, wherein the thin section is the peripheral portion surrounding the excitation electrode in a plan view, and wherein, when a length of the vibration portion in the direction of the thickness shear vibration is indicated by Mx, a relationship of $Mx/2=(n/2+1/4)\lambda+d1+d2$ (where n is an integer) is satisfied.

22. The resonator element according to claim 21, wherein, when a length of the excitation electrode in the direction of the thickness shear vibration is indicated by Ex, a relationship of $(Ex-Mx)/2=\lambda/2+d1+d2$ is satisfied.

23. The resonator element according to claim 21, wherein the vibration portion includes a first region; and a second region that is thinner than the first region, and is located between the first region and the peripheral portion in at least the direction of the thickness shear vibration in a plan view.

24. A resonator comprising:

the resonator element according to claim 21; and a package in which the resonator element is accommodated.

* * * * *